US010476017B2

(12) United States Patent
Kanatzidis et al.

(10) Patent No.: US 10,476,017 B2
(45) Date of Patent: Nov. 12, 2019

(54) PHASE-PURE, TWO-DIMENSIONAL, MULTILAYERED PEROVSKITES FOR OPTOELECTRONIC APPLICATIONS

(71) Applicant: Northwestern University, Evanston, IL (US)

(72) Inventors: Mercouri G. Kanatzidis, Wilmette, IL (US); Duyen H. Cao, Evanston, IL (US); Konstantinos Stoumpos, Chicago, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 0 days.

(21) Appl. No.: 15/767,012

(22) PCT Filed: Oct. 11, 2016

(86) PCT No.: PCT/US2016/056370
§ 371 (c)(1),
(2) Date: Apr. 9, 2018

(87) PCT Pub. No.: WO2017/066160
PCT Pub. Date: Apr. 20, 2017

(65) Prior Publication Data
US 2018/0301646 A1  Oct. 18, 2018

Related U.S. Application Data

(60) Provisional application No. 62/239,921, filed on Oct. 11, 2015.

(51) Int. Cl.
*H01L 51/42* (2006.01)
*B32B 19/00* (2006.01)
(Continued)

(52) U.S. Cl.
CPC .......... *H01L 51/4213* (2013.01); *B32B 19/00* (2013.01); *C30B 7/14* (2013.01);
(Continued)

(58) Field of Classification Search
CPC ............. H01L 51/4213; H01L 51/0025; H01L 51/0007; H01L 51/0032; C30B 7/14; C30B 29/54; C30B 29/12; B32B 19/00
See application file for complete search history.

(56) References Cited

U.S. PATENT DOCUMENTS 6,420,056 B1  7/2002  Chondroudis et al.
6,429,318 B1  8/2002  Mitzi
(Continued)

FOREIGN PATENT DOCUMENTS

WO  WO2013171520  11/2013
WO  WO2014045021  3/2014

OTHER PUBLICATIONS

International Search Report and Written Opinion issued in PCT/US2016/056370, dated Feb. 16, 2017.
(Continued)

*Primary Examiner* — Karen Kusumakar
(74) *Attorney, Agent, or Firm* — Bell & Manninng, LLC

(57) ABSTRACT

Highly phase-pure, two-dimensional, multilayered organic-inorganic hybrid, halide perovskites are provided. Also provided are optoelectronic devices that incorporate the halide perovskites as photoactive materials.

22 Claims, 30 Drawing Sheets

(51) Int. Cl.
*C30B 29/12* (2006.01)
*C30B 29/54* (2006.01)
*H01L 51/00* (2006.01)
*C30B 7/14* (2006.01)

(52) U.S. Cl.
CPC .............. *C30B 29/12* (2013.01); *C30B 29/54* (2013.01); *H01L 51/0007* (2013.01); *H01L 51/0025* (2013.01); *H01L 51/0032* (2013.01)

(56) References Cited

U.S. PATENT DOCUMENTS

| | | | |
|---|---|---|---|
| 7,491,286 B2 | 2/2009 | Kagan et al. | |
| 2008/0292825 A1* | 11/2008 | DeHaven | H01L 51/0002 428/41.7 |
| 2013/0233377 A1* | 9/2013 | Kanatzidis | H01L 31/032 136/252 |

OTHER PUBLICATIONS

Cao et al., 2D Homologous Perovskites as Light-Absorbing Materials for Solar Cell Applications, Journal of the American Chemical Society, vol. 137, May 28, 2015, pp. 7843-7850.
Filip et al., Steric engineering of metal-halide perovskites with tunable optical band gaps, Nature Communications, vol. 5, Dec. 15, 2014.
Mitzi et al., Templating and structural engineering in organic-inorganic perovskites, Journal of the Chemical Society-Dalton Transactions, Dec. 5, 2000, pp. 1-12.
Mitzi et al., Conducting layered organic-inorganic halides containing (110)-oriented perovskite sheets, Science, vol. 267, Mar. 10, 1995, pp. 1473-1476.
Mitzi et al., Conducting tin halides with a layered organic-based perovskite structure, Nature, vol. 369, Jun. 9, 1994, pp. 467-469.
Arachchige et al., Mercouri G. Kanatzidis: Excellence and Innovations in Inorganic and Solid-State Chemistry, Inorg. Chem., 56, Jun. 27, 2017, pp. 7582-7597.
Stoumpos et al., High Members of the 2D Ruddlesden-Popper Halide Perovskites: Synthesis, Optical Properties, and Solar Cells of (CH3(CH2)3NH3)4(CH3NH3)4Pb5I16, Chem 2 , Mar. 9, 2017, pp. 427-440.
Calabrese et al., J. Am. Chem. Soc. (1991), 113, 2328.
Mei et al. Science 345 (2014) 295.
Stoumpos et al., Chem. Mater., (2016), 28 (8), pp. 2852-2867.
Kojima et al., J. Am. Chem. Soc. (2009), 131, 6050.
Zhou et al., Science (2014), 345, 542.
Hao et al., Nat. Photonics (2014), 8, 489.
Noel et al., J. Energy Environ. Sci. (2014), 7, 3061.
Ogomi et al., J. Phys. Chem. Lett. 2014, 5, 1004.
Hao et al., J. Am. Chem. Soc. (2014), 136, 8094.
Zuo, et al., Adv. Mater. (2014), 26, 6454.
Mitzi, D. B. Chem. Mater. (1996), 8, 791.
Mitzi, D. B.; Liang, K. Chem. Mater. (1997), 9, 2990.
Kagan et al., Science (1999), 286, 945.
Ishihara et al., Solid State Commun. (1989), 69, 933.
Wu et al., J. Am. Chem. Soc. 2015, 137, 2089.
Papavassiliou et al., *Prog Solid State Ch* (1997), 25 (3-4), 125-270.
Yan et al., Cation ordering within the perovskite block of a six-layer Ruddlesden-Popper oxide from layer-by-layer growth—artificial interfaces in complex unit cells. *Chemical Science* (2011), 2 (2), 261-272.
Smith et al., A Layered Hybrid Perovskite Solar-Cell Absorber with Enhanced Moisture Stability, Angewandte Chemie, vol. 126, Sep. 1, 2014, 11414-11417.
Shi et al., Self-Assembly and X-ray Structure Determination of the Novel 2-D Layered Organic—Inorganic Hybrid Pb—X Compound: [PbX2(4,4'-bipy)]n (X = I, Br), Chemistry Letters, 2001, vol. 30, pp. 678-679.
Billing et al., Synthesis, characterization and phase transitions in the inorganic-organic layered perovskite-type hybrids [(CnH2n + 1NH3)2PbI4], n = 4, 5 and 6, Acta Cryst., B63, (2007), pp. 735-747.
Billing et al., Synthesis, characterization and phase transitions of the inorganic-organic layered perovskite-type hybrids [(CnH2n+ 1NH3)2PbI4] (n = 12, 14, 16 and 18), New J. Chem., 32, (2018), pp. 1736-1746.

* cited by examiner

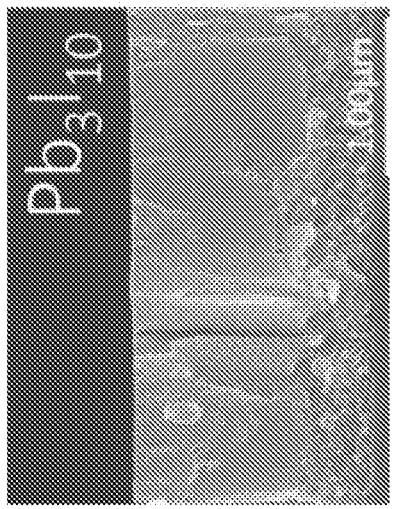
FIG. 6(C)
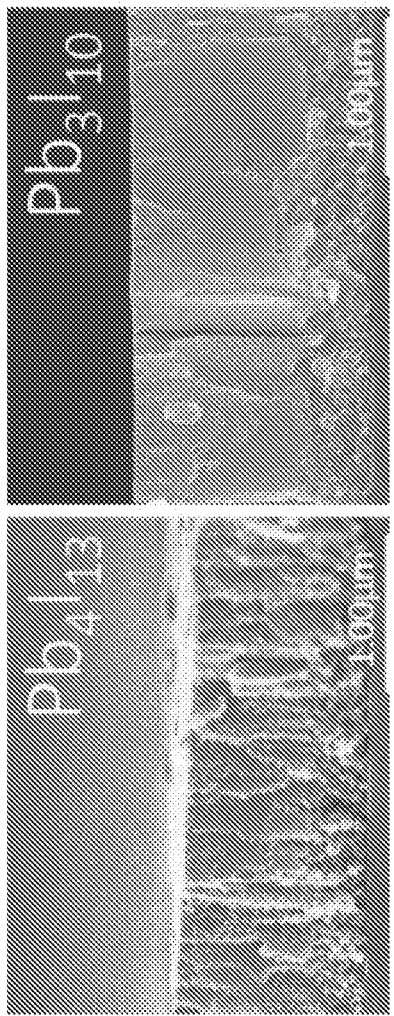
FIG. 6(B)
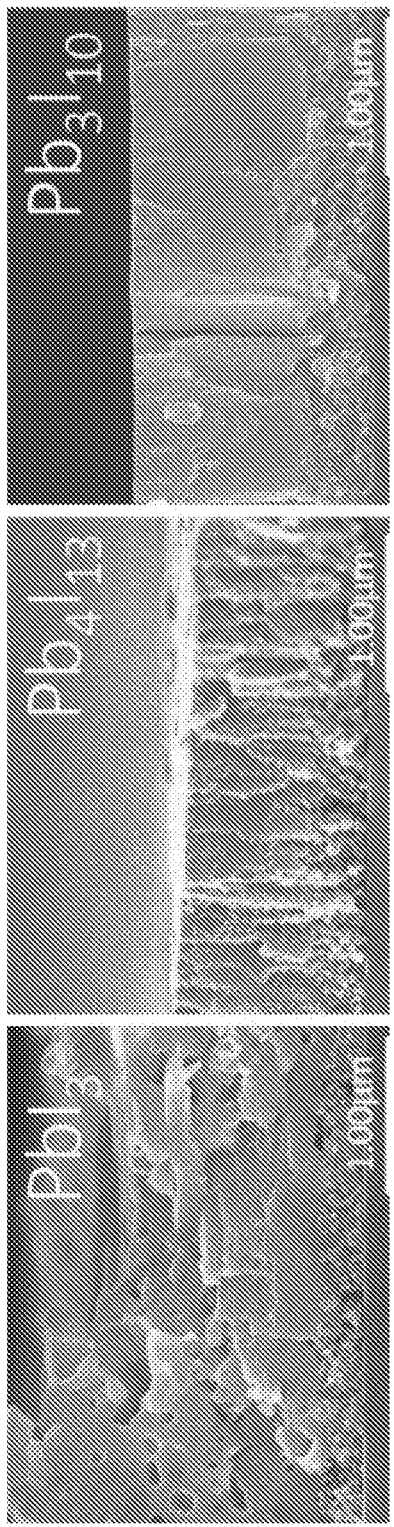
FIG. 6(A)
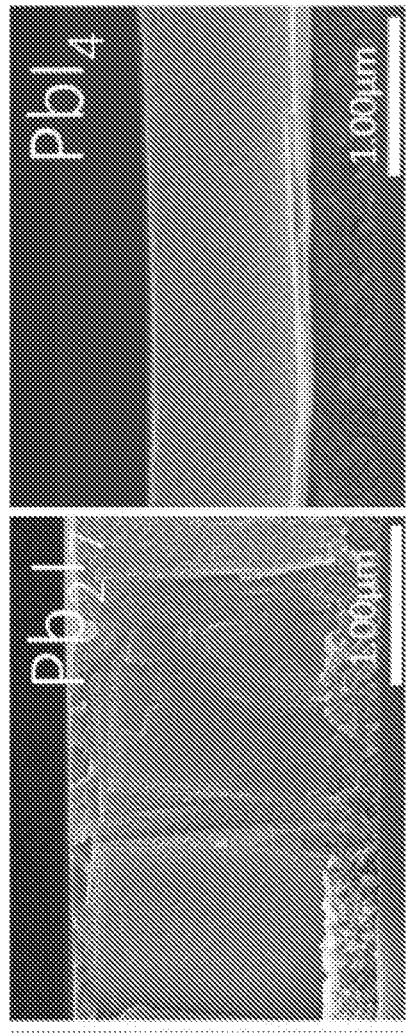
FIG. 6(E)
FIG. 6(D)

FIG. 12 Electron Acceptors (EA)

Electron Donors (ED)

Charge-Transfer (CT)

PHASE-PURE, TWO-DIMENSIONAL, MULTILAYERED PEROVSKITES FOR OPTOELECTRONIC APPLICATIONS

CROSS-REFERENCE TO RELATED APPLICATIONS

The present application is a National Stage of International Application No. PCT/US2016/056370, that was filed Oct. 11, 2016, the entire contents of which are hereby incorporated by reference; which claims priority to U.S. Provisional Patent Application No. 62/239,921 that was filed Oct. 11, 2015, the entire contents of which are hereby incorporated by reference.

REFERENCE TO GOVERNMENT RIGHTS

This invention was made with government support under SC0001059 and SC0012541 awarded by the Department of Energy. The government has certain rights in the invention.

BACKGROUND

The emergence of hybrid halide perovskite compounds, $AMX_3$ ($A=Cs^+$, $CH_3NH_3^+$, or $HC(NH_2)_2^+$; $M=Sn^{2+}$ and $Pb^{2+}$; and $X=Cl^-$, $Br^-$, and $I^-$), in solid-state solar cells has triggered a phenomenal advance in photovoltaic efficiency. Perovskite compounds, in the form of $CH_3NH_3PbX_3$, have been employed as light-absorbing materials in liquid dye-sensitized solar cells (Kojima, A.; Teshima, K.; Shirai, Y.; Miyasaka, T. J. Am. Chem. Soc. 2009, 131, 6050). However, they did not engender significant attention because of short device lifetime resulting from the fast dissolution of perovskites in the redox electrolyte solution. Later, perovskite based solar cells have returned in a different fashion: solid-state. The photovoltaic performance race has been remarkable ever since, and an efficiency of 20.1% has been certified by the National Renewable Energy Laboratory (NREL) (National Renewable Energy Laboratory, N.R.E.L.; Zhou, H. P.; Chen, Q.; Li, G.; Luo, S.; Song, T. B.; Duan, H. S.; Hong, Z. R.; You, J. B.; Liu, Y. S.; Yang, Y. Science 2014, 345, 542). Among the light absorber candidates, 3D methylammonium (MA) lead iodide ($MAPbI_3$) is a prominent choice owing to its outstanding properties as a solar cell absorber, including a high extinction coefficient, a medium band gap, a small exciton binding energy, and long exciton and charge diffusion lengths. From a commercialization point of view, the large-scale implementation of perovskite solar cells requires toxicity and stability issues to be resolved. Works on tin-based perovskites have been reported, demonstrating a promising efficiency of ca. 5% for the $CH_3NH_3SnI_{3-x}Br_x$ system (Hao, F.; Stoumpos, C. C.; Cao, D. H.; Chang, R. P. H.; Kanatzidis, M. G. Nat. Photonics 2014, 8, 489; Noel, N. K.; Stranks, S. D.; Abate, A.; Wehrenfennig, C.; Guarnera, S.; Haghighirad, A. A.; Sadhanala, A.; Eperon, G. E.; Pathak, S. K.; Johnston, M. B.; Petrozza, A.; Herz, L. M.; Snaith, H. J. Energy Environ. Sci. 2014, 7, 3061), as well as in the mixed-metal $CH_3NH_3Sn_{1-x}Pb_xI_3$ system (Ogomi, Y.; Morita, A.; Tsukamoto, S.; Saitho, T.; Fujikawa, N.; Shen, Q.; Toyoda, T.; Yoshino, K.; Pandey, S. S.; Ma, T.; Hayase, S. J. Phys. Chem. Lett. 2014, 5, 1004; Hao, F.; Stoumpos, C. C.; Chang, R. P.; Kanatzidis, M. G. J. Am. Chem. Soc. 2014, 136, 8094; Zuo, F.; Williams, S. T.; Liang, P.-W.; Chueh, C.-C.; Liao, C.-Y.; Jen, A. K. Y. Adv. Mater. 2014, 26, 6454). The moisture instability of $MAPbI_3$, however, has been poorly addressed. Recently, Smith et al. reported the solar cell application of a layered $(PhC_2H_5NH_3)_2(CH_3NH_3)_2Pb_3I_{10}$ perovskite light absorber with enhanced moisture stability (Smith, I. C.; Hoke, E. T.; Solis-Ibarra, D.; McGehee, M. D.; Karunadasa, H. I. Angew. Chem., Int. Ed. 2014, 53, 11232).

From a fundamental point of view, efficient external luminescence is an indirect indication of accessing the highest possible open-circuit voltage, a major factor in the total power output aside from the short-circuit current and fill factor. The 2D $A_2MI_4$-based perovskite compounds, where M is a divalent group 14 (Mitzi, D. B. Chem. Mater. 1996, 8, 791) or lanthanide (Mitzi, D. B.; Liang, K. Chem. Mater. 1997, 9, 2990) metal, have been reported to display high photoluminescence (PL) at room temperature, and until now, they have been employed in field-effect transistor (FET) (Kagan, C. R.; Mitzi, D. B.; Dimitrakopoulos, C. D. Science 1999, 286, 945) and light-emitting diode (LED) devices (Ishihara, T.; Takahashi, J.; Goto, T. Solid State Commun. 1989, 69, 933; Wu, X. X.; Trinh, M. T.; Niesner, D.; Zhu, H. M.; Norman, Z.; Owen, J. S.; Yaffe, O.; Kudisch, B. J.; Zhu, X. Y. J. Am. Chem. Soc. 2015, 137, 2089).

There are mainly two varieties of Ruddlesden-Popper (RP) perovskites that have been employed in devices: phenylethylammonium-(PEA), derived by the original work of Calabrese et al. and butylammonium-based (BA) derived from the pioneering work of Ishihara and co-workers on aliphatic ammonium cations. (Calabrese, J.; Jones, N. L.; Harlow, R. L.; Herron, N.; Thorn, D. L.; Wang, Y., Preparation and Characterization of Layered Lead Halide Compounds. *Journal of the American Chemical Society* 1991, 113 (6), 2328-2330; and Ishihara, T.; Takahashi, J.; Goto, T., Exciton-State in Two-Dimensional Perovskite Semiconductor $(C_{10}H_{21}NH_3)_2PbI_4$. *Solid State Communications* 1989, 69 (9), 933-936.) In both series of compounds, it has been shown that by increasing the number of perovskite layers (n-number in the chemical formula), the photovoltaic properties improve with the BA series. In the majority of the previously reported studies, however, the absorption spectra contain clear traces of several excitonic features characteristic of the coexistence of various n-members, a fact that confirms the forecast that "Compounds with n>3 cannot be isolated in a pure form . . . ". (Papavassiliou, G. C., Three- and Low-Dimensional Inorganic Semiconductors. *Prog Solid State Ch* 1997, 25 (3-4), 125-270.) This is mainly because the difference in the thermodynamic stability of the higher n-members is small and it becomes even smaller as one approaches n=∞ making difficult to isolate them in a pure form. A similar effect is well-known for the oxide RP perovskites where it has been shown that higher n-members tend to disproportionate to the n=3 and n=∞ members which act as thermodynamic sinks.(Yan, L.; Niu, H. J.; Duong, G. V.; Suchomel, M. R.; Bacsa, J.; Chalker, P. R.; Hadermann, J.; van Tendeloo, G.; Rosseinsky, M. J., Cation ordering within the perovskite block of a six-layer Ruddlesden-Popper oxide from layer-by-layer growth—artificial interfaces in complex unit cells. *Chemical Science* 2011, 2 (2), 261-272.)

SUMMARY

Materials composed of two-dimensional, multilayered halide perovskites are provided. Also provided are radiation-absorbing materials comprising the perovskites and photovoltaic cells comprising the radiation-absorbing materials as photoactive materials.

One embodiment of a material comprises homologous, two-dimensional halide perovskites having the formula $(RNH_3)_2A_{(n-1)}M_nX_{(3n+1)}$ or the formula $(H_3NRNH_3)A_{(n-1)}$ $M_nX_{(3n+1)}$, where R is an aliphatic or aromatic chain, A is a small organic or inorganic cation, M is a divalent metal cation, X is a halide anion, and n is an integer having a value of 3 or greater, wherein at least 95%, based on mole fraction, of the material comprises the two-dimensional halide perovskites having the same n value.

Another embodiment of a material comprises homologous, two-dimensional halide perovskites having the formula $(RNH_3)A_nM_nX_{(3n+1)}$, where R is an aliphatic or aromatic chain, A is a small organic or inorganic cation, M is a divalent metal cation, X is a halide anion, and n is an integer having a value of 1 or greater.

One embodiment of a method for synthesizing highly pure two-dimensional, multilayered halide perovskites includes the steps of:reacting a small organic or inorganic cation (A) and a halide of a divalent metal cation (M) with a sub-stoichiometric quantity of an aromatic or aliphatic ammonium cation in a solution; heating the solution to a temperature above room temperature; and allowing the solution to cool, whereby substantially phase-pure two-dimensional halide perovskites precipitate out of the solution, wherein the two-dimensional halide perovskites have the formula $(RNH_3)_2A_{(n-1)}M_nX_{(3n+1)}$ or the formula $(H_3NRNH_3)A_{(n-1)}M_nX_{(3n+1)}$ and at least 95%, based on mole fraction, of the material comprises the two-dimensional halide perovskites having the same n value.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 6(A) shows a cross-sectional scanning electron microscope (SEM) image of a $TiO_2$-perovskite film prepared from a 1.8 M $Pb^{2+}$ precursor $PbI_3$, showing preferentially oriented film growth of a 2D perovskite compound. FIG. 6(B) shows a cross-sectional SEM image of a $TiO_2$-perovskite film prepared from a 1.8 M $Pb^{2+}$ precursor $Pb_4I_{13}$, showing preferentially oriented film growth of a 2D perovskite compound. FIG. 6(C) shows a cross-sectional SEM image of a $TiO_2$-perovskite film prepared from a 1.8 M $Pb^{2+}$ precursor $Pb_3I_{10}$, showing preferentially oriented film growth of a 2D perovskite compound. FIG. 6(D) shows a cross-sectional SEM image of a $TiO_2$-perovskite film prepared from a 1.8 M $Pb^{2+}$ precursor $Pb_2I_7$, showing preferentially oriented film growth of a 2D perovskite compound. FIG. 6(E) shows a cross-sectional SEM image of a $TiO_2$-perovskite film prepared from a 1.8 M $Pb^{2+}$ precursor $PbI_4$, showing preferentially oriented film growth of a 2D perovskite compound.

DETAILED DESCRIPTION

Figure 1A:
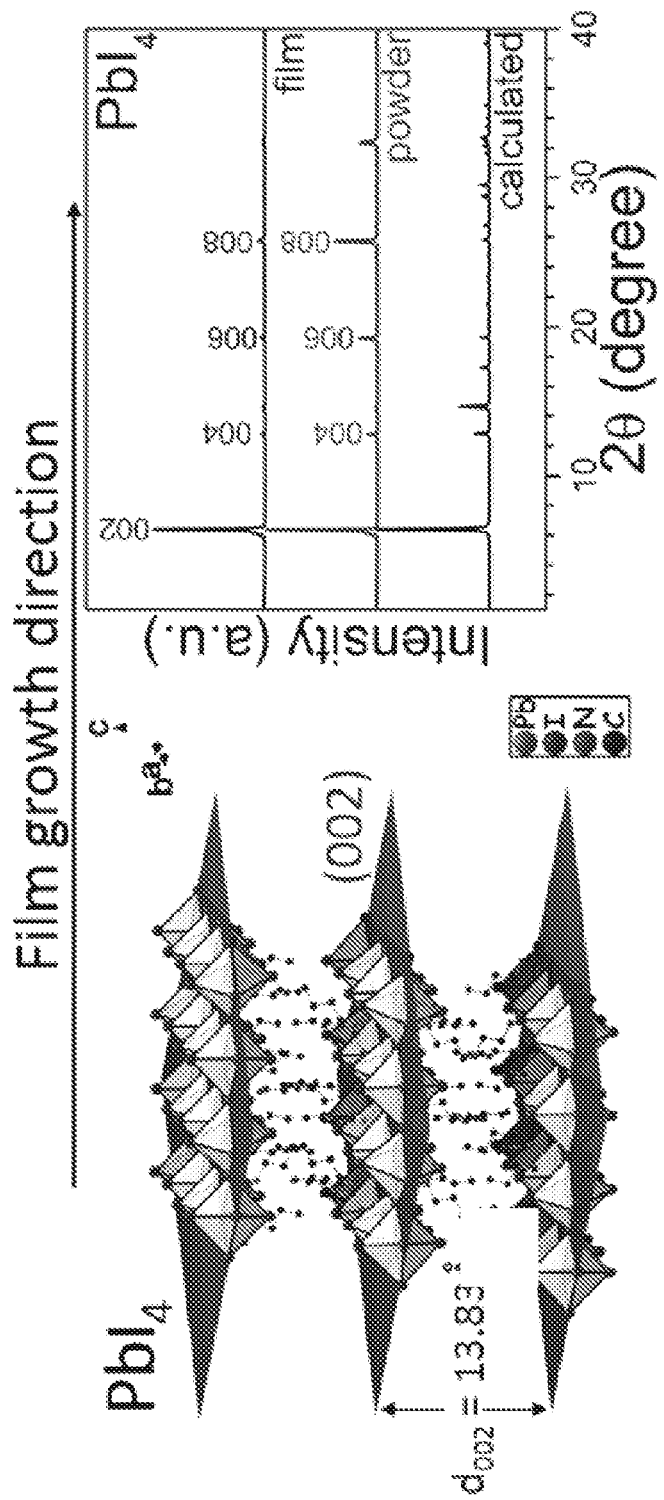
FIG. 1(A) depicts X-ray diffraction (XRD) (right panel) of thin films vs. bulk materials of $BA_2PbI_4$ perovskites, with an illustration of its diffraction planes (left panel).

Two-dimensional, multilayered halide perovskites are provided. Also provided are optoelectronic devices comprising the perovskites as photoactive materials.

The radiation-absorbing materials can be made using a simple one-step deposition in which a solution comprising a two-dimensional, multilayered perovskite powder in an organic solvent is applied to the substrate and allowed to dry, optionally, with a heat treatment step to anneal the resulting film. The solution may be applied using, for example, spin casting. The deposition may be conducted at room temperature.

Some embodiments of the two-dimensional perovskites have the general formula formula $(RNH_3)_2A_{(n-1)}M_nX_{(3n+1)}$, or the general formula formula $(H_3NRNH_3)A_{(n-1)}M_nX_{(3n+1)}$, where $RNH_3$ and $H_3NRNH_3$ are aliphatic or aromatic alkylammonium cations and, therefore, R represents an aliphatic or aromatic chain. A is a small organic or inorganic cation that serves as a perovskitizer; M is a divalent metal cation; X is a halide anion; and n is an integer. In some embodiments n is in the range from 1 to 12. In some embodiments, $n \geq 2$. In some embodiments, $n \geq 3$. In some embodiments, $n \geq 4$.

Other embodiments of the two-dimensional perovskites have the general formula $(RNH_3)_2A_nM_nX_{(3n+1)}$, where $RNH_3$ is an aliphatic or aromatic alkyl ammonium cation and, therefore, R represents an aliphatic or aromatic chain. A is a small organic or inorganic cation that serves as a perovskitizer; M is a divalent metal cation, X is a halide anion, and n is an integer. In some embodiments n is in the range from 1 to 12. In some embodiments, $n \geq 2$. In some embodiments, $n \geq 3$. In some embodiments, $n \geq 4$.

The perovskites are characterized by a structure in which a plurality of inorganic layers comprising $[MX_6]^{4-}$ octahedra and the 'A' cations are confined between bilayers of the alkyl ammonium cations, which provide a spacer between the inorganic layers. The unit layers are stacked together by a combination of Coulombic and hydrophobic forces to maintain their structural integrity. These 2D compounds could be regarded as natural multiple-quantum-well structures in which the semiconducting inorganic layers act as "wells" and the insulating organic layers act as "barriers." Two-dimensional perovskites differ from three-dimensional perovskites, in that the small $A^-$ cation is replaced by a much bulkier organic primary ammonium cation, thus confining the perovskite in two dimensions because of steric effects.

The small A cations are cations that induce perovskite formation and are referred to as perovskitizers. The A cations can be organic cations, such as alkyl ammonium cations, or inorganic cations. Examples of A cations include $NH_4^+$, $Li^+$, $Na^+$, $Rb^+$, $Cs^+$, $CH_3NH_3$, $HC(NH_2)_2$, and 4-atom spacer (4S) cations. 4S cations include methylammonium (MA), dimethylammonium (DMA), ethylammonium (EA), trimethylammonium ($T^3MA$), isopropyl ammonium (IPA), tetramethylammonium ($T^4MA$), formamidinium (FA), guanidinium (GA), acetamidinium (ACA), imidazolium (IM), methylthioformamidinium (MSA), and iodoformamidinium (IFA), the structures of which are shown in FIG. 17.

Figure 17:
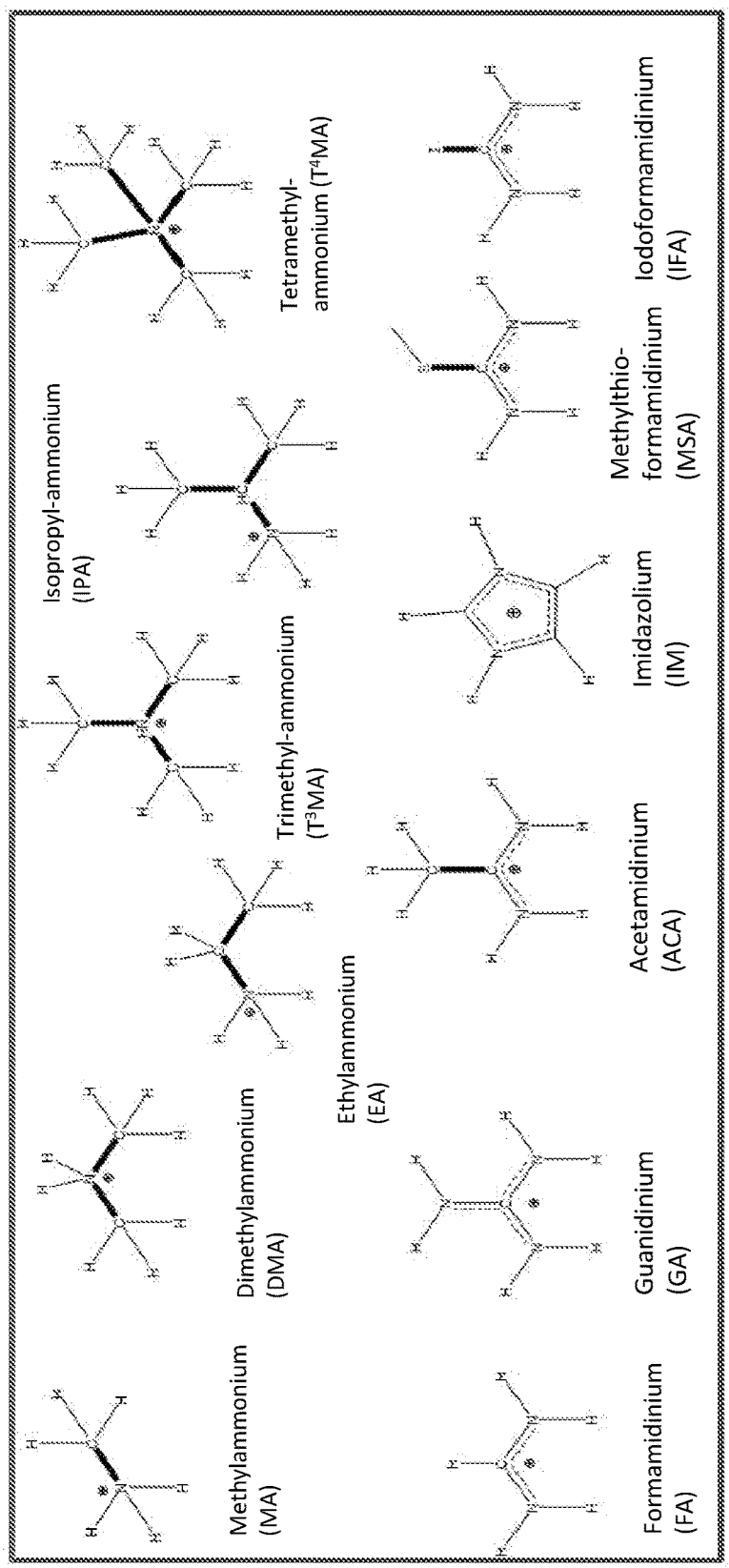
FIG. 17 depicts 4-atom spacer (4S) cations.
Figure 18:
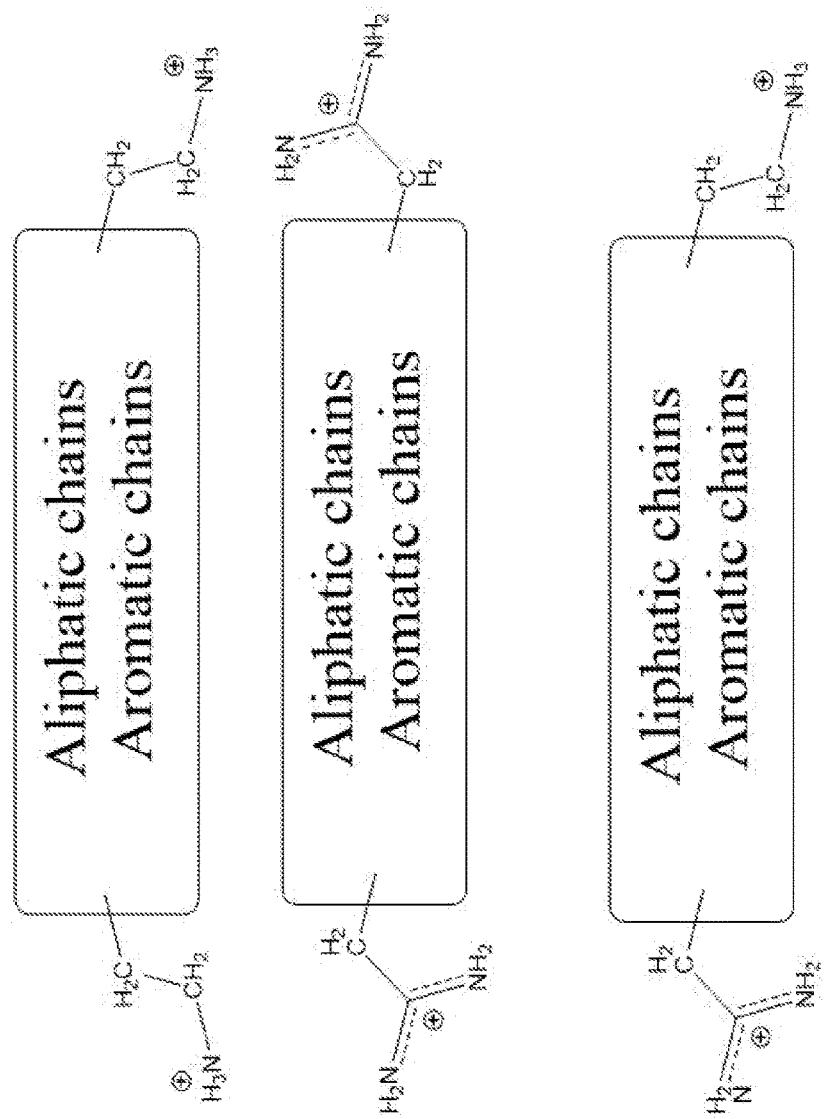
FIG. 18 depicts the general structure of different types of dicationic aromatic and aliphatic alkyl ammonium cations.

The aliphatic and aromatic alkyl ammonium cations can also comprise 4S cations, including those depicted in FIG. 17. Other types of aromatic alkyl ammonium cations include the electron acceptor cations, electron donor cations, and charge transfer cations shown in FIGS. 12, 13, and 14, respectively. The alkyl ammonium cations can be dicationic amines, the general structures of which are illustrated schematically in FIG. 18, in which the rectangular boxes represent aromatic or aliphatic chains (i.e, "R" groups).

The divalent metal cations, M, can be, for example, Ge, Sn, and/or Pb cations, first row 3d transition metal cations, and/or the coinage metal (Cu, Ag, Au) cations.

Certain aspects of the inventions described herein are based, at least in part, on the inventors' discovery that by using the alkyl ammonium cation as the limiting reagent in the synthesis of the halide perovskites, one can achieve a surprisingly phase pure (in terms of n-value) sample of the 2D halide perovskites. This is significant since the common wisdom in the field suggested that the 2D halide perovskites could not be isolated in pure form for n values of 3 or higher, as discussed in the background section. In the present methods, highly pure samples of a given 2D halide perovskite are achieved by reacting the small organic or inorganic cation (A) and the metal halide (e.g., a halide of the divalent metal cation (M)) with a sub-stoichiometric quantity of the aromatic or aliphatic ammonium cation in a solution, heating the solution to a temperature above room temperature (~23° C.) to dissolve any initial precipitates, and allowing the solution to cool, whereby substantially phase-pure two-dimensional halide perovskites precipitate out of the solution. Typically, a first solution of the small cation (A) and the metal halide will be formed initially and a second solution of the alkyl ammonium cation neutralized with the halide will subsequently be added. Using this method, highly pure 2D halide perovskite precipitates can be synthesized in gram scale quantities (e.g., in quantities of at least 0.5 grams, at least 1 gram, at least 5 grams, or even greater). By way of illustration, the methods can be used to synthesis 2D halide perovskites with a phase purity of at least 95%, based on mole fraction. (That is, in the synthesized 2D halide perovskite precipitate, at least 95%, based on mole fraction, of the 2D halide perovskites will have the same n value.) This includes embodiments of the methods that form the 2D halide perovskites with a phase purity of at least 98% and at least 99%, based on mole fraction. Notably, even the higher order 2D halide perovskites having the formula $(RNH_3)_2A_{(n-1)}M_nX_{(3n+1)}$ or the formula $(H_3NRNH_3)A_{(n-1)}M_nX_{(3n+1)}$ with n values of 3, 4, 5, and higher can be prepared at these levels of phase purity using this method. This is a substantial achievement since this degree of purity cannot be achieved for the higher order 2D halide perovskites synthesized using the alkyl ammonium cation stoichiometrically or using the small organic cation in excess.

The purity of the compounds can be evaluated in three stages: a) by powder X-ray diffraction of the bulk material, which can detect the presence of impurity phases which are present in more than 5% molar fraction. The molar fraction is calculated by matching the patterns of each phase using suitable software. (For example, Petříček, V.; Dušek, M.; Palatinus, L., Crystallographic Computing System JANA2006: General features. *Zeitschrift für Kristallographie—Crystalline Materials* 2014, 229 (5), 345). The diffraction peaks are indexed based on the known calculated pattern, which is obtained through X-ray diffraction of single crystals; b) the presence of lower level impurities can also be evaluate by absorption spectroscopy where additional phases with larger or smaller band gaps than the main phase have distinctive absorption edges; and c) phase purity can be further validated by photoluminescence (PL) emission spectroscopy which is characterized by a gauss-type single peak with well-defined full-width-at-half-maximum (FWHM) for a pure material.

The ability to synthesize gram-scale quantities of highly phase pure 2D halide perovskites opens up their applications as the photoactive material is broad variety of photoelectric devices, including light emitting devices, photovoltaic cells (e.g., solar cells), lasers, non-linear optical devices, and optoelectronic modulators.

The two-dimensional, multilayered perovskites include halide perovskites having the formula $(RNH_3)(CH_3NH_3)_{(n-1)}M_nX_{(3n+1)}$, where M is Ge, Sn, Pb or a combination thereof, X is I, Br, Cl, F or a combination thereof, n is an integer in the range from 1 to 12, and R is an aliphatic (i.e., non-aromatic) chain of the type $CH_3(CH_2)_xNH_3^+$, where x is in the range from 3 to 16. These perovskites have a structure comprising a plurality of inorganic layers comprising $[MX_6]^{4-}$ octahedral and $(CH_3NH_3)$ cations, wherein the inorganic layers are confined between bilayers of $(RNH_3)$ cations.

Illustrative examples of these types of two-dimensional, multilayered halide perovskites have the formula $(CH_3(CH_2)_3NH_3)_2(CH_3NH_3)_{(n-1)}M_nX_{(3n+1)}$, where M is Sn, Pb or a combination thereof, X is I, Br or a combination thereof, n is an integer in the range from 1 to 12 (for example, n=1, 2, 3, 4, or 5), and a structure comprising a plurality of inorganic layers comprising $[MX_6]^{4-}$ octahedral and $(CH_3NH_3)$ cations, wherein the inorganic layers are confined between bilayers of $(CH_3(CH_2)_3NH_3)$ cations.

Specific embodiments of the perovskites have the formula $(CH_3(CH_2)_3NH_3)_2(CH_3NH_3)_{(n-1)}M_nX_{(3n+1)}$, where n=1, 2, 3, 4, or 5, and are characterized by a structure in which a plurality of inorganic layers comprising $[MX_6]^{4-}$ octahedral and $(CH_3NH_3)$ cations are confined between bilayers of $(CH_3(CH_2)_3NH_3)$ cations. Even more specific embodiments of the perovskites have the formula $(CH_3(CH_2)_3NH_3)_2(CH_3NH_3)_{(n-1)}Pb_nI_{(3n+1)}$, where n=1, 2, 3, 4, or 5, and are characterized by a structure in which a plurality of inorganic layers comprising $[PbI_6]^{4-}$ octahedral and $(CH_3NH_3)$ cations are confined between bilayers of $(CH_3(CH_2)_3NH_3)$ cations. The $(CH_3(CH_2)_3NH_3)_2(CH_3NH_3)_{n-1}Pb_nI_{3n+1}$ perovskites are semiconductors, in which the band gaps of the series decrease with increasing n values, from 2.24 eV $(CH_3(CH_2)_3NH_3)_2PbI_4$ (n=1) to 1.52 eV $CH_3NH_3PbI_3$ (n=∞). These compounds exhibit strong light absorption in the visible region of the electromagnetic spectrum, accompanied by strong photoluminescence at room temperature, rendering them suitable light absorbers for photovoltaic applications, such as solid state solar cells.

The two-dimensional, multilayered perovskites can be configured as photoactive, radiation-absorbing materials by applying a thin film of the perovskites on a substrate that is an electron acceptor. Examples of perovskites that are particularly well suited for use as radiation-absorbing materials are those having the formula $(CH_3(CH_2)_3NH_3)_2(CH_3NH_3)_{(n-1)}Pb_nI_{(3n+1)}$, where n=3, 4, or 5, because thin films of those compounds can be grown with their crystals oriented exclusively, or nearly exclusively, with their inorganic layers aligned perpendicular the surface of the substrate, as illustrated in Example 1. The two-dimensional, multilayered perovskites can be configured as photoactive, radiation-absorbing materials by applying a thin film of the perovskites on a substrate that is an electron acceptor. Examples of perovskites that are particularly well suited for use as radiation-absorbing materials are those having the formula $(CH_3(CH_2)_3NH_3)_2(CH_3NH_3)_{(n-1)}Pb_nI_{(3n+1)}$, where n=3 or 4, because thin films of those compounds can be grown with their crystals oriented exclusively, or nearly exclusively, with their inorganic layers aligned perpendicular to the surface of the substrate, as illustrated in Example 1.

The electron-acceptor substrate is a semiconductor, such as a semiconducting metal oxide. Examples of these include $TiO_2$, ZnO and $Nb_2O_5$. The substrate may be a planar substrate that supports a planar film of the two-dimensional perovskite. However, a porous substrate comprising pores into which the perovskite film infiltrates is preferred because it increases the surface area of the radiation-absorbing material and requires a thinner film of the perovskite, which increases the probability that photogenerated charge carriers in the perovskite film will make it to the electron-acceptor substrate.

The two-dimensional perovskites are stable against degradation by water in humid environments. Some embodiments of the perovskites are stable against chemical degradation at room temperature (~23° C.) for periods of two months or more under 40% humidity. In addition, crystals of the perovskites can be preferentially grown with well-defined crystal orientations in which the inorganic layers in the two-dimensional structure grown vertically from a growth substrate, such that their inorganic layers are oriented perpendicular to the substrate surface, along the direction of the local substrate surface normal. In some of the two-dimensional perovskites, the majority of the perovskite crystals have their inorganic layers oriented perpendicular to the substrate surface. This includes embodiments in which all or substantially all (for example >90%) of the perovskite crystals are so oriented. Vertical growth of the perovskite crystals is advantageous for photovoltaic applications because it facilitates charge transport to electron- and hole-accepting materials along the M-X-M (e.g., Pb—I—Pb) pathways in the perovskites. This crystal orientation can be attributed to ultrahigh surface coverage as a result of the unusual perovskite film self-assembly that orients the $[Pb_nI_{3n+1}]^{31}$ containing inorganic layers perpendicular to the substrates.

Figure 12:
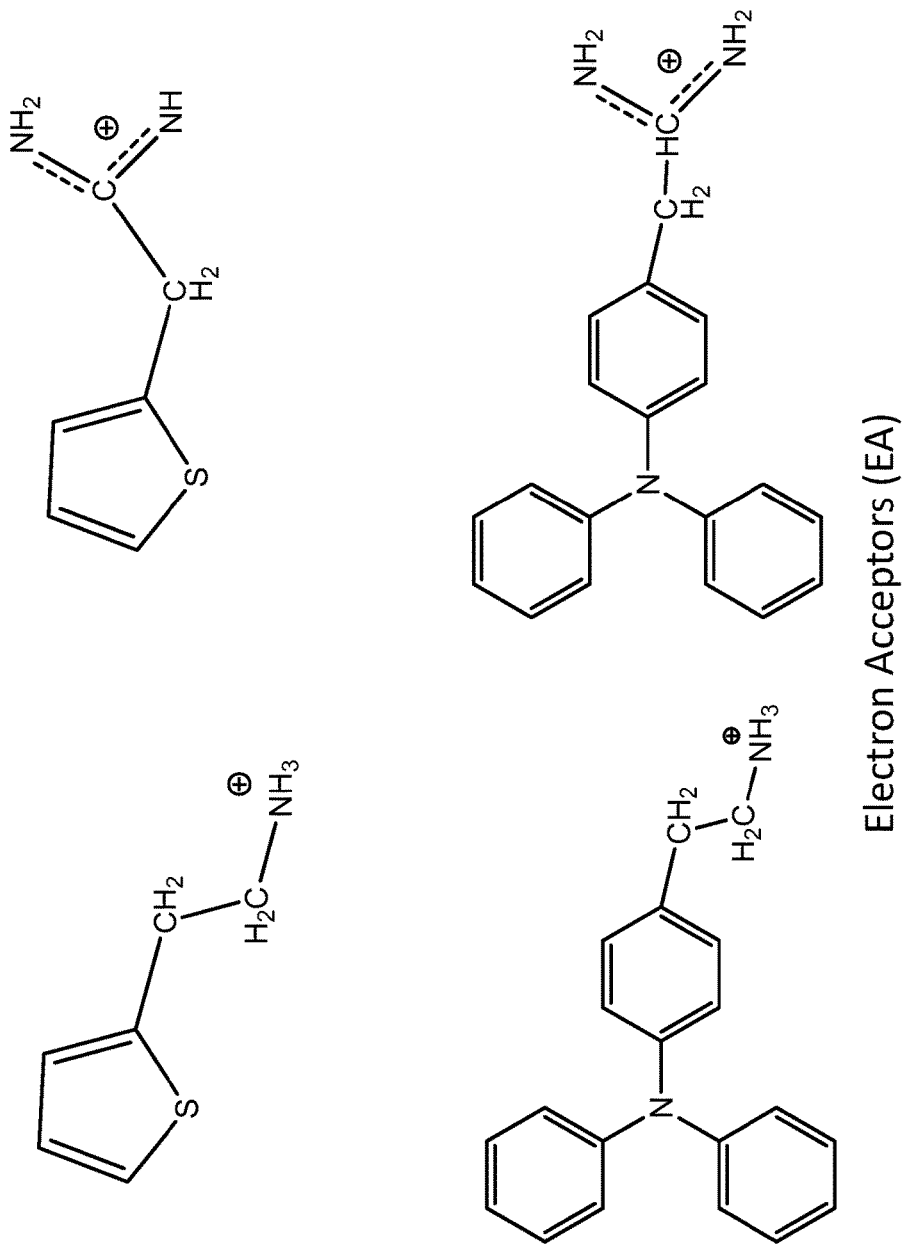
FIG. 12 depicts electron accepting alkyl ammonium cations.
Figure 13:
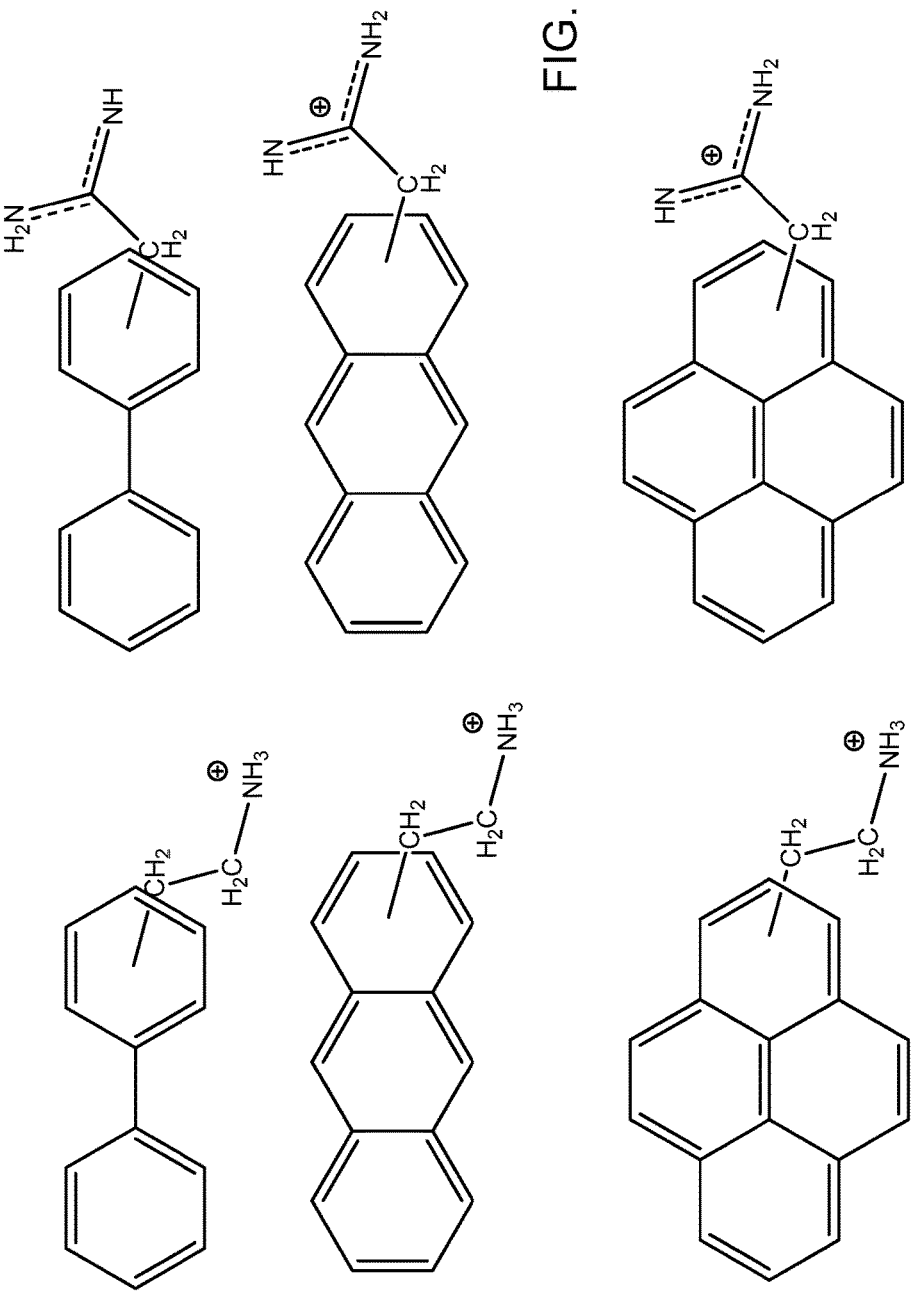
FIG. 13 depicts electron donating alkyl ammonium cations.
Figure 14:
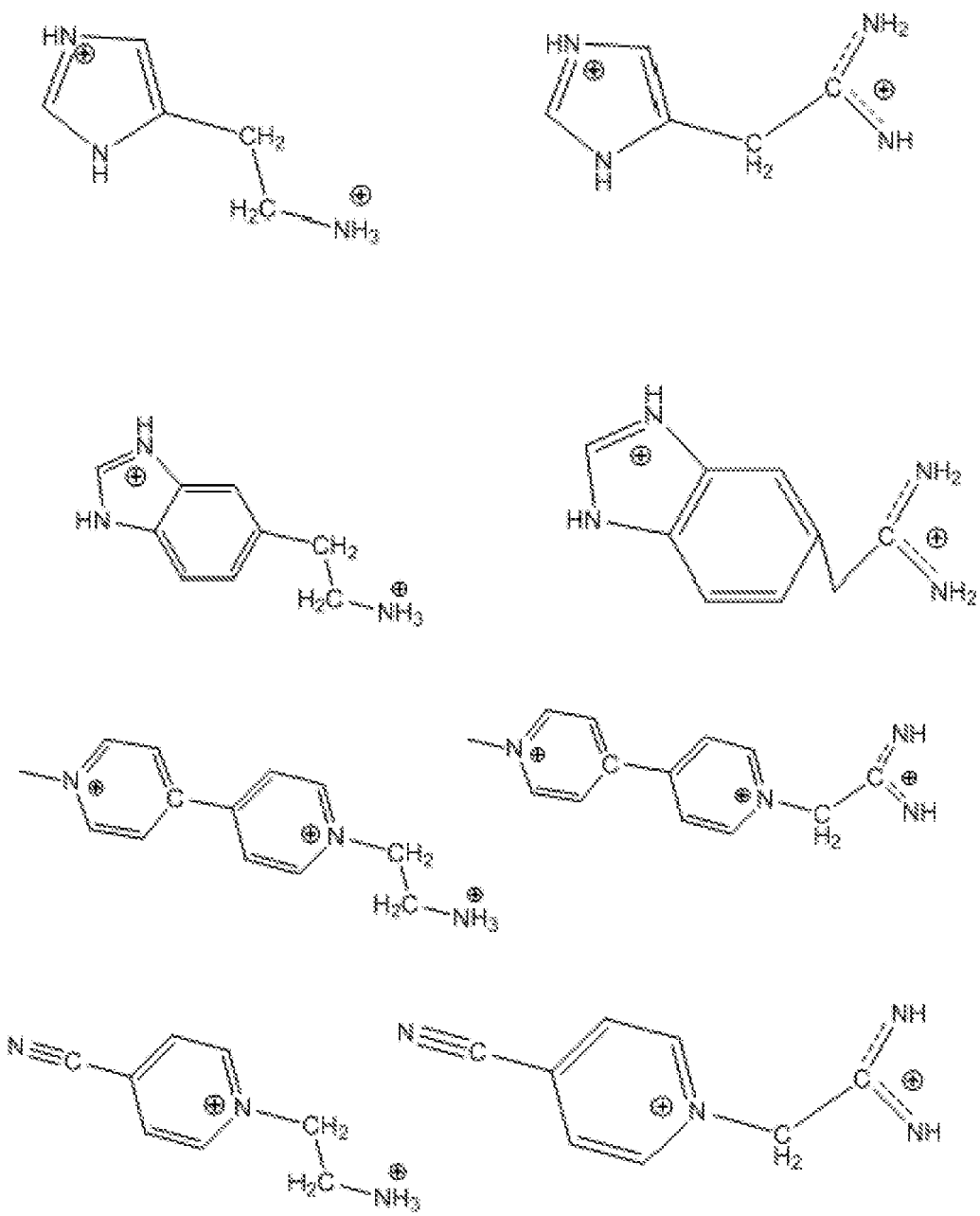
FIG. 14 depicts charge transferring alkylammonium cations.

The two-dimensional, multilayered perovskites also include halide perovskites having the formula $(A)_2(CH_3NH_3)_{(n-1)}M_nX_{(3n+1)}$, where M is Ge, Sn, Pb or a combination thereof, X is I, Br, Cl, F or a combination thereof, n is an integer in the range from 1 to 12, and A is a conjugated cation, such as an aromatic alkylammonium cation, comprising a charge transporting group, such as an electron-accepting group or an electron-donating group. Aromatic groups that may be present in the conjugated cations include phenyl groups, thiophene groups and imidazole groups. Examples of aromatic alkylammonium cations that can act as electron acceptors (EAs), electron donors (EDs) and charge transfer groups (CTs) are shown in FIG. 12, FIG. 13 and FIG. 14, respectively.

Figure 15:
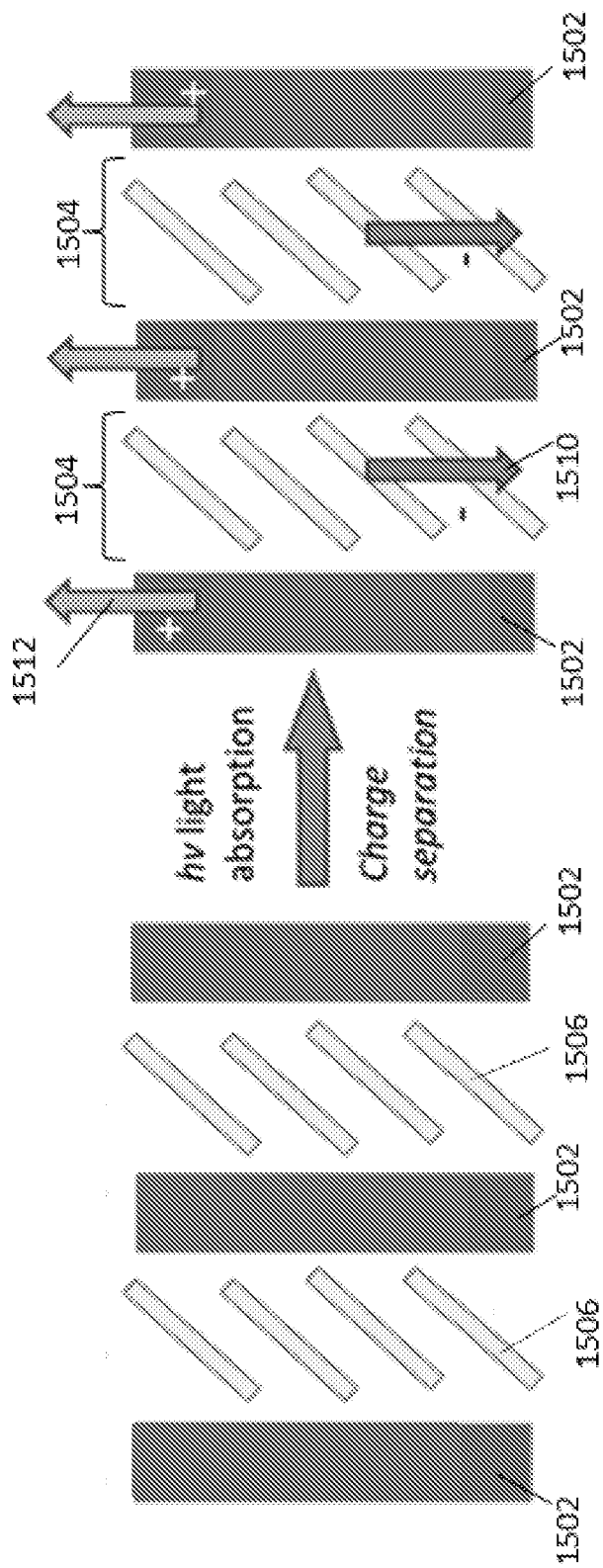
FIG. 15 is a schematic illustration of a two-dimensional perovskite-based photovoltaic cell before (left panel) and after (right panel) light absorption. Electron and hole transport is shown in the right panel.

The advantage of using ammonium cations comprising electron transporting properties in the two-dimensional perovskites is illustrated schematically in FIG. 15. The perovskite comprises a plurality of inorganic layers 1502 separated by organic layers 1504 comprising the conjugated ammonium cations 1506 (panel (a)). When incident light generates electron-hole pairs in the perovskite, the inorganic layers 1502 act as light-absorbers and transfer photoexcited electrons 1510 to organic layers 1504. Holes 1512 then move along inorganic layers 1502 to a first electrode and electrons 1510 move in the opposite direction along organic layers 1504 to a second electrode. Incorporating electron transporting ammonium cations between the inorganic layers in this manner enables the fabrication of integrated photovoltaic cells comprising only a single compound in their active regions and obviates a separate layer of electron transporting material.

The two-dimensional, multilayered perovskites also include halide perovskites having the formula $(A)_2(CH_3NH_3)_{(n-1)}M_nX_{(3n+1)}$, where M is Ge, Sn, Pb or a combination thereof, X is I, Br, Cl, F or a combination thereof, n is an integer in the range from 1 to 12, and A is an alkylammonium cation that provides a four-atom spacer. Examples of such alkylammonium ions include acetamidinium (WO), guanidinium (GUA), trimethylammonium (TMA), and isopropylammonium (IPA). The small cations bring the perovskite layers close to one another, thus allowing them to interact, and in addition they can change the way the two-dimensional perovskites align, changing the orientation from the (001) to the (110) crystallographic plane with respect to the three-dimensional perovskite.

Figure 11:
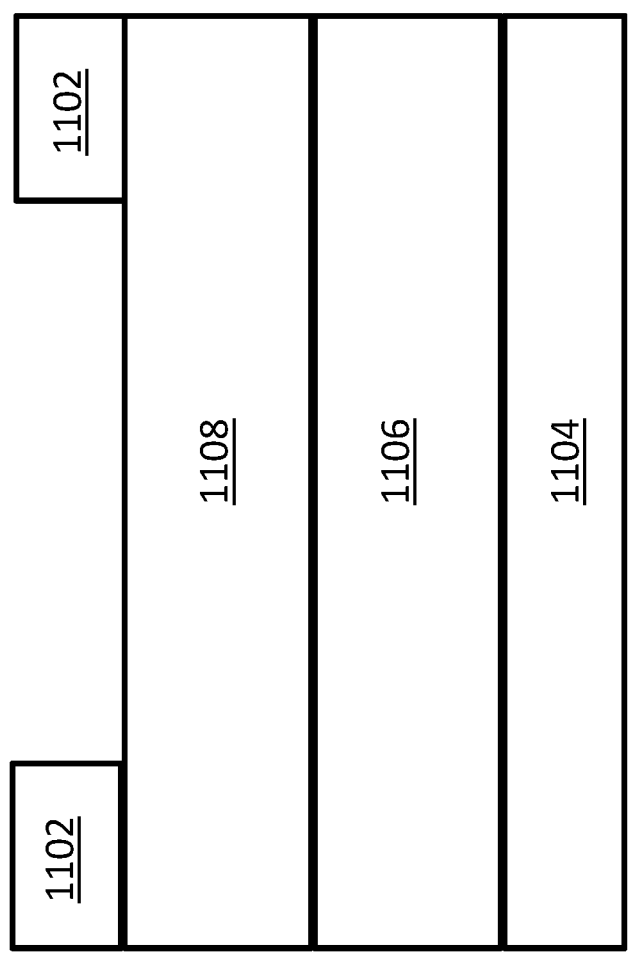
FIG. 11 is a schematic diagram of a cross-sectional side view of a photovoltaic cell.

A schematic illustration of a photovoltaic cell comprising the two-dimensional, multilayered perovskite-based radiation-absorbing material in its photoactive layer is shown in FIG. 11. The photovoltaic cell comprises a first electrode 1102 comprising an electrically conductive material, a second electrode 1104 comprising an electrically conductive material, a light absorbing layer 1106 comprising the light-absorbing material disposed between (including partially between) and in electrical communication with the first and second electrodes 1102, 1104, and an organic hole transporting material 1108 disposed between (including partially between) first and second electrodes 1102, 1104 and configured to facilitate the transport of holes (that is, to provide preferential transport of holes relative to electrons) generated in the light-absorbing material to one of the first or second electrodes. Although not shown here, other layers commonly used in thin film photovoltaic cells, such as electron transport layers, hole blocking layers and the like, may also be incorporated into the photovoltaic cells.

At least one of the two electrodes is desirably transparent to the incident radiation (e.g., solar radiation). The transparent nature of the electrode can be accomplished by constructing the electrode from a transparent material or by using an electrode that does not completely cover the incident surface of the cell (e.g., a patterned electrode). One example of a transparent electrode comprises a transparent conducting oxide (e.g., fluorine-doped tin oxide (FTO)) coating on a transparent substrate.

Photovoltaic cells comprising light-absorbing layers comprising the two-dimensional halide perovskite compounds can have significant power conversion efficiencies. For example, photovoltaic cells having conversion efficiencies under AM 1.5G solar illumination of at least 3%, at least 3.5% and at least 54% are provided. These power conversion efficiencies can be increased by using thicker films of the perovskite. Methods for determining the power conversion efficiency of a solar cell are provided in the Example.

EXAMPLES

In the examples that follow, various 2D halide perovskites are synthesized by reacting alkyl ammonium cations with small (A) cations and metal halides. However, other 2D halide perovskites can be synthesized using the same methods with different alkylammonium cations, small (A) cations, divalent metals, and/or halide reactants.

Example 1

In this Example, the fabrication and properties of thin films of the two-dimensional (2D) lead iodide perovskite $(CH_3(CH_2)_3NH_3)_2(CH_3NH_3)_{n-1}Pb_nI_{3n+1}$ series, which combines the structural features of the simple 2D (n=1) and the 3D (n=∞) perovskites, is reported. It is shown that the thin films, remarkably, grow with the $[Pb_nI_{3n+1}]$ slabs perpendicular to the substrates and, as a result, can be used as the light-absorbing layer to fabricate functional solar cells. It is established that unlike 3D MAPbI$_3$, which requires more complex film fabrication methods to achieve high-quality films, the 2D analogues yield smooth, ultrahigh surface coverage films from a simple one-step spin-coating approach. In addition, 2D perovskite-based films are notably moisture-resistant. In this work, a power conversion efficiency of 4.02% was obtained by using $(CH_3(CH_2)_3NH_3)_2(CH_3NH_3)_2Pb_3I_{10}$ as a light absorber, with an open-circuit voltage ($V_{oc}$) of 929 mV and a short-circuit current ($J_{sc}$) of 9.42 mA/cm$^2$.

Experimental Section

Materials. 2,2,7,7'-Tetrakis(N,N-di-p-methoxyphenylamine)9,9'-spirobifluorene (spiro-OMeTAD) was purchased from Feiming Chemical Limited. Transparent titania (TiO$_2$) paste (Dyesol 18NRT) was purchased from DyeSol. All other chemicals were purchased from Sigma-Aldrich. Unless otherwise stated, all were used as received. Methylammonium iodide (MAI) was synthesized by neutralizing equimolar amounts of a 57% w/w aqueous hydriodic acid (HI) and 40% w/w aqueous methylamine (CH$_3$NH$_2$, pH ~7). The white precipitate was collected by evaporation of the solvent using rotary evaporation at 60° C. under reduced pressure.

Synthesis. PbO powder was dissolved in a mixture of 57% w/w aqueous HI solution and 50% aqueous H$_3$PO$_2$ by heating to boiling under constant magnetic stirring for about 5 min, forming a bright yellow solution. Subsequent addition of solid CH$_3$NH$_3$I to the hot yellow solution initially caused the precipitation of a black powder that rapidly redissolved under stirring to afford a clear bright-yellow solution. n-CH$_3$(CH$_2$)$_3$NH$_2$ was then added dropwise under vigorous stirring over a period of 1 min. without any changes in the solution. The stirring was then discontinued, and the solution was left to cool to room temperature during which time deep-red rectangular-shaped plates started to crystallize. The precipitation was deemed to be complete after ~2 h. The crystals were isolated by suction filtration and thoroughly dried under reduced pressure.

Device Fabrication. FTO-coated glass (1.5 cm×2.0 cm, TEC 7, 2.2 mm, Hartford Glass Co., Inc.) was patterned by etching away a 5 mm strip with zinc powder and 4 M HCl. Then, substrates were cleaned by sonication in detergent, isopropanol, acetone, and dried under an air flow before use. A 20 nm thick TiO$_2$ compact layer was deposited onto the substrates by atomic layer deposition (ALD; Savannah S300, Cambridge Nanotech Inc.) using titanium isopropoxide (0.15 s pulse time, 8 s exposure time, and 20 s purge time) and water (0.015 s pulse time, 8 s exposure time, 20 s purge time) as precursors. For planar structure, the ALDed TiO$_2$ substrates were soaked in a 0.1 M aqueous solution of TiCl$_4$ for 30 min. at 70° C., rinsed with deionized water, and dried at 500° C. for 20 min. For sensitized structure, a mesoporous TiO$_2$ layer composed of 20 nm particles was deposited on the ALD-treated TiO$_2$ substrates by spincoating at 4000 rpm for 30 s using a commercial TiO$_2$ paste (Dyesol 18NR-T) diluted in anhydrous ethanol (2:7 weight ratio). Mesoporous TiO$_2$ substrates were then gradually annealed by heating from room temperature to 500° C. (8° C./min) for 15 min, followed by post-treating in a 0.1 M aqueous solution of TiCl$_4$ for 30 min. at 70° C. The TiO$_2$ substrates were finally rinsed with deionized water and dried at 500° C. for 20 min. The light-absorbing layers were deposited by spin-coating 1.8 M Pb$^{2+}$ perovskite precursor solutions at 3000 rpm for 30 s. The 1.8 M Pb$^{2+}$ precursor solutions of MAPbI$_3$, (BA)$_2$(MA)$_{n-1}$Pb$_n$I$_{3n+1}$ (n=4, 3, 2, and 1) were prepared by dissolving the corresponding amount of perovskite powders in anhydrous dimethylformamide (DMF) solvent with stirring at 70° C. for 30 min. prior to film deposition. MAPbI$_3$ film was formed after annealing in air at 100° C. for 15 min, whereas other 2D perovskite films were formed immediately after spin-coating at room temperature. The spiro-OMeTAD hole-transporting material (HTM) solution, comprised of 65.3 mM spiro-OMeTAD, 9.1 mM lithium bis-(trifluoromethanesulfonyl)imide, and 93.8 mM 4-tert-butylpyridine in chlorobenzene solvent, was then deposited on the perovskite layer by spin-coating at 4000 rpm for 30 s. Films were dried under vacuum overnight before completing the device fabrication process by thermal evaporation of 80 nm of gold on top of the HTM layer.

Experimental. Material characterization. Powder and film X-ray diffraction patterns were collected using a CPS 120 INEL X-ray diffractometer (Cu Kα, 1.5406 A) operating at 40 kV and 20 mA. Optical diffuse-reflectance spectra were collected at room temperature using a Shimadzu UV-3600 PC double-beam, double-monochromator spectrophotometer operating from 200 to 2500 nm. BaSO4 was used as a non-absorbing reflectance reference. Photoluminescence spectra were collected using a fluorometer in which the light source was a xenon lamp. The excitation wavelengths were 640 nm, 620 nm, 550 nm, 500 nm, and 400 nm for CH3NH3PbI3, (n-C4H9NH3)2(CH3NH3)n−1PbnI3n+1 (n=4, 3, 2, 1), respectively. Work function was probed using ultraviolet photoelectron spectroscopy (UPS) under high vacuum with He I gas as an ultraviolet light source (21.20 eV). Scanning electron microscope (SEM) images were acquired at an accelerating voltage of 5 to 20 kV using a Hitachi SU8030 instrument equipped with an Oxford X-max 80 SDD EDS detector. Table 1 shows the SEM-EDS elemental analysis for the perovskite films.

TABLE 1

SEM-EDS elemental analysis of $(C_4H_9NH_3)_2(CH_3NH_3)_{n-1}Pb_nI_{3n+1}$ (n = 1, 2, 3, 4, ∞) perovskite thin films

| Compound | Pb (Atomic %) | I (Atomic %) | Experimental I:Pb ratio | Theoretical I:Pb ratio | Error (%) |
|---|---|---|---|---|---|
| MAPbI$_3$ | 3.33 | 9.77 | 2.93 | 3.00 | 2.20 |
| (BA)$_2$(MA)$_3$Pb$_4$I$_{13}$ | 2.62 | 8.46 | 3.23 | 3.25 | 0.65 |
| (BA)$_2$(MA)$_2$Pb$_3$I$_{10}$ | 2.36 | 7.61 | 3.22 | 3.33 | 3.17 |
| (BA)$_2$(MA)Pb$_2$I$_7$ | 2.27 | 8.34 | 3.67 | 3.50 | 4.97 |
| (BA)$_2$PbI$_4$ | 1.28 | 5.26 | 4.11 | 4.00 | 2.73 |

*Note:
For the purpose of only comparing the I:Pb ratio, the atomic percentages of other elements, such as Ti, O, C and N, were not included.

Device characterization. Photovoltaic responses (J-V curves) were measured under AM1.5G sunlight irradiance (100 mW·cm-2) generated by a xenon arc lamp of a Spectra-Nova Class A solar simulator, with the intensity calibrated by using an NREL-certified mono-crystalline Si diode coupled to a KG3 filter to get a spectral mismatch to unity. A Keithley 2400 series source meter was used to collect J-V data. The active area of all devices was 17.5 mm2, but limited to a 14 mm2 aperture via a mask during the measurement.

Results and Discussion

Film Fabrication and Film Growth Characteristics. The 2D $(CH_3(CH_2)_3NH_3)_2(CH_3NH_3)_{n-1}Pb_nI_{3n+1}$ family of perovskite compounds (n=1-4) was synthesized from a stoichiometric reaction between PbI$_2$, MAI, and n-butylammine (BA). Structurally, the 2D perovskites are the product of slicing the 3D perovskite along the (110) plane, in such a way that some of the oriented MA cations are partially (n=2, 3, and 4) or fully (n=1) substituted by BA cations.

The incorporation of perovskite light absorber into a functional solid-state solar device requires the transformation of perovskite powder materials into thin films. In this work, all perovskite films were fabricated by a one-step deposition method, by means of spin-coating the DMF precursor solutions of perovskite on mesoporous TiO$_2$ substrates. The well-studied MAPbI$_{3-x}$Cl$_x$ film was also prepared for comparison purposes. To fabricate MAPbI$_{3-x}$Cl$_x$ film, the precursor solution was prepared by mixing a 3:1 molar ratio of MAI and PbCl$_2$ in DMF. Deposition of the MAPbI$_3$ film by the one-step approach has been shown to produce low-quality films that suffer from low surface coverage and large, nonuniform crystal size, resulting in low conversion efficiency. Therefore, many different approaches of film deposition have been examined to improve the film quality, including high-vacuum vapor deposition, sequential deposition, vapor-assisted deposition, solvent engineering, etc. Conversely, in this work it is demonstrated that high-quality 2D perovskite films can be easily formed using the one-step method. The 2D perovskites self-assemble to form well-defined films on the substrates with nearly perfect surface coverage and a fine texture. The growth of the films is clearly driven by the 2D nature of the compounds forming highly oriented crystals with only a few grain boundaries. Interestingly, the 2D films are readily formed immediately after the spin-coating process without requiring annealing steps, demonstrating a facile preparatory method and rendering it compatible with flexible substrates.

The thin films of $(BA)_2(MA)_{n-1}Pb_nI_{3n+1}$ perovskites show a highly remarkable tendency when the orientation of the structure on the substrate is considered (FIG. 1 and FIG. 2).

Generally, the orientation of 2D materials on flat substrates strongly favors growth where the layers orient parallel to the substrate, a trend that has also been observed in the case of single-layer halide perovskites. In the case of $(BA)_2(MA)_{n-1}Pb_nI_{3n+1}$, this trend appears to be true only for the n=1 compound, where preferential growth along the (110) direction occurs, thus exclusively revealing the (00l) reflections. As soon as the layers become thicker (n>1), a competition arises between the BA ions, which try to confine the growth within the planar layer, and the MA ions, which try to expand the perovskite growth outside the layer. Already for the n=2 compound, the (0k0) reflections are "contaminated" with the (111) and (202) reflections, which reveal the vertical growth of the compound with respect to the substrate plane. (Note that the (0k0) reflections for n=2-4 correspond to the (00l) reflection for n=1 and ∞) The n=3 and 4 compounds continue the trend by showing exclusively the (111) and (202) reflections and lacking (0k0) reflections, clearly indicating the vertical growth of the perovskite compounds. This effect becomes even more pronounced when one compares it with the preferential growth of the bulk $(BA)_2(MA)_{n-1}Pb_nI_{3n+1}$ compounds (FIG. 1(A) and FIG. 1(B); and FIG. 2(A), FIG. 2(B), and FIG. 2(C)). These appear to follow the standard norms (crystallizing along the (h0l) plane), thereby showing only the (0k0) reflections. It follows that the (111) reflection dominates the diffraction patterns because the (101) reflection is not allowed (h=2n and h, l=2n reflection conditions); therefore, the closest plane describing the vertical growth becomes the (111) plane.

Figure 1B:
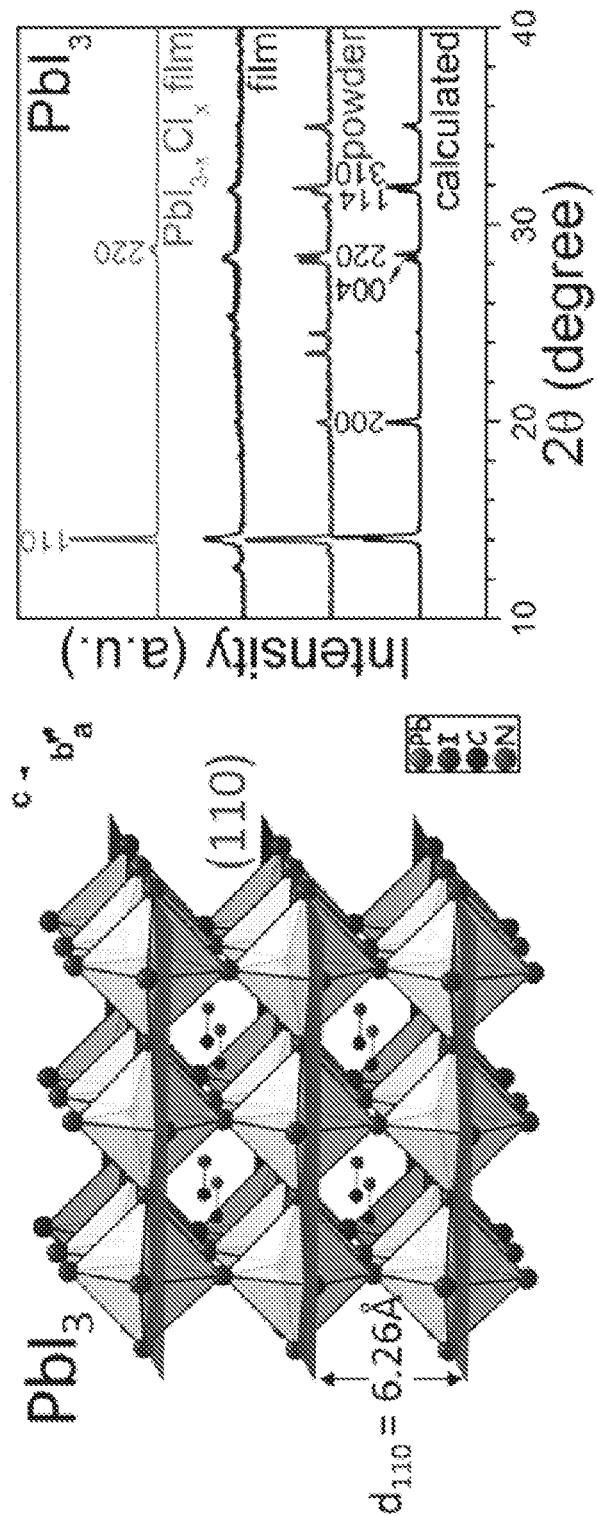
FIG. 1(B) depicts XRD (right panel) of thin films vs. bulk materials of $MAPbI_3$ perovskites, with an illustration of its diffraction planes (left panel). Films of $MAPbI_3$ correspond to the unique and ideal case of perfect orientation obtained from the 3D $MAPbI_{3-x}Cl_x$ system.
Figure 2A:
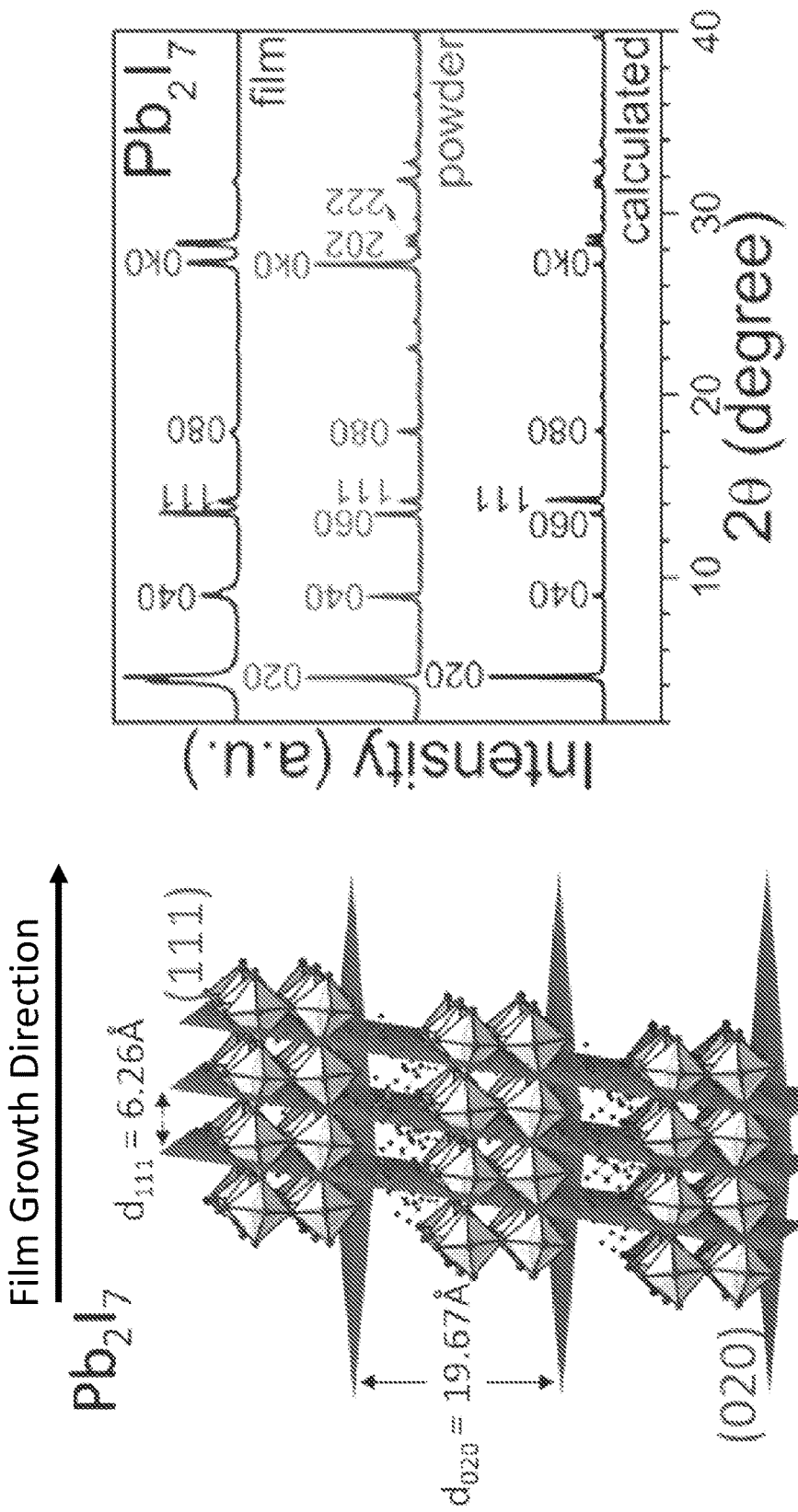
FIG. 2(A) depicts XRDs (right panel) of thin films vs. bulk materials of $(BA)_2(MA)Pb_2I_7$ perovskites, with an illustration of its diffraction planes (left panel).
Figure 2B:
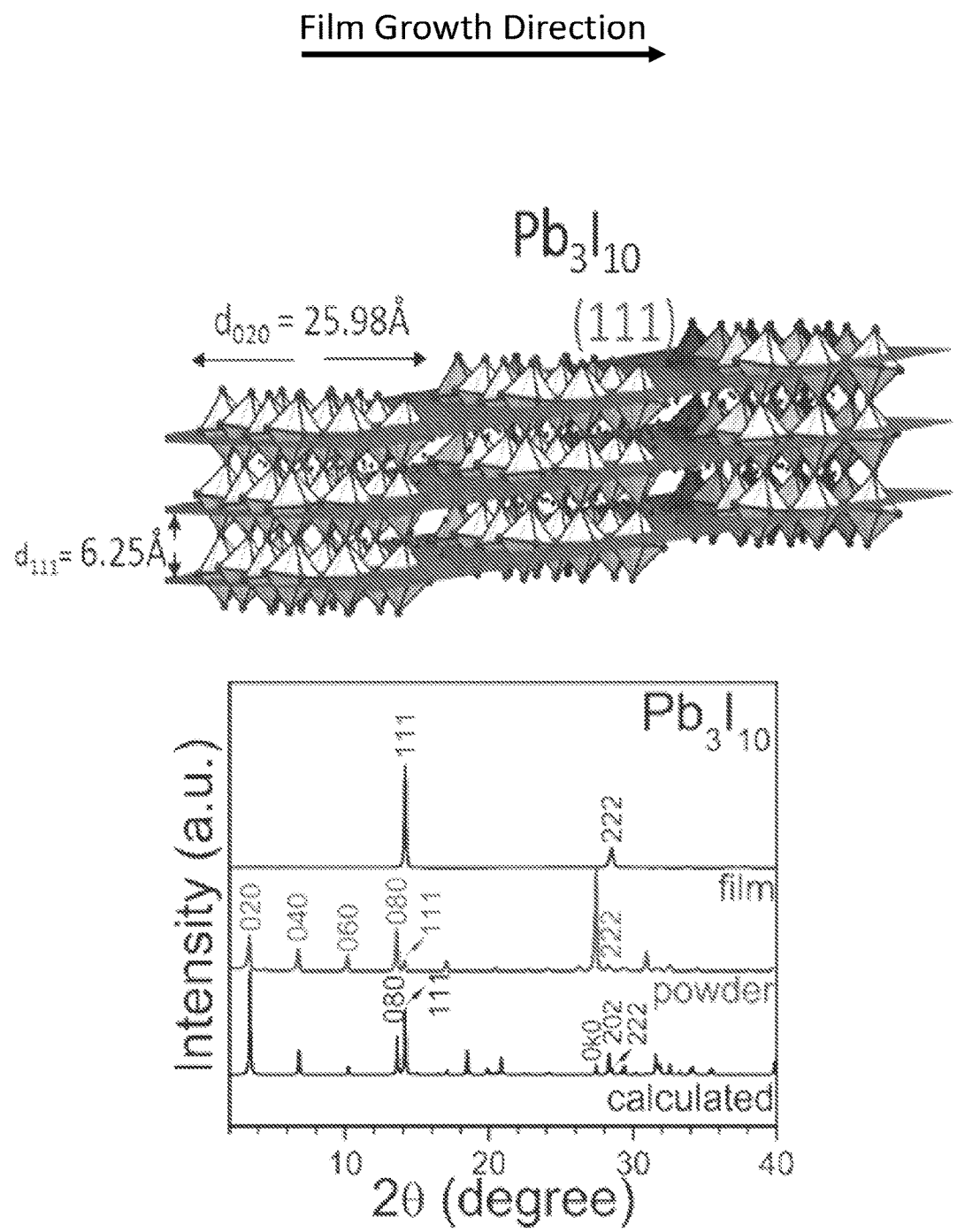
FIG. 2(B) depicts XRDs (bottom panel) of thin films vs. bulk materials of $(BA)_2(MA)_2Pb_3I_{10}$ perovskites, with an illustration of its diffraction planes (top panel).
Figure 2C:
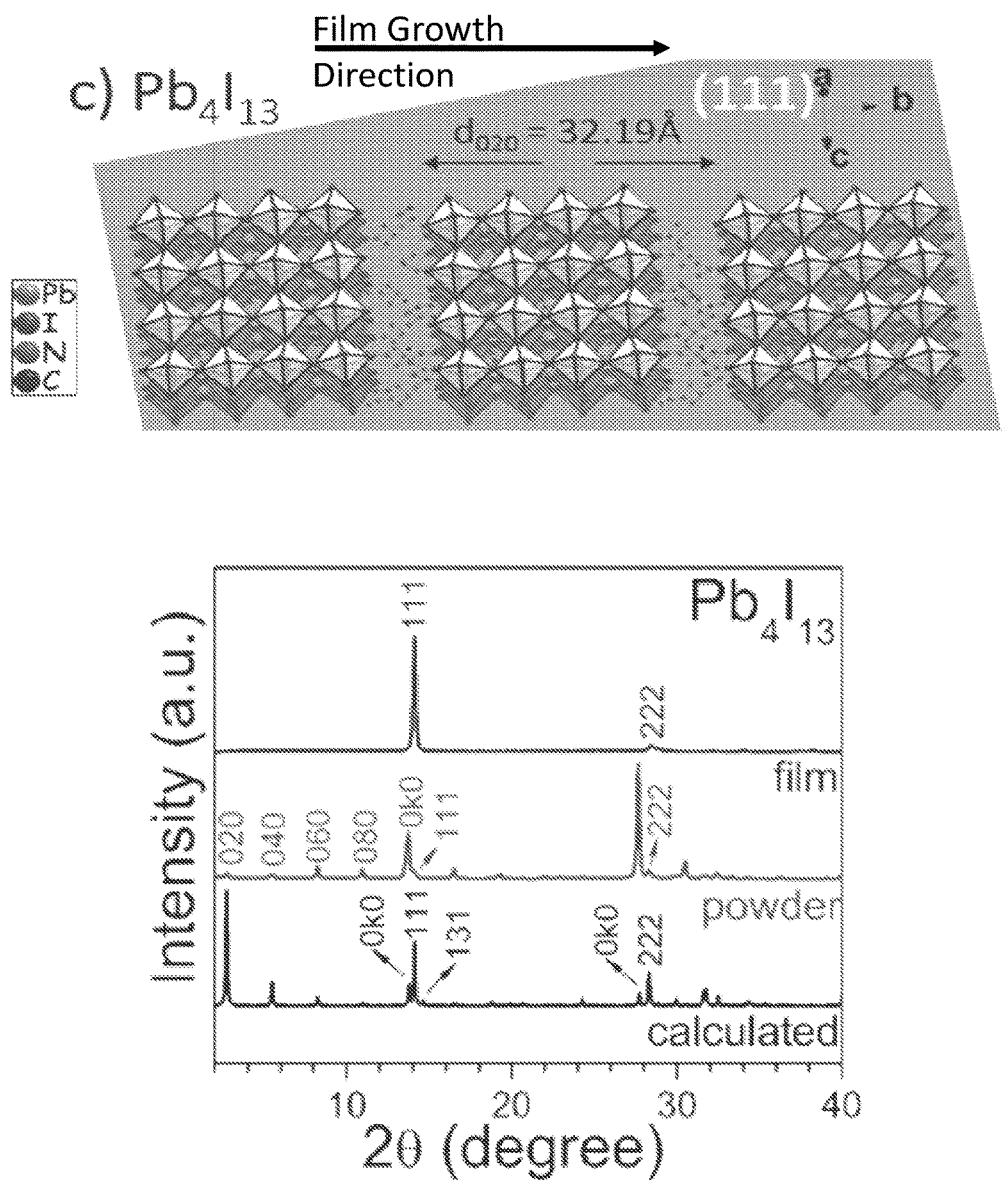
FIG. 2(C) depicts XRDs (bottom panel) of thin films vs. bulk materials of $(BA)_2(MA)_3Pb_4I_{13}$ perovskites, with an illustration of its diffraction planes (top panel). Note that the Miller indices are different from those of $(BA)_2PbI_4$ and $MAPbI_3$ because of the different assignment of the orthogonal unit cell axes.
Figure 3A:
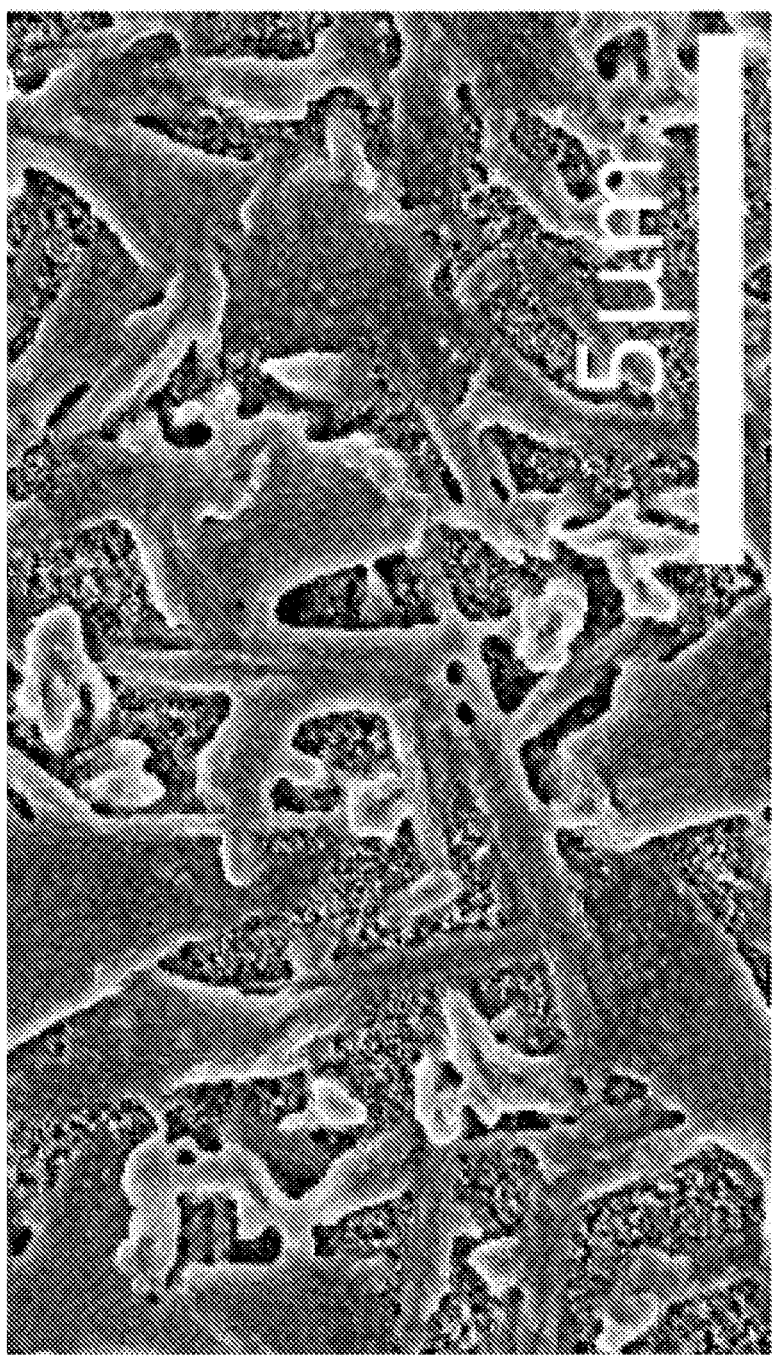
FIG. 3(A) depicts the top surface of $(BA)_2(MA)_2Pb_3I_{10}$ on a $TiO_2$ film.
Figure 3B:
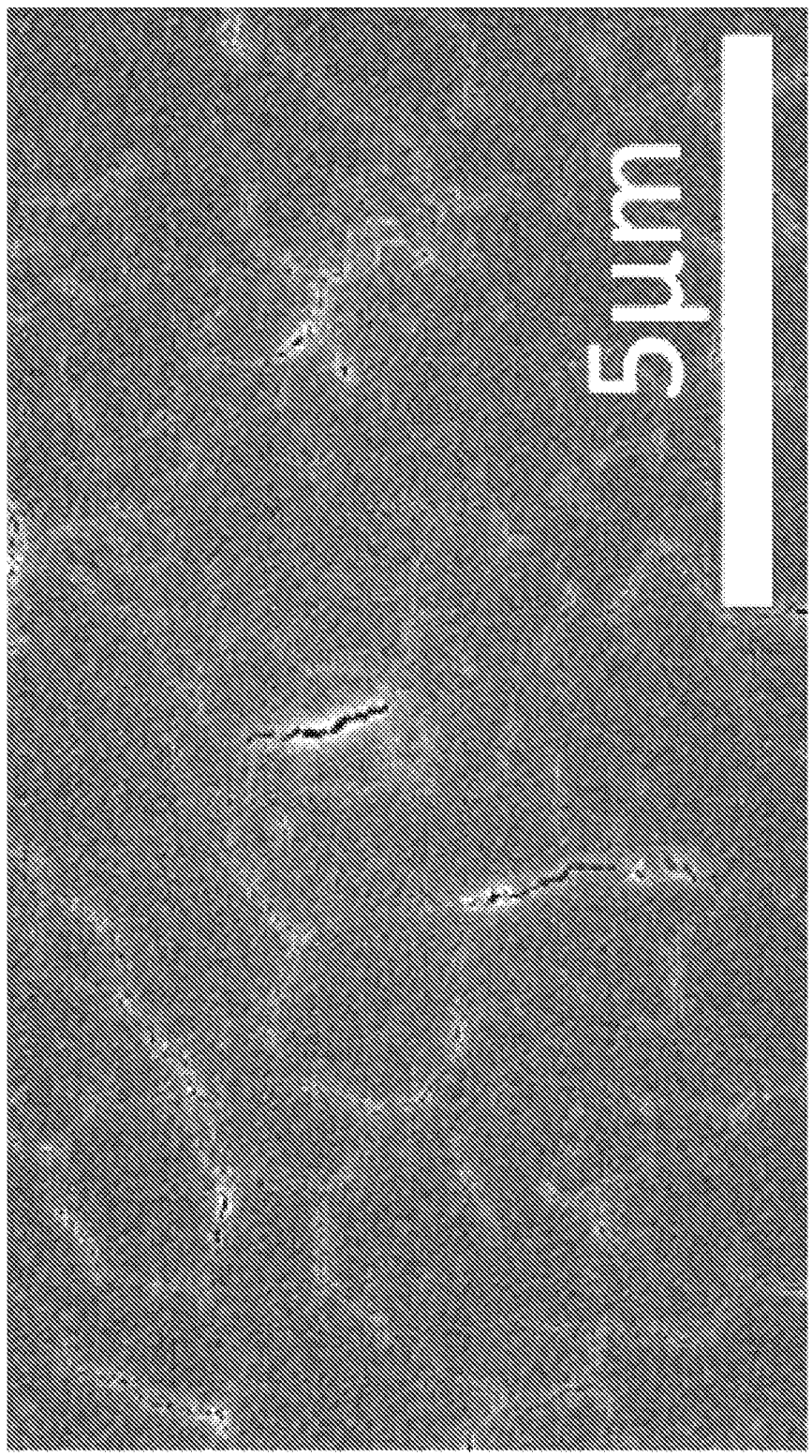
FIG. 3(B) depicts a cross-sectional view of the $(BA)_2(MA)_2Pb_3I_{10}$ on a $TiO_2$ film.

The extremely well-oriented $(BA)_2(MA)_{n-1}Pb_nI_{3n+1}$ perovskite films are already superior to MAPbI$_3$ films deposited by the crude one-step method, and their quality is already comparable to the best-oriented MAPbI$_3$ films obtained by means of the superior "mixed-halide" MAPbI$_{3-x}$Cl$_x$ method (FIG. 1(B)) (Lee, M. M.; Teuscher, J.; Miyasaka, T.; Murakami, T. N.; Snaith, H. J. Science 2012, 338, 643). The successful vertical crystal growth of the 2D perovskites on the substrate is further confirmed by the scanning electron microscopy (SEM) images, exemplified in the form of Pb$_3$I$_{10}$ films. FIGS. 3(A) and 3(B) show top view and cross-sectional view, respectively, SEM images of a $Pb_3I_{10}$ film with extremely well-packed vertically oriented crystallites displaying excellent surface coverage. Vertical growth is highly desirable in photovoltaic devices because it facilitates charge transport along the Pb—I—Pb pathway to the electron- and hole-accepting contacts. Additionally, the evolution of continuous crystallites with few crystal boundaries promises significant improvement in the carrier transport mobility.

Figure 4A:
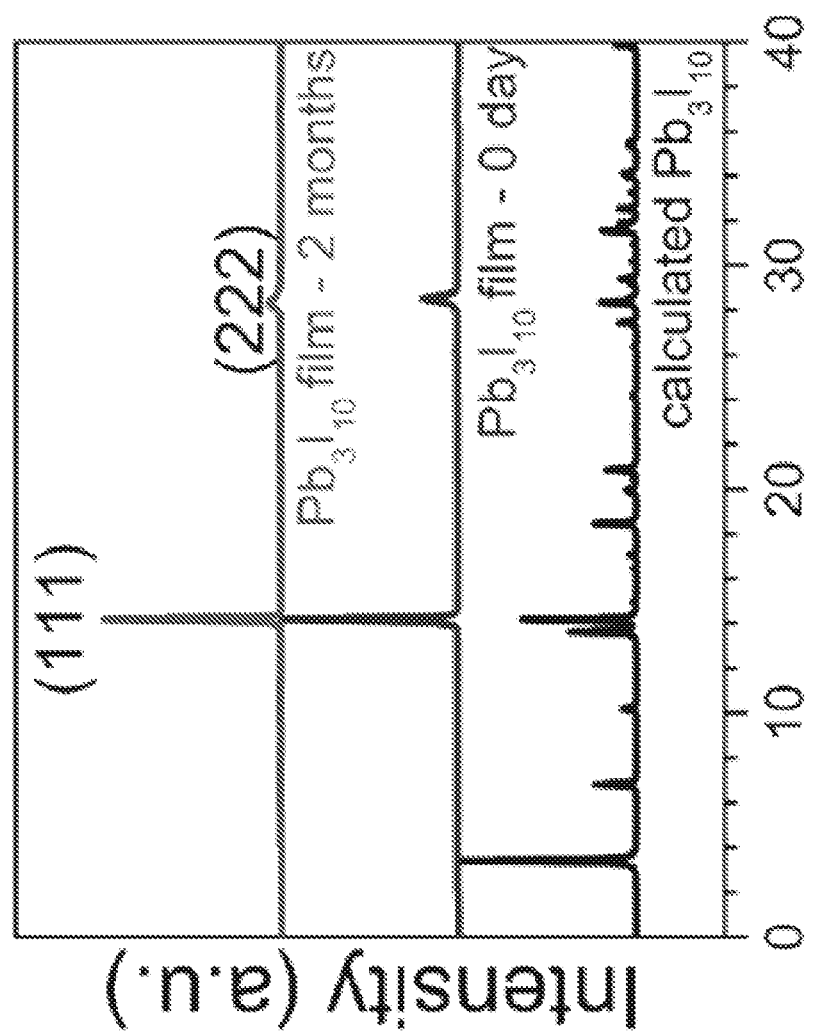
FIG. 4(A) depicts XRDs of fresh and aged (2 months) $(BA)_2(MA)_2Pb_3I_{10}$ films.
Figure 4B:
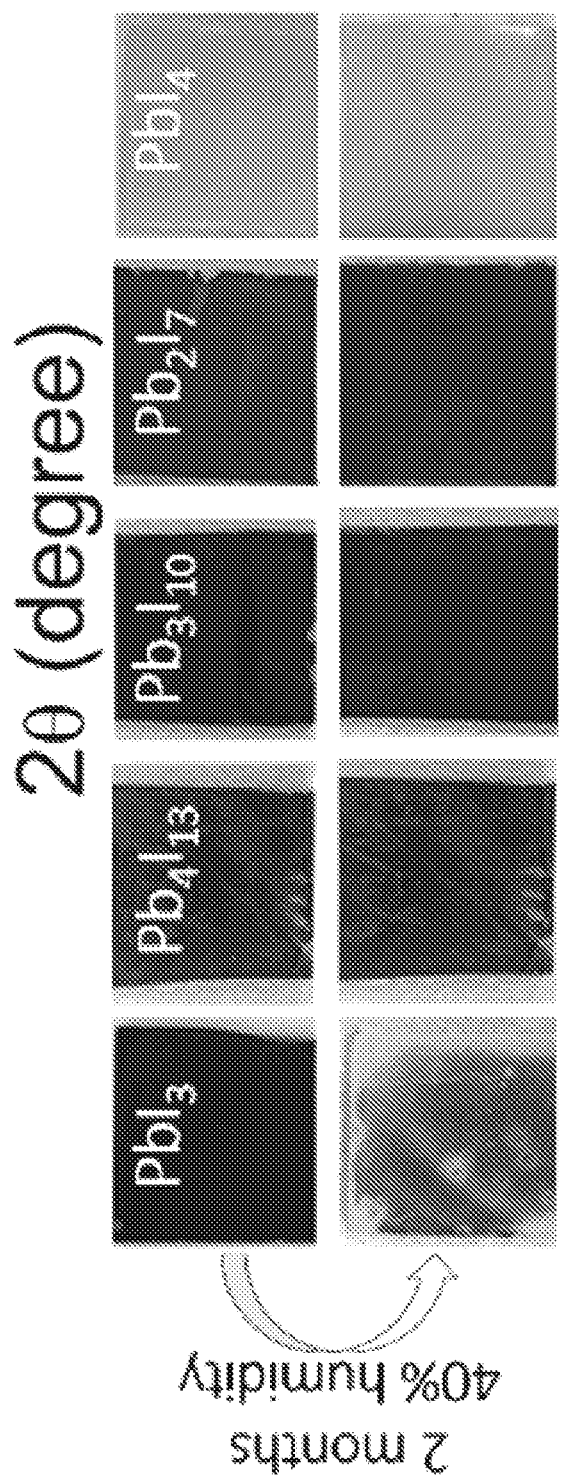
FIG. 4(B) shows images of five different perovskite films before and after exposure to humidity.

Another favorable property of the 2D perovskite films that also benefits their potential technological exploitation is their extremely high moisture stability. As an example, a film of $MAPbI_3$ gradually decomposed to yellow $PbI_2$ after a short time in moist atmosphere because of the gradual loss of the $MA^-$ cation (FIG. 4(B)). However, a film of $(BA)_2(MA)_2Pb_3I_{10}$ remained unchanged after 2 months exposure under a 40% humidity condition. The stability of the film was additionally confirmed by XRD (FIG. 4(A)), in which no $PbI_2$ peak was observed in the 2 month old $(BA)_2(MA)_2Pb_3I_{10}$ film. The moisture-resistant property of the 2D perovskites may be attributed to the hydrophobicity of the long BA cation chain and the highly oriented and dense nature of the perovskite films, which prevent direct contact of adventitious water with the perovskite.

Figure 5A:
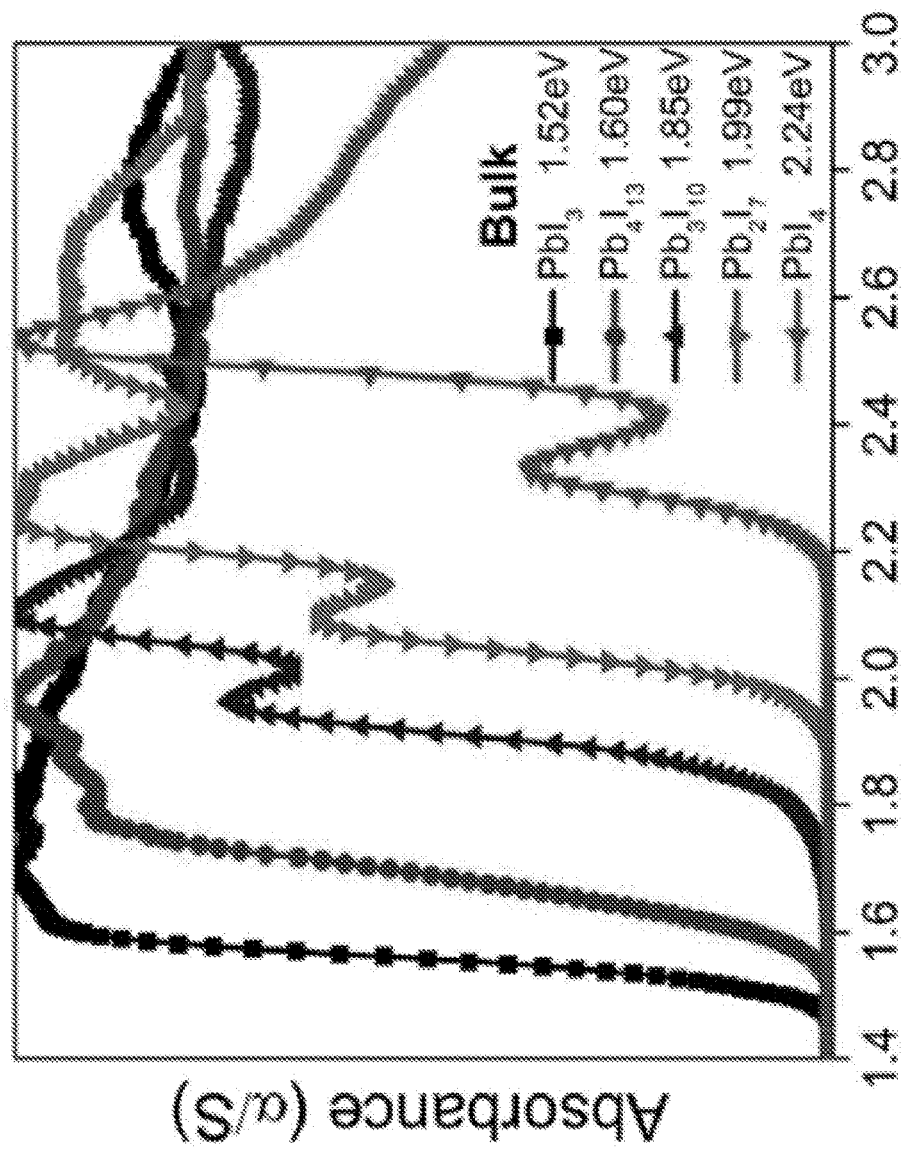
FIG. 5(A) depicts the absorbance spectra for bulk $MAPbI_3$ and $(BA)_2(MA)_{n-1}Pb_nI_{3n+1}$ compounds.
Figure 5B:
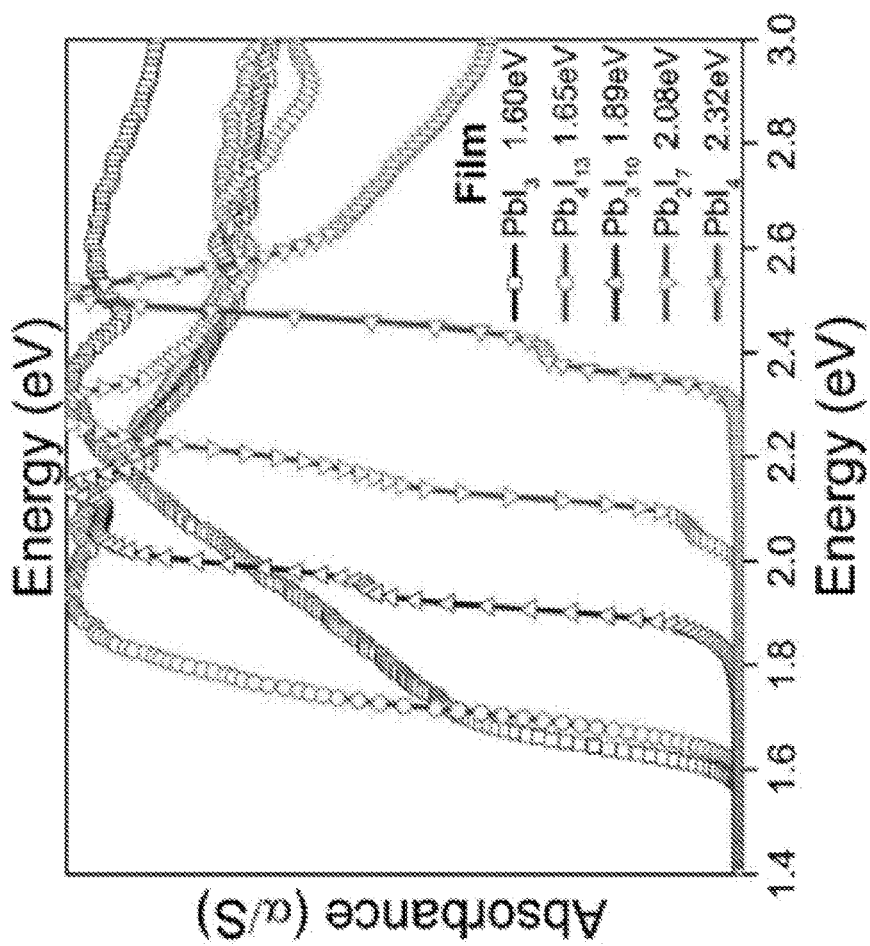
FIG. 5(B) depicts the absorbance spectra for spin-coated $TiO_2$-perovskite thin films of $MAPbI_3$ and $(BA)_2(MA)_{n-1}Pb_nI_{3n+1}$ compounds.

Optical Properties. For convenience, in the present and forthcoming sections, $MAPbI_3$ will be abbreviated as $PbI_3$, and the 2D series will be abbreviated as $Pb_4I_{13}$, $Pb_3I_{10}$, $Pb_2I_7$, and $PbI_4$ when n is equal to 4, 3, 2, and 1, respectively. Previously, in a work on two-step sequentially deposited films of $PbI_3$, it was observed that some unusually broad absorption edges lying between the band edges of $PbI_2$ (2.4 eV) and $PbI_3$ (1.5 eV) (Cao, D. H.; Stoumpos, C. C.; Malliakas, C. D.; Katz, M. J.; Farha, O. K.; Hupp, J. T.; Kanatzidis, M. G. APL Mater. 2014, 2, 091101). These absorption characteristics were thought to be due to incomplete conversion of $PbI_2$, leading to the formation of intermediate layered compounds that were stabilized by surface effects on the thin films. The optical properties of the series in both bulk and thin film samples were investigated. The optical band gaps ($E_g$) in the $(BA)_2(MA)_{n-1}Pb_nI_{3n+1}$ series increase with decreased thickness of the inorganic slabs from 1.52 eV (n=∞) to 2.24 eV (n=1) because of quantum confinement effects from the dimensional reduction of the perovskite chromophore. In addition to the primary absorption edge, another peak above the absorption edge region was observed appearing in the 2D perovskites. The intensity of the second peak is strongest for the n=1 compound and progressively subsides as the number of the inorganic slabs increases; it practically disappears for the n=4 compound (FIG. 5(A)). This secondary absorption is attributed to a long-lived excitonic state trapped in the strong electrostatic field generated by the localized positively charged BA ions around the negatively charged $(MA)_{n-1}Pb_nI_{3n+1}$ layers. This local electric field provides sufficient charge-screening that inhibits the long-range separation of the photogenerated electronhole pair, thus increasing its recombination probability. The excitonic binding energies of the layered perovskite series are thus expected to decrease with increasing n (from 1 to ∞). The same behavior is also observed in the absorption spectra of the spin-coated $TiO_2$-perovskite films of the compounds (FIG. 5(B)), thus further validating the successful deposition of the target compound onto the substrate. Interestingly, the absorption spectra of the pure compounds are in good agreement with those of the intermediate absorption spectra observed in the two-step deposited $MAPbI_3$, an observation that hints toward the possibility of the formation of layered-like intermediates during the formation of the 3D perovskite films that are stabilized by the $TiO_2$ surfaces.

Figure 5C:
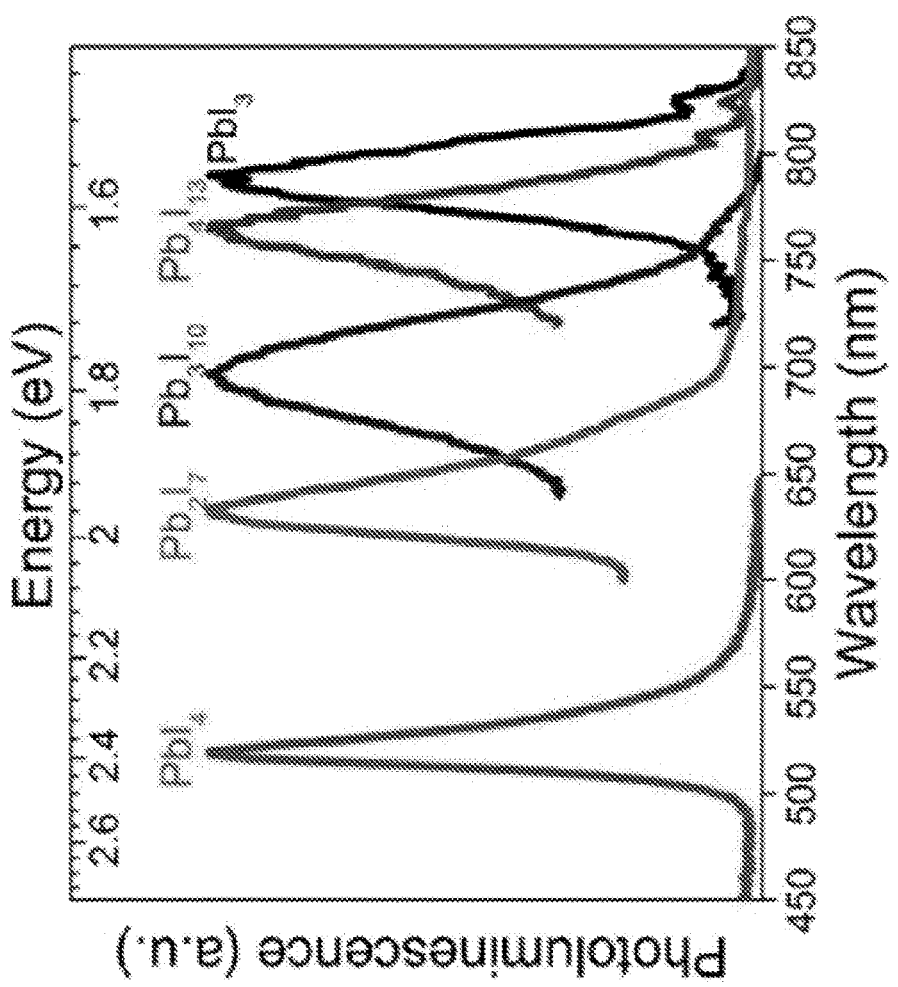
FIG. 5(C) depicts the photoluminescence (PL) spectra for spin-coated glass-perovskite thin films of $MAPbI_3$ and $(BA)_2(MA)_{n-1}Pb_nI_{3n+1}$ compounds.

As is well demonstrated, thin films of both the 2D $PbI_4$ and 3D $PbI_3$ compounds display PL at room temperature (RT). Confirmation of this property was sought by performing PL measurements on the $(BA)_2(MA)_{n-1}PbnI3n_{+1}$ homologous perovskite series on films deposited onto glass substrates. Indeed, it was observed that RT PL from all 2D perovskites as shown in FIG. 5(C). The PL spectra of all four 2D compounds and the 3D analogue have distinct features that are fully consistent with the experimentally determined optical band gaps. A very strong PL emission is observed for the n=1 compound; the emission wavelength corresponds to the high-energy absorption peak (bound exciton), and it lies above the ground state of the band gap. Interestingly, when additional slabs are introduced (increasing n), the PL emission energy shifts in each case according to the low-energy absorption peak (free exciton) and applies to the n=2, 3, and 4 compounds. The efficient external luminescence observed in the compounds is a highly desirable property for photovoltaic applications because it is an indirect indication of efficient carrier generation, thus granting access to the highest possible open-circuit voltage.

Device Fabrication and Photovoltaic Performance. As stated in the previous section, the properties of the $(BA)_2(MA)_{n-1}Pb_nI_{3n+1}$ perovskite films show unique film growth characteristics that offer tremendous potential for successful implementation in solar cells. Thus, photovoltaic devices were assembled and characterized. Initial attempts yielded a promising, high $V_{oc}$ from devices of the semiconducting 2D $Pb_3I_{10}$ compound. Hence, two different aspects were explored: (i) changing the device structure from planar ($TiO_2$ compact layer only) to sensitized (250-1100 nm mesoporous $TiO_2$) and (ii) changing the perovskite precursor concentration (0.9, 1.8, 2.7, and 3.6 M, based on the total $Pb^{2+}$ content). The side view of typical $TiO_2$-deposited 2D perovskite films prior to the HTM deposition step are shown in FIG. 6(A), FIG. 6(B), FIG. 6(C), FIG. 6(D) and FIG. 6(E).

Figure 7:
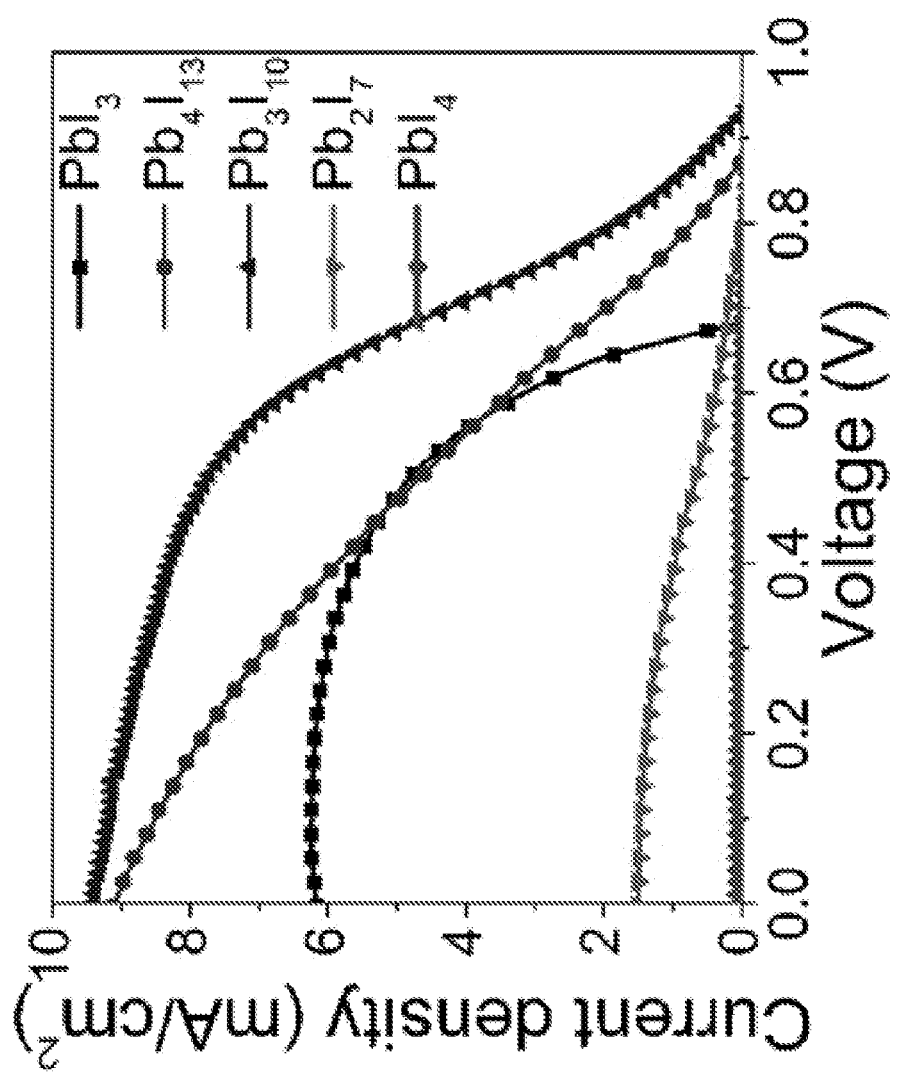
FIG. 7 depicts J-V curves for sensitized lead iodide perovskite-based solar cells.
Figure 16:
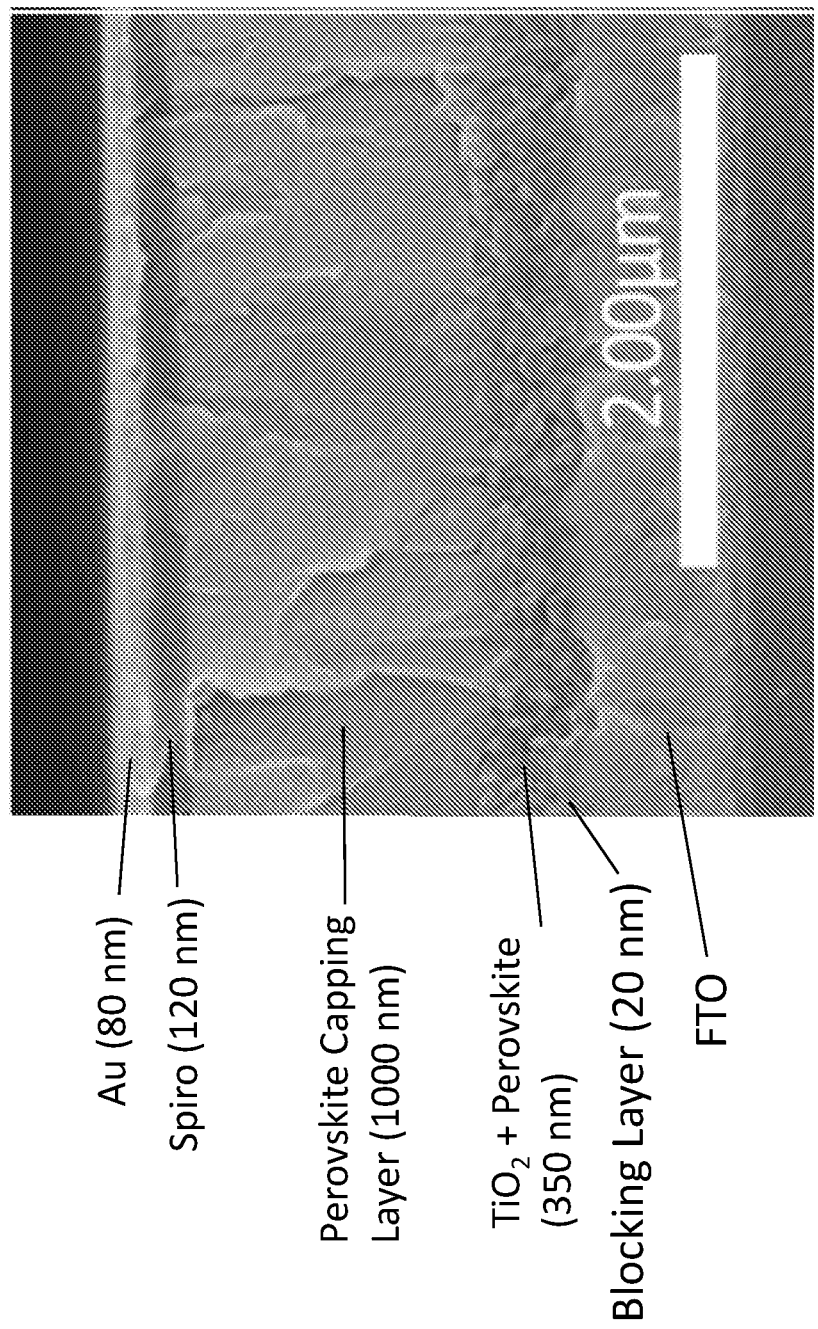
FIG. 16 shows a cross-sectional SEM image of a functional $(BA)_2(MA)_2Pb_3I_{10}$ device.

The champion first-generation≥2D device was obtained from the $Pb_3I_{10}$ light absorber in combination with a 350 nm $TiO_2$ mesoporous film and 1.8 M perovskite concentration. (See FIG. 16 for cross-sectional SEM image of a complete device.) Under AM 1.5G solar illumination, the photogenerated $V_{oc}$ was 929 mV, and $J_{sc}$ was 9.43 mA/cm$^2$, ultimately yielding a conversion efficiency η of 4.02% as shown in FIG. 7 and Table 2. The performance of the $PbI_3$ device, prepared under identical conditions, was lower than that of the current champion device (Zhou, H. P.; Chen, Q.; Li, G.; Luo, S.; Song, T. B.; Duan, H. S.; Hong, Z. R.; You, J. B.; Liu, Y. S.; Yang, Y. Science 2014, 345, 542). This difference was attributed mainly to the high concentration of $PbI_3$ precursor and the one-step deposition method. This method was intentionally used to keep the device fabrication process constant between the 3D and 2D materials in order to properly evaluate the resulting devices. These approaches for the fabrication of high-efficiency $PbI_3$ devices have been reported elsewhere (Cao, D. H.; Stoumpos, C. C.; Malliakas, C. D.; Katz, M. J.; Farha, O. K.; Hupp, J. T.; Kanatzidis, M. G. APL Mater. 2014, 2, 091101; Hao, F.; Stoumpos, C. C.; Liu, Z.; Chang, R. P.; Kanatzidis, M. G. J. Am. Chem. Soc. 2014, 136, 16411). The $J_{sc}$ obtained from $Pb_4I_{13}$ is similar to that of $Pb_3I_{10}$, but the $V_{oc}$ and the FF are significantly lower, resulting in a substantially lower conversion efficiency. With $Pb_4I_{13}$ having a lower Eg than $Pb_3I_{10}$, it was anticipated that the $Pb_4I_{13}$-based device would attain a higher $J_{sc}$. However, other factors may influence the overall device performance.

For instance, FIG. 6(A), FIG. 6(B), FIG. 6(C), FIG. 6(D) and FIG. 6(E) show a thinner $Pb_4I_{13}$ film formed compared to that formed by $Pb_3I_{10}$, even though films were prepared from the same concentration of precursor solution (1.8 M $Pb^{2+}$). One possible explanation for this is that the smaller amount of light-absorbing material absorbs less light and generates less photocurrent, yielding a lower $J_{sc}$. The other two compounds of the 2D series, $Pb_2I_7$ and $PbI_4$, produce significantly less current than those of the higher 2D members with thicker inorganic slabs, plausibly because of their much higher optical band gaps and their less favorable film growth characteristics for charge transport. Specifically, $Pb_2I_7$ film grows in both (0k0) and (111) orientations, and $PbI_4$ film grows parallel to its substrate, along the (00k) plane.

TABLE 2

Photovoltaic Performances of Sensitized
Lead Iodide Perovskite-Based Solar Cells

| Device | $J_{sc}$ (mA/cm$^2$) | $V_{oc}$ (mV) | FF (%) | Efficiency (%) |
|---|---|---|---|---|
| MAPbI$_3$ | 6.15 | 684 | 57 | 2.41 |
| (BA)$_2$(MA)$_3$Pb$_4$I$_{13}$ | 9.09 | 872 | 30 | 2.39 |
| (BA)$_2$(MA)$_2$Pb$_3$I$_{10}$ | 9.42 | 929 | 46 | 4.02 |
| (BA)$_2$(MA)Pb$_2$I$_7$ | 1.50 | 800 | 33 | 0.39 |
| (BA)$_2$PbI$_4$ | 0.06 | 580 | 29 | 0.01 |

Figure 8:
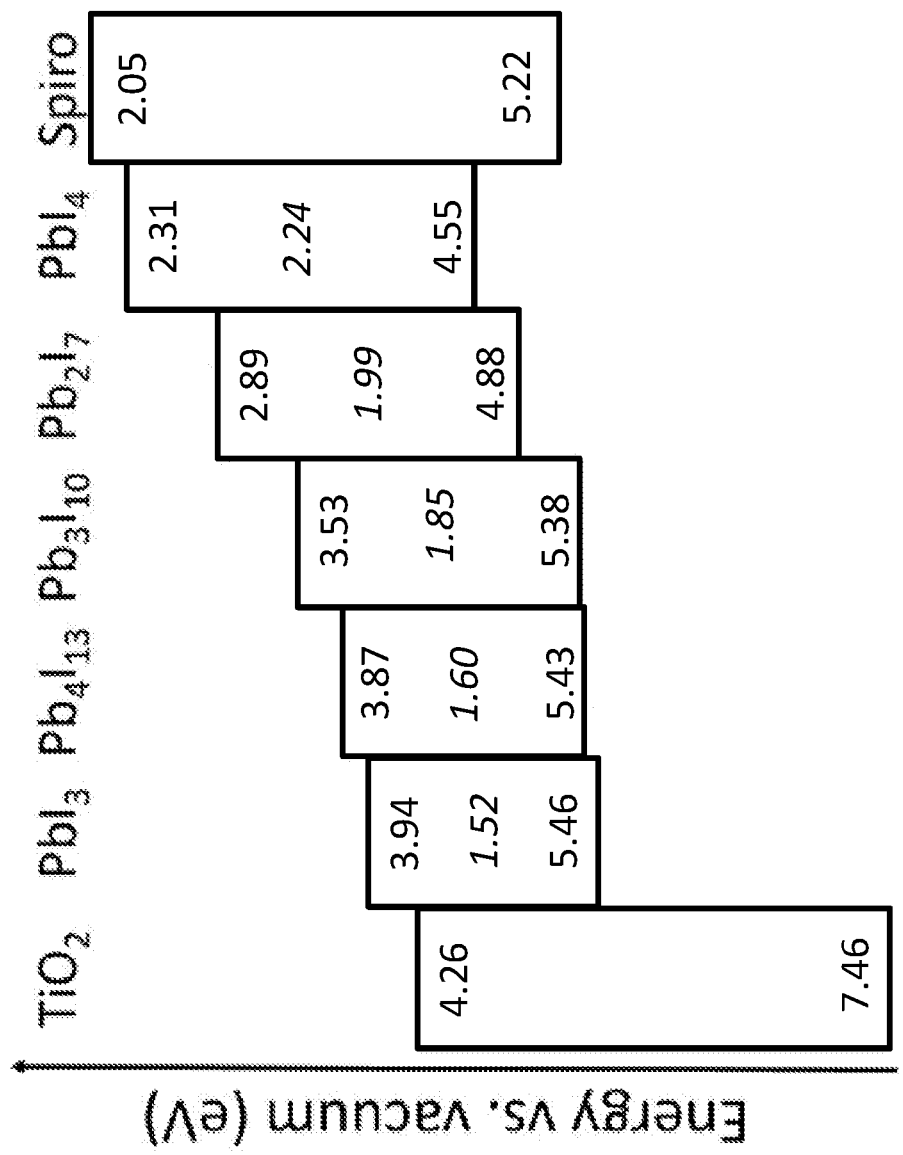
FIG. 8 depicts a comparative band energy diagram of the $(BA)_2(MA)_{n-1}Pb_nI_{3n+1}$ perovskite compounds.

To gain better insight into the charge transport dynamics in the 2D perovskite devices, the position of the valence band maxima (VBM) of all five $(BA)_2(MA)_{n-1}Pb_nI_{3n-1}$ perovskite compounds was determined, via ultraviolet photoelectron spectroscopy (UPS). The conduction band (CB) minima were determined by subtracting the VBM from the corresponding $E_g$. As can be seen in FIG. 8, the VBM increases with decreased dimensionality, from $PbI_3$ (5.46 eV) to $PbI_4$ (4.55 eV). The CB energy edges of all five perovskite compounds are higher than that of the $TiO_2$ electron acceptor, which theoretically would allow electron injection from the light absorbing materials to $TiO_2$ unless the charge recombination process happens at a faster rate. Although it is favorable for holes generated from $PbI_3$, $Pb_4I_{13}$, and $Pb_3I_{10}$ to hop into the spiro-OMeTAD hole-transporter, this step is inhibited with $Pb_2I_7$ and $PbI_4$ because their VBM energy levels are higher than the HOMO level of spiro-OMeTAD. Therefore, the probability of the photo-generated electrons and holes recombining is higher in $Pb_2I_7$ and $PbI_4$, which essentially lowers their photocurrent densities.

The routine observation of $V_{oc}$ in excess of 900 mV from cells based on the semi-2D $Pb_3I_{10}$ compound (~200 mV higher than those based on $PbI_3$) seems particularly promising and could bode well for incorporation of the material in more complex structures, e.g., the top cell in a tandem solar cell. For $PbI_3$-based solar cells, it has been shown that photogenerated excitons dissociate into free charges within the perovskite, regardless of whether electron- and/or hole-accepting layers are present. The observed $V_{oc}$ of the $Pb_3I_{10}$-based device is in line with what might be anticipated from the HTM HOMO and the $TiO_2$ CB edge energy, but it is only half that of the $Pb_3I_{10}$ bandgap. Replacement of the electron- and hole-accepting materials with ones much better matched to the $Pb_3I_{10}$ (or $Pb_4I_{13}$) VB and CB edge energies may yield substantially higher open-circuit photovoltages without undue penalties for short-circuit photocurrents.

Figure 9:
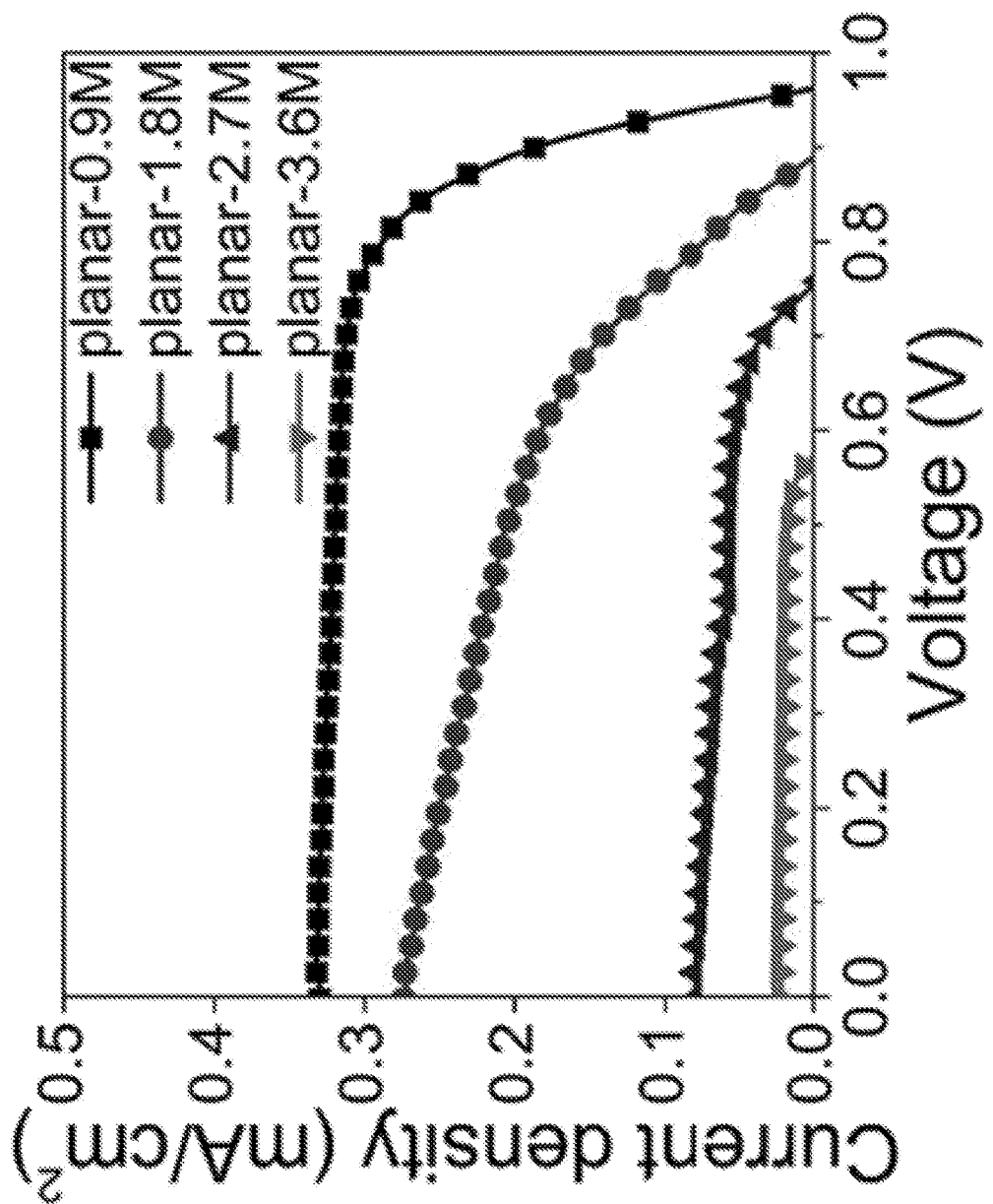
FIG. 9 depicts J-V curves for planar $(BA)_2(MA)_2Pb_3I_{10}$-based devices.

With $Pb_3I_{10}$ demonstrating the best conversion efficiency, the photoresponses of this compound were further investigated. In particular, the performances of cells containing planar versus nanoparticulate electron-accepting layers device structures were investigated (for simplicity, the latter are referred to as sensitized devices). Planar devices were prepared with increasing thicknesses of the perovskite light-absorber layer by means of increasing the precursor concentration from 0.9 to 3.6 M of $Pb^{2+}$. As can be seen in FIG. 9, the $J_{sc}$ of planar devices are very low despite the presence of a thick perovskite layer (~600 nm for 1.8 M). In addition, both $J_{sc}$ and $V_{oc}$ gradually decrease when the light-absorber layer gets thicker. This observation implies that the overwhelming majority of photogenerated electrons are unable to diffuse through the thick perovskite layer to reach the $TiO_2$ electron-acceptor interface. Conversely, when a mesoporous $TiO_2$ layer is introduced, $J_{sc}$ is tremendously enhanced. This is an indication that the charge (electron) diffusion length of $Pb_3I_{10}$ is likely shorter than that of $PbI_3$ because the planar device structure of $PbI_3$ has been successfully implemented elsewhere (Chen, Q.; Zhou, H. P.; Hong, Z. R.; Luo, S.; Duan, H. S.; Wang, H. H.; Liu, Y. S.; Li, G.; Yang, Y. J. Am. Chem. Soc. 2014, 136, 622). Nonetheless, the planar device structure offers significantly better FF, suggesting that the semiconducting 2D $Pb_3I_{10}$ material itself possesses high carrier mobility. It is noticeable that the fill factor (FF) of 2D sensitized-devices is somewhat lower than those of 2D planar and 3D devices. This low FF value is an indication of high series resistance ($R_s$), which can be attributed to the suboptimal crystallinity of perovskites inside the mesoporous $TiO_2$ layer and the charge-transport resistance at the interface of mesoporous $TiO_2$ and perovskite. Predictably, the low FF can be overcome by replacing the current charge-selective contacts with the more compatible candidates.

It is remarkable that the sensitized device structure of $Pb_3I_{10}$ functions well despite having a thick (~1000 nm) perovskite capping layer on top of the $TiO_2$ mesoporous layer. It is certain that the light absorber infiltrated in the mesoporous $TiO_2$ contributes majorly to the converted $J_{sc}$. However, most of the photogenerated electrons in the perovskite capping layer likely recombine before reaching the $TiO_2$ layer, as suggested by the fact that the planar device structure offers a very low $J_{sc}$. Therefore, photogenerated holes must be capable of diffusing through the thick perovskite capping layer to reach the selective HTM spiro-OMeTAD because the device is still functional. In this regard, the preferential growth of $Pb_3I_{10}$ layers perpendicular to the substrate is likely beneficial for efficient hole diffusion.

Figure 10A:
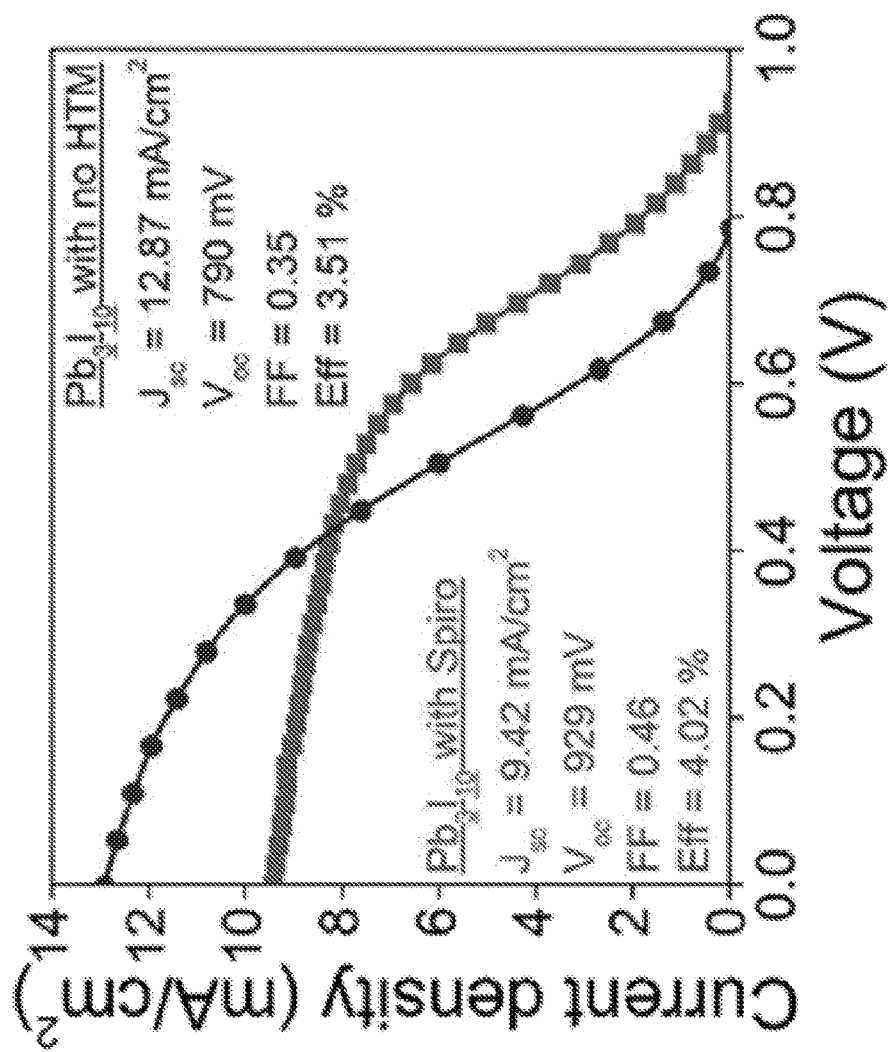
FIG. 10(A) depicts the photovoltaic responses of sensitized $(BA)_2(MA)_2Pb_3I_{10}$-based devices, with and without a hole transporter.

Having established that $Pb_3I_{10}$ requires the mesoporous $TiO_2$ electron-carrier contact to produce high $J_{sc}$, the photovoltage responses of devices with and without HTM were studied to see if the hole-carrier contact is beneficial for device performance. As shown in FIG. 10(A), $V_{oc}$ decreases by 130 mV when spiro-OMeTAD is eliminated. Such a voltage loss value is about the mismatch between the energy levels of Au and spiro-OMeTAD. Strikingly, the $J_{sc}$ of the HTM-free device is about 3 mA/cm$^2$ higher compared to that of the HTM-present device. When HTM is absent, charge recombination processes between $TiO_2$ and HTM and/or perovskite and HTM are eliminated, increasing the survival time of the photogenerated electron population and yielding a higher $J_{sc}$.

Figure 10B:
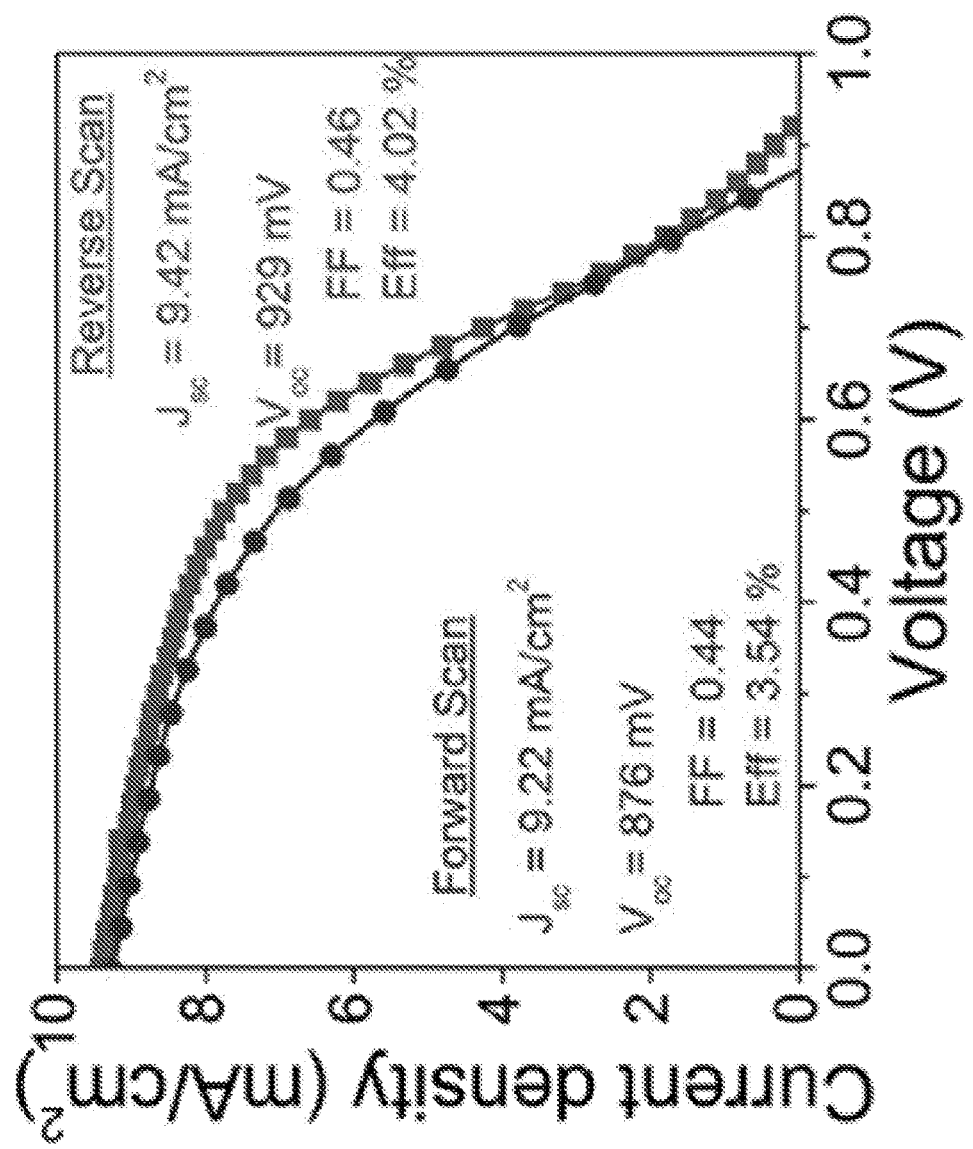
FIG. 10(B) depicts photovoltaic responses of sensitized $(BA)_2(MA)_2Pb_3I_{10}$-based devices under reverse and forward scan directions.

The anomalous hysteresis and ferroelectric behavior for $PbI_3$-based solar cells has been investigated. Briefly, when the bias is applied from short-circuit to open-circuit direction (forward scan), charge is trapped at the electron-acceptor interface as capacitive current and cannot be fully discharged to the external circuit, showing an underestimated $J_{sc}$. Conversely, if the bias is applied from open-circuit to short-circuit (reverse scan), then the capacitive charge accumulated will be discharged to the external circuit in combination with photogenerated current, showing the real $J_{sc}$. This ferroelectric property of perovskites can lead to greater than band gap photovoltages as has been demonstrated in multiferroic oxide solar cells. Herein, hysteresis was also observed to a small degree in sensitized $Pb_3I_{10}$ device, which results in a small drop in FF and $V_{oc}$ (FIG. 10(B)).

Concluding Remarks

The facile fabrication of the 2D $(BA)_2(MA)_{n-1}Pb_nI_{3n+1}$ (n=4, 3, 2, 1) perovskite thin films along with the detailed characterization of their film growth behaviors, optical, and electronic properties have been demonstrated. The n=1 and 2 members of the 2D perovskite family display strong photoluminescence at room temperature, pointing to their potential for use in light-emitting diodes. Films of 2D compounds are formed in a self-assembly fashion with preferentially oriented growth perpendicular to the substrate, favoring charge transport and providing essential access to ultra smooth and high-surface-coverage thin films. An additional benefit of using large organic cations in the 2D films is moisture resistance that is greatly enhanced compared to that of their 3D $MAPbI_3$ analogue, making them more attractive for large-scale industrial implementation. The best first-generation≥2D device was obtained from the semi-2D $(BA)_2(MA)_2Pb_3I_{10}$ light absorber under the sensitized device structure, which yields a solar-to-electricity conversion efficiency of 4.02%.

Example 2

In this example, a method of making a series of $BA_2MA_{n-1}M_nX_{3n+1}$ 2D Perovskites (12>n≥1, M=Ge, Sn, Pb and X=I, Br, Cl, F) is reported.

$(BA)_2(MA)_3Sn_5I_{16}$ (n=5). $SnCl_2 \cdot 2H_2O$ powder (1130 mg, 5 mmol) was dissolved in a mixture of 57% w/w aqueous HI solution (5.0 mL, 38 mmol) and 50% aqueous $H_3PO_2$ (1.7 mL, 15.5 mmol), by heating to boiling under constant magnetic stirring for about 5 min., forming a bright yellow solution. Subsequent addition of solid $CH_3NH_3I$ (636 mg, 4 mmol) to the hot yellow solution initially caused the precipitation of a black powder which rapidly redissolved under stirring to afford a clear bright yellow solution. n-$CH_3(CH_2)_3NH_2$ (100 μL, 1 mmol) was then added drop-wise under vigorous stirring over a period of 1 min. without any changes in the solution. The stirring was then discontinued, and the solution was left to cool to room temperature during which time black rectangular-shaped plates started to crystallize. The precipitation was deemed to be complete after ~2 hours. The crystals were isolated by suction filtration and thoroughly dried under reduced pressure.

$(BA)_2(MA)_3Pb_4I_{13}$ (n=4). PbO powder (893 mg, 4 mmol) was dissolved in a mixture of 57% w/w aqueous HI solution (5.0 mL, 38 mmol) and 50% aqueous $H_3PO_2$ (1.7 mL, 15.5 mmol), by heating to boiling under constant magnetic stirring for about 5 min., forming a bright yellow solution. Subsequent addition of solid $CH_3NH_3I$ (477 mg, 3 mmol) to the hot yellow solution initially caused the precipitation of a black powder which rapidly redissolved under stirring to afford a clear bright yellow solution. n-$CH_3(CH_2)_3NH_2$ (100 μL, 1 mmol) was then added drop-wise under vigorous stirring over a period of 1 min. without any changes in the solution. The stirring was then discontinued, and the solution was left to cool to room temperature during which time black rectangular-shaped plates started to crystallize. The precipitation was deemed to be complete after ~2 hours. The crystals were isolated by suction filtration and thoroughly dried under reduced pressure.

$(BA)_2(MA)_2Pb_3I_{10}$ (n=3). PbO powder (670 mg, 3 mmol) was dissolved in a mixture of 57% w/w aqueous HI solution (5.0 mL, 38 mmol) and 50% aqueous $H_3PO_2$ (1.7 mL, 15.5 mmol), by heating to boiling under constant magnetic stirring for about 5 min., forming a bright yellow solution. Subsequent addition of solid $CH_3NH_3I$ (318 mg, 2 mmol) to the hot yellow solution initially caused the precipitation of a black powder which rapidly redissolved under stirring to afford a clear bright yellow solution. n-$CH_3(CH_2)_3NH_2$ (100 μL, 1 mmol) was then added drop-wise under vigorous stirring over a period of 1 min. without any changes in the solution. The stirring was then discontinued, and the solution was left to cool to room temperature during which time deep-red rectangular-shaped plates started to crystallize. The precipitation was deemed to be complete after ~2 hours. The crystals were isolated by suction filtration and thoroughly dried under reduced pressure.

$(BA)_2(MA)Ge_2I_7$ (n=2). $GeO_2$ powder (209 mg, 2 mmol) was dissolved in a mixture of 57% w/w aqueous HI solution (5.0 mL, 38 mmol) and 50% aqueous $H_3PO_2$ (3.4 mL, 31 mmol), by heating to boiling under constant magnetic stirring for about 5 min., forming a bright yellow solution. Subsequent addition of solid $CH_3NH_3I$ (159 mg, 1 mmol) to the hot yellow solution under stirring affords a clear bright yellow solution. n-$CH_3(CH_2)_3NH_2$ (200 μL, 2 mmol) was then added drop-wise under vigorous stirring over a period of 1 min. without any changes in the solution. The stirring was then discontinued, and the solution was left to cool to room temperature during which time red rectangular-shaped plates started to crystallize. The precipitation was deemed to be complete after ~2 hours. The crystals were isolated by suction filtration and thoroughly dried under reduced pressure.

Example 3

In this example, a method of making a series of $BA_2FA_{n-1}M_nX_{3n+1}$ 2D Perovskites (12>n≥2, M=Ge, Sn, Pb and X=I, Br, Cl, F) is reported.

$(BA)_2(FA)Pb_2I_7$ (n=2). PbO powder (447 mg, 2 mmol) was dissolved in a mixture of 57% w/w aqueous HI solution (5.0 mL, 38 mmol) and 50% aqueous $H_3PO_2$ (1.7 mL, 31 mmol), by heating to boiling under constant magnetic stirring for about 5 min., forming a bright yellow solution. Subsequent addition of solid $HC(NH_2)_2Cl$ (80 mg, 1 mmol) to the hot yellow solution under stirring affords a clear bright yellow solution. n-$CH_3(CH_2)_3NH_2$ (200 μL, 2 mmol) was then added drop-wise under vigorous stirring over a period of 1 min. without any changes in the solution. The stirring was then discontinued, and the solution was left to cool to room temperature during which time red rectangular-shaped plates started to crystallize. The precipitation was deemed to be complete after ~2 hours. The crystals were isolated by suction filtration and thoroughly dried under reduced pressure.

Example 4

In this example, a method of making a series of $BA_2Cs_{n-1}M_nX_{3n+1}$ 2D Perovskites ((12>n≥2, M=Ge, Sn, Pb and X=I, Br, Cl, F) (prophetic) is reported.

(BA)$_2$(Cs)Sn$_2$I$_7$ (n=2). SnCl$_2$·2H$_2$O powder (451 mg, 2 mmol) is dissolved in a mixture of 57% w/w aqueous HI solution (5.0 mL, 38 mmol) and 50% aqueous H$_3$PO$_2$ (1.7 mL, 31 mmol), by heating to boiling under constant magnetic stirring for about 5 min., forming a bright yellow solution. Subsequent addition of solid CsI (260 mg, 1 mmol) to the hot yellow solution under stirring affords a clear bright yellow solution. n-CH$_3$(CH$_2$)$_3$NH$_2$ (200 µL, 2 mmol) is then added drop-wise under vigorous stirring over a period of 1 min. without any changes in the solution. The stirring is then discontinued, and the solution is left to cool to room temperature during which time red rectangular-shaped plates start to crystallize. The precipitation is deemed to be complete after ~2 hours. The crystals are isolated by suction filtration and thoroughly dried under reduced pressure.

Example 5

In this example, a method of making a series of (EA)$_2$MA$_{n-1}$M$_n$X$_{3n+1}$ 2D Perovskites (12>n≥1, M=Ge, Sn, Pb and X=I, Br, Cl, F) is reported.

(BP)$_2$(MA)$_2$Pb$_3$I$_{10}$ (n=3). PbO powder (670 mg, 3 mmol) was dissolved in a mixture of 57% w/w aqueous HI solution (5.0 mL, 38 mmol) and 50% aqueous H$_3$PO$_2$ (1.7 mL, 15.5 mmol), by heating to boiling under constant magnetic stirring for about 5 min., forming a bright yellow solution. Subsequent addition of solid CH$_3$NH$_3$I (318 mg, 2 mmol) to the hot yellow solution initially caused the precipitation of a black powder which rapidly redissolved under stirring to afford a clear bright yellow solution. Solid biphenyl ethylamine, C$_{14}$H$_{13}$NH$_3$, (198 mg, 1 mmol) was then added under vigorous stirring forming an red precipitate which was redissolved by addition of 5 mL of absolute EtOH resulting in a bright yellow solution. The stirring was then discontinued, and the solution was left to cool to room temperature during which time deep-red, almost black, rectangular-shaped plates started to crystallize. The precipitation was deemed to be complete after ~2 hours. The crystals were isolated by suction filtration and thoroughly dried under reduced pressure.

Example 6

In this example, a method of making a series of (ED)$_2$MA$_{n-1}$M$_n$X$_{3n+1}$ 2D Perovskites ((12>n≥2, M=Ge, Sn, Pb, X=I, Br, Cl, F and ED is an electron donor spacer) is reported.

(ThEA)$_2$(MA)Pb$_2$I$_7$ (n=2). PbO powder (447 mg, 2 mmol) was dissolved in a mixture of 57% w/w aqueous HI solution (5.0 mL, 38 mmol) and 50% aqueous H$_3$PO$_2$ (1.7 mL, 31 mmol), by heating to boiling under constant magnetic stirring for about 5 min., forming a bright yellow solution. Subsequent addition of solid CH$_3$NH$_3$I (159 mg, 1 mmol) to the hot yellow solution under stirring affords a clear bright yellow solution. Liquid C$_4$H$_4$S(CH$_2$)$_2$NH$_2$ (117 µL, 1 mmol) was then added drop-wise under vigorous stirring over a period of 1 min. leading to the formation of a red precipitate. Subsequent addition of 5 ml of absolute EtOH leads to the formation of a clear yellow solution. The stirring was then discontinued, and the solution was left to cool to room temperature during which time red rectangular-shaped plates started to crystallize. The precipitation was deemed to be complete after ~2 hours. The crystals were isolated by suction filtration and thoroughly dried under reduced pressure.

Example 7

In this example, a method of making a series of (CT)$_2$MA$_{n-1}$M$_n$X$_{3n+1}$ 2D Perovskites ((12>n≥1, M=Ge, Sn, Pb, X=I, Br, Cl, F and CT is a charge-transfer spacer) is reported.

(His)$_2$(MA)$_0$SnI$_4$ (n=2). SnCl$_2$·2H$_2$O powder (225 mg, 1 mmol) was dissolved in a mixture of 57% w/w aqueous HI solution (5.0 mL, 38 mmol) and 50% aqueous H$_3$PO$_2$ (1.7 mL, 31 mmol), by heating to boiling under constant magnetic stirring for about 5 min, forming a bright yellow solution. Subsequent addition of solid C$_3$H$_5$N$_2$(CH$_2$)$_2$NH$_3$Cl$_2$ (368 mg, 2 mmol) he formation of a black precipitate. Subsequent addition of 5 ml of absolute EtOH leads to the formation of a clear yellow solution. The stirring was then discontinued, and the solution was left to cool to room temperature during which time black rectangular-shaped plates started to crystallize. The precipitation was deemed to be complete after ~2 hours. The crystals were isolated by suction filtration and thoroughly dried under reduced pressure.

Example 8

Method of making a series of (4S)MA$_n$M$_n$X$_{3n+1}$ 2D Perovskites ((∞>n≥1, M=Ge, Sn, Pb, X=I, Br, Cl, F and 4S is a 4-atom spacer).

(GA)(MA)$_2$Pb$_2$I$_7$ (n=2). PbO powder (447 mg, 2 mmol) was dissolved in a mixture of 57% w/w aqueous HI solution (5.0 mL, 38 mmol) and 50% aqueous H$_3$PO$_2$ (1.7 mL, 31 mmol), by heating to boiling under constant magnetic stirring for about 5 minutes, forming a bright yellow solution. Subsequent addition of solid CH$_3$NH$_3$I (159 mg, 1 mmol) and solid {C(NH$_2$)$_3$}$_2$CO$_3$ (121 mg, 1 mmol) to the hot yellow solution under stirring affords a clear bright yellow solution. The stirring was then discontinued, and the solution was left to cool to room temperature during which time red rectangular-shaped plates started to crystallize. The precipitation was deemed to be complete after ~2 hours. The crystals were isolated by suction filtration and thoroughly dried under reduced pressure.

Figure 19:
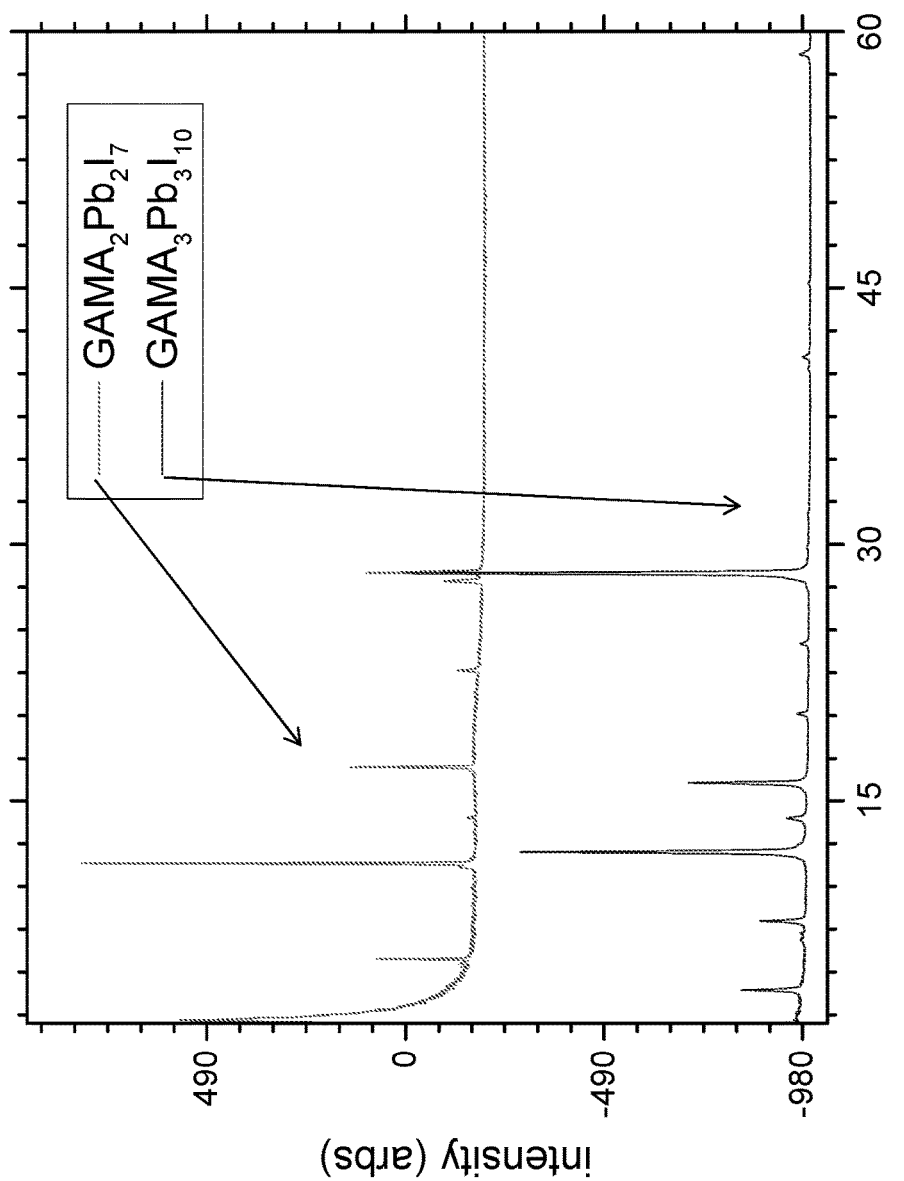
FIG. 19 shows The XRD spectra for $(GA)(MA)_3Pb_3I_{10}$ and $(GA)(MA)_2Pb_2I_7$.
Figure 20:
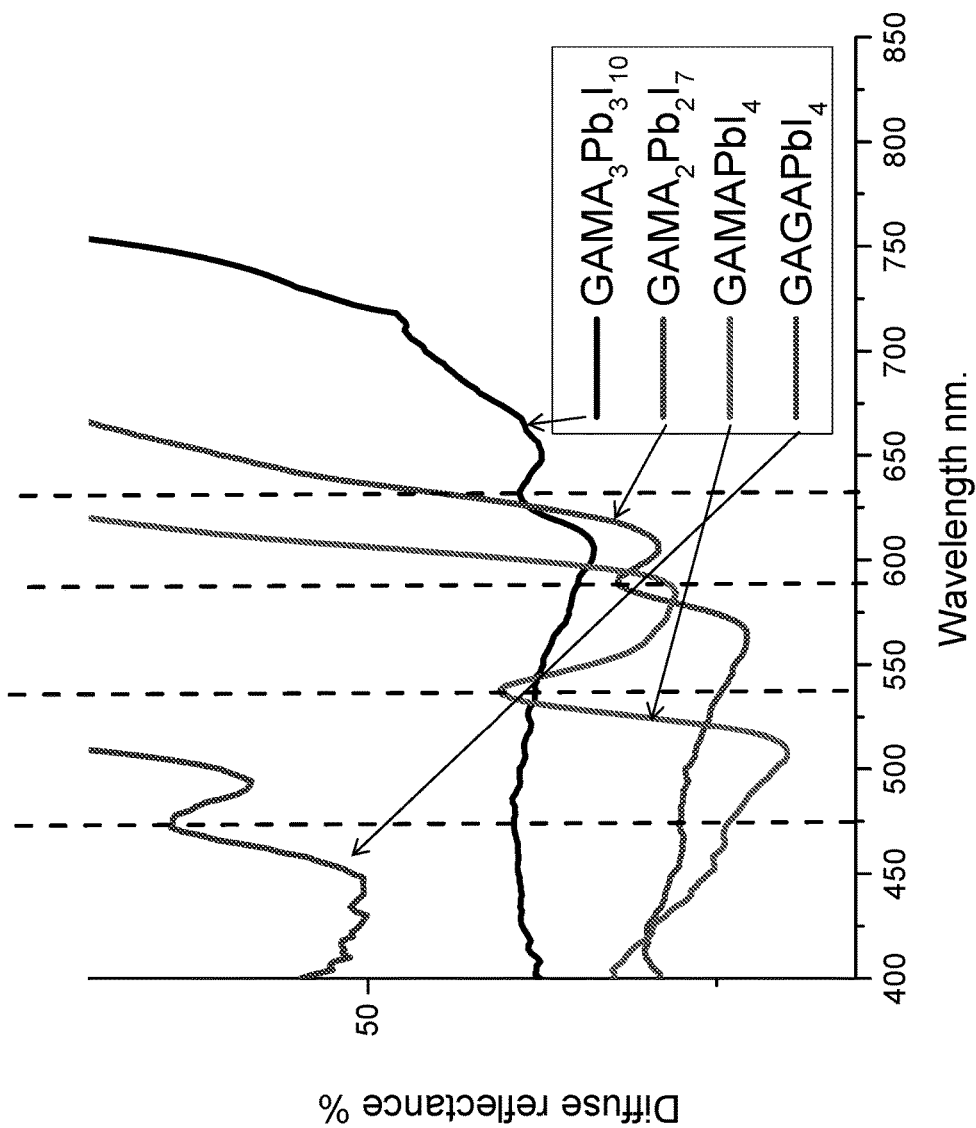
FIG. 20 shows the diffuse reflectance spectra for four perovskites.
Figure 21:
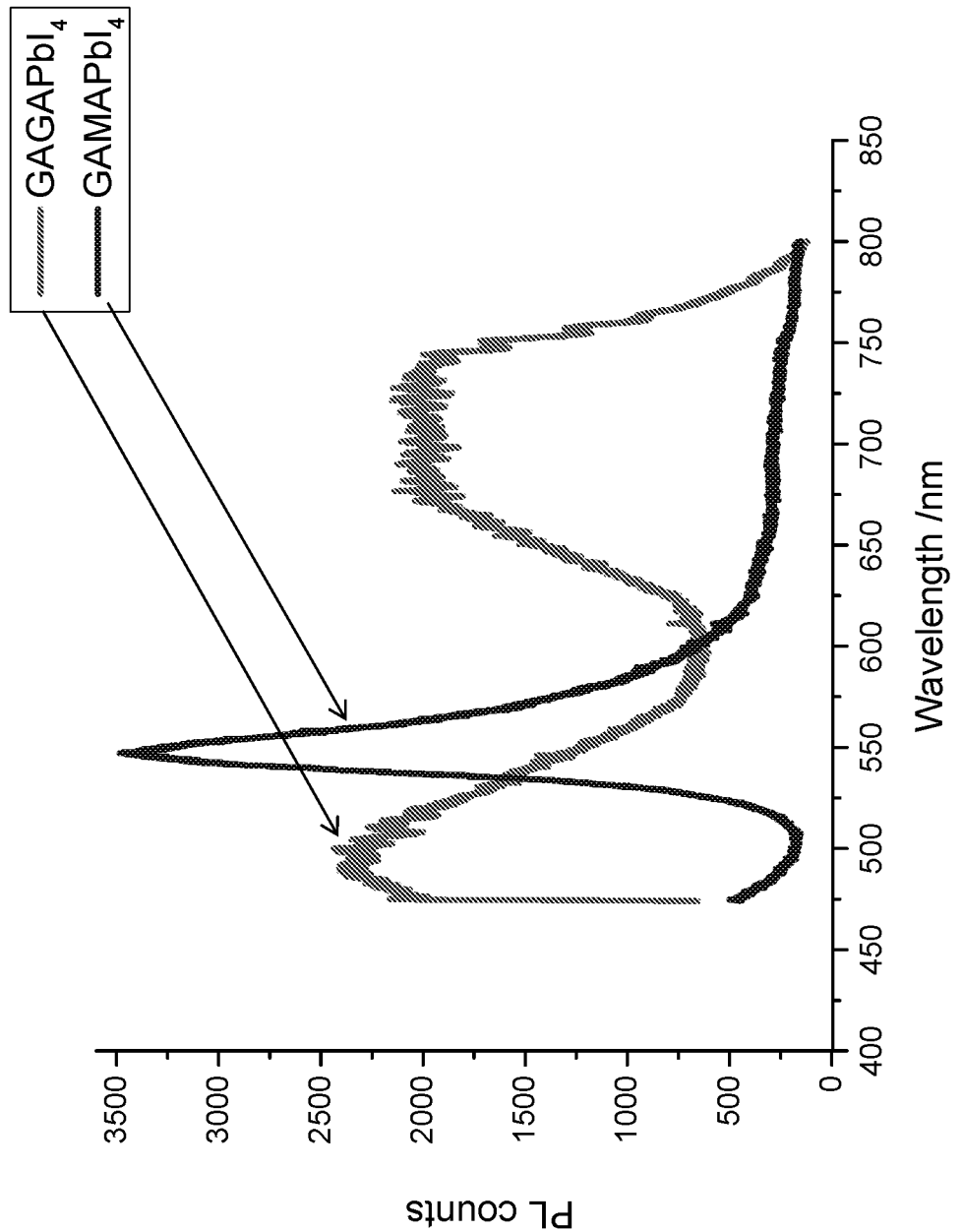
FIG. 21 shows the photoluminescence spectra for (GA) $(GA)PbI_4$ and $(GA)(MA)PbI_4$.

(GA)(MA)$_3$Pb$_3$I$_{10}$(n=3), (GA)(GA)PbI$_4$(n=1), and (GA)(MA)PbI$_4$(n=1) were also synthesized using this procedure. The XRD spectra for (GA)(MA)$_3$Pb$_3$I$_{10}$ and (GA)(MA)$_2$Pb$_2$I$_7$ are shown in FIG. 19. The diffuse reflectance spectra for all four perovskites are shown in FIG. 20. The PL spectra for (GA)(GA)PbI$_4$ and (GA)(MA)PbI$_4$ are shown in FIG. 21.

Example 9

This example reports another scalable synthesis of the homologous 2D series of lead iodide perovskites (CH$_3$(CH$_2$)$_3$NH$_3$)$_2$(CH$_3$NH$_3$)$_{(n-1)}$Pb$_n$I$_{(3n+1)}$.

Experimental Section

Starting Materials. All chemicals were purchased from Sigma-Aldrich and used as received. Methylammonium iodide (MAI) was synthesized by neutralizing equimolar amounts of a 57% w/w aqueous hydriodic acid (HI) and 40% w/w aqueous methylamine (CH$_3$NH) (pH≈7). The white precipitate was collected by evaporation of the solvent using rotary evaporation at 60° C. under reduced pressure. For convenience, the 3D CH$_3$NH$_3$PbI$_3$ perovskite will be denoted as MAPbI$_3$ and the 2D (n-CH$_3$(CH$_2$)$_3$NH$_3$)$_2$(CH$_3$NH$_3$)$_{n-1}$Pb$_n$I$_{3n+1}$ family will be denoted as (BA)$_2$(MA)$_{n-1}$Pb$_n$I$_{3n+1}$(n=4, 3, 2, 1) throughout.

Syntheses. MAPbI$_3$ (n=∞). PbO powder (2232 mg, 10 mmol) was dissolved in a mixture of 57% w/w aqueous HI solution (10.0 mL, 76 mmol) and 50% aqueous $H_3PO_2$ (1.7 mL, 15.5 mmol) by heating to boiling under constant magnetic stirring for about 5 min, which formed a bright yellow solution. Subsequent addition of solid $CH_3NH_3Cl$ (675 mg, 10 mmol) to the hot yellow solution initially caused the precipitation of a black powder, which rapidly redissolved under stirring to afford a clear bright yellow solution. The stirring was then discontinued, and the solution was left to cool to room temperature and left to stand overnight to afford black polyhedral crystals. The crystals were collected by suction filtration and dried under reduced pressure. Yield 3.8 g (60%). Diffuse reflectance infrared Fourier transformed (DRIFT) spectrum, (KBr, cm-1): 3180 br, 2823 w, 2711 w, 2485 w, 2383 w, 1820 w, 1581 s, 1467 s, 1248 m, 960 s, 910 s, 490 m.

$(BA)_2(MA)_3Pb_4I_{13}$ (n=4). PbO powder (2232 mg, 10 mmol) was dissolved in a mixture of 57% w/w aqueous HI solution (10.0 mL, 76 mmol) and 50% aqueous $H3PO2$ (1.7 mL, 15.5 mmol) by heating to boiling under constant magnetic stirring for about 5 min, which formed a bright yellow solution. Subsequent addition of solid $CH_3NH_3Cl$ (507 mg, 7.5 mmol) to the hot yellow solution initially caused the precipitation of a black powder, which rapidly redissolved under stirring to afford a clear bright yellow solution. In a separate beaker, n-$CH_3(CH_2)_3NH_2$ (248 μL, 2.5 mmol) was neutralized with HI 57% w/w (5 mL, 38 mmol) in an ice bath resulting in a clear pale yellow solution. Addition of the n-$CH_3(CH_2)_3NH_3I$ solution to the $PbI_2$ solution initially produced a black precipitate, which subsequently dissolved under heating the combined solution to boiling. The stirring was then discontinued, and the solution was left to cool to room temperature during which time black rectangular-shaped plates started to crystallize. The precipitation was deemed to be complete after ~2 h. The crystals were isolated by suction filtration and thoroughly dried under reduced pressure. Yield 2.1 g (33% based on total Pb content). DRIFT spectrum, (KBr, cm-1): 3174 br, 2962 w, 2929 w, 2725 m, 2485 w, 2382 w, 1815 w, 1577 s, 1468 s, 1250 m, 1149 m, 1072 m, 1034 m, 960 m, 912 s, 785 w, 735 w, 476 m.

$(BA)_2(MA)_2Pb_3I_{10}$(n=3). PbO powder (2232 mg, 10 mmol) was dissolved in a mixture of 57% w/w aqueous HI solution (10.0 mL, 76 mmol) and 50% aqueous $H_3PO_2$ (1.7 mL, 15.5 mmol) by heating to boiling under constant magnetic stirring for about 5 min, which formed a bright yellow solution. Subsequent addition of solid $CH_3NH_3Cl$ (450 mg, 6.67 mmol) to the hot yellow solution initially caused the precipitation of a black powder, which rapidly redissolved under stirring to afford a clear bright yellow solution. In a separate beaker, n-$CH_3(CH_2)_3NH_2$ (327 μL, 3.33 mmol) was neutralized with HI 57% w/w (5 mL, 38 mmol) in an ice bath resulting in a clear pale yellow solution. Addition of the n-$CH_3(CH_2)_3NH_3I$ solution to the $PbI_2$ solution initially produced a black precipitate, which was subsequently dissolved under heating the combined solution to boiling. The stirring was then discontinued, and the solution was left to cool to room temperature during which time deep-red/purple rectangular-shaped plates started to crystallize. The precipitation was deemed to be complete after ~2 h. The crystals were isolated by suction filtration and thoroughly dried under reduced pressure. Yield 2.5 g (36% based on total Pb content). DRIFT spectrum, (KBr, cm-1): 3174 br, 2962 w, 2929 w, 2873 w, 2713 m, 2463 w, 2382 w, 1810 w, 1573 s, 1468 s, 1389 w, 1335 w, 1255 w, 1149 m, 1072 m, 1017 m, 1001 m, 964 m, 914 s, 785 w, 748 w, 735 w, 484 m.

$(BA)_2(MA)Pb_2I_7$(n=2). PbO powder (2232 mg, 10 mmol) was dissolved in a mixture of 57% w/w aqueous HI solution (10.0 mL, 76 mmol) and 50% aqueous $H_3PO_2$ (1.7 mL, 15.5 mmol) by heating to boiling under constant magnetic stirring for about 5 min, which formed a bright yellow solution. Subsequent addition of solid $CH_3NH_3Cl$ (338 mg, 5 mmol) to the hot yellow solution initially caused the precipitation of a black powder, which rapidly redissolved under stirring to afford a clear bright yellow solution. In a separate beaker, n-$CH_3(CH_2)_3NH_2$ (694 μL, 7 mmol) was neutralized with HI 57% w/w (5 mL, 38 mmol) in an ice bath resulting in a clear pale yellow solution. Addition of the n-$CH_3(CH_2)_3NH_3I$ solution to the $PbI_2$ solution initially produced a black precipitate, which was subsequently dissolved under heating the combined solution to boiling. The stirring was then discontinued, and the solution was left to cool to room temperature during which time cherry red rectangular-shaped plates started to crystallize. The precipitation was deemed to be complete after ~2 h. The crystals were isolated by suction filtration and thoroughly dried under reduced pressure. Yield 3.0 g (41% based on total Pb content). DRIFT spectrum, (KBr, cm-1): 3174 br, 2962 w, 2929 w, 2880 w, 2721 w, 2474 w, 2389 w, 1808 w, 1574 s, 1468 s, 1385 w, 1335 w, 1255 w, 1149 m, 1070 m, 1017 m, 1002 m, 968 m, 914 s, 785 w, 748 m, 737 m, 476 m.

$(BA)_2PbI_4$ (n=1). PbO powder (2232 mg, 10 mmol) was dissolved in a mixture of 57% w/w aqueous HI solution (10.0 mL, 76 mmol) and 50% aqueous $H3PO2$ (1.7 mL, 15.5 mmol) by heating to boiling under constant magnetic stirring for about 5 min, which formed a bright yellow solution. Subsequent addition of liquid. In a separate beaker, n-$CH_3(CH_2)_3NH_2$ (924 μL, 10 mmol) was neutralized with HI 57% w/w (5 mL, 38 mmol) in an ice bath resulting in a clear pale yellow solution. Addition of the n-$CH_3(CH_2)_3NH3I$ solution to the $PbI_2$ solution initially produced a black precipitate, which was subsequently dissolved under heating the combined solution to boiling. The stirring was then discontinued, and the solution was left to cool to room temperature during which time orange rectangular-shaped plates started to crystallize. The precipitation was deemed to be complete after ~2 h. The crystals were isolated by suction filtration and thoroughly dried under reduced pressure. Yield 3.5 g (49% based on total Pb content). DRIFT spectrum, (KBr, cm-1): 3025 br, 2960 w, 2929 w, 2880 w, 2739 w, 2472 m, 2389 w, 1830 w, 1572 s, 1475 s, 1385 w, 1390 m, 1255 w, 1159 m, 1081 m, 1047 m, 1004 m, 968 m, 920 s, 787 w, 737 m, 474 m.

Characterization. Single-crystal X-ray diffraction data were collected using an image plate STOE IPDS II diffractometer using Mo Kα radiation ($\lambda$=0.71073 Å), operating at 50 kV and 40 mA. Data reduction and numerical absorption corrections were performed using the X-AREA suite. Single-crystals of the $(BA)_2(MA)_{n-1}Pb_nI_{3n+1}$ compounds were mounted on the end of the glass tip directly from the mother liquor, and the use of glue or dispersion oil was avoided due to the clear deterioration of the crystals. All structures were solved by direct methods and refined by full-matrix least-squares on F2 using the SHELXTL-2013 program package. The PLATON functions operating within the WinGX platform were used to ensure the validity of the refined crystal structures.

The structures were refined based on the following considerations. The perovskite lattice $\{Pb_nI_{3n+1}\}$ was refined anisotropically without any constraints on the Pb and I atoms. The highly anisotropic shape of the thermal ellipsoids of coordinated iodide ions appears due to a high thermal motion relative to the PbI bond vector. This is typical for the halide perovskite structures at room temperature, and therefore no special treatment was used. All organic atoms were refined isotropically. Restraints were applied to the C—C and C—N bond lengths. Each cation was treated as having equivalent thermal parameters. Significant disorder exists in the interlayer cations, particularly for the $CH_3CH_2$— tail of butylammonium (the $NH_3CH_2CH_2$— head is relatively stable), causing the atoms to move and destabilize the refinement. The bond length restraints cannot account for the motion of the interlayer cations. Therefore, the cations were modeled manually on idealized positions based on reasonable bond length and bond angle parameters. Thus, the whole butylammonium cations were constructed on top of the mirror planes imposed by the space group by slightly modifying the positions of the off-plane Q-peaks found in the electron density map. The mirror planes have the (x, y, ¼)/(x, y, ¾) and (x, y, ½) coordinates for the Ccmm (and Cc2m) and Acam space groups, respectively, whereas in the case of C2cb where no mirror plane is crystallographically imposed, the cations were modeled based on the initial Q-peaks. In the final steps of the refinement, the $\{(CH_3NH_3)_{n-1}Pb_nI_{3n+1}\}$ structure segment was refined without restraints, while the butylammonium cations were fixed. The purpose of this treatment was to generate chemically reasonable models without disorder. The modeled cations increase the R-values slightly compared to the unrestrained or disordered refinement and make the e.s.u.'s unrealistically small. Because of this, a BLOC instruction was used to finalize the refinement, which fixed the positions of the butylammonium cations and refined the rest of the atoms separately, to maintain the proper e.s.u.'s of the perovskite layers. Powder and film X-ray diffraction patterns were collected using a Rigaku MiniFlex 600 X-ray diffractometer (Cu Kα, 1.5406 Å) operating at 40 kV and 15 mA.

Scanning electron microscope (SEM) images were acquired at an accelerating voltage of 10-20 kV using either a Hitachi SU8030 or a Hitachi SU3400 instruments equipped with Oxford X-max 80 SDD EDS detectors.

Optical diffuse-reflectance spectra were collected at room temperature using a Shimadzu UV-3600 PC double-beam, double-monochromator spectrophotometer on powdered samples using BaSO4 as a 100% reflectance reference. The samples were irradiated with a halogen (NIR/Visible, SOW, 2000H) and a D2 lamp (UV, 2000H), and the spectra were recorded using a PbS photoconductive element (NIR) and a PMT (R928) detectors from 2500-200 nm. Band gaps were determined as described elsewhere. (Chondroudis, K.; McCarthy, T. J.; Kanatzidis, M. G. Chemistry in Molten Alkali Metal Polyselenophosphate Fluxes. Influence of Flux Composition on Dimensionality. Layers and Chains in $APbPSe_4$, $A_4Pb(PSe_4)2$ (A=Rb, Cs), and $K_4Eu(PSe_4)_2$. Inorg. Chem. 1996, 35, 840-844; and McCarthy, T. J.; Kanatzidis, M. G. Synthesis in Molten Alkali Metal Polyselenophosphate Fluxes: A New Family of Transition Metal Selenophosphate Compounds, $A_2MP_2Se_{26}$ (A=K, Rb, Cs; M=Mn, Fe) and $A_2M'_2P_2Se_6$ (A=K, Cs; M'=Cu, Ag). Inorg. Chem. 1995, 34, 1257-1267.)

DRIFT spectra were recorded on a Nicolet 6700 IR spectrometer in the 400-4000 $cm^{-1}$ spectral region with KBr beam splitter. Raman spectra were recorded on a DeltaNu Advantage NIR spectrometer equipped with a CW diode laser (785 nm, 60 mW) and a CCD camera detector in a backscattered geometry. The powdered samples were packed in standard melting point capillaries (0.8 mm ID).

Photoluminescence spectra were collected on oriented rectangular crystals of $(BA)_2(MA)_{n-1}Pb_nI_{3n+1}$ (n=4, 3, 2, 1) and rhombic dodecahedral crystals of $MAPbI_3$ using Horiba LabRam Evolution high resolution confocal Raman microscope spectrometer (600 g/mm diffraction grating) equipped with a diode CW laser (473 nm, 25 mW) and a Synapse CCD camera. The incident laser beam was parallel to the (010) direction of the crystals and focused at ~1 μm spot size. Unless stated otherwise, the maximum power output of the laser source was filtered to 0.1% of the maximum power output.

Second harmonic generation (SHG) and third harmonic generation (THG) spectra were recorded on powdered $(BA)_2(MA)_{n-1}Pb_nI_{3n+1}$ perovskite samples and a powdered α-$SiO_2$ reference for a particle size distribution from 90 μm-125 μm was placed in standard melting point capillaries (0.8 mm ID) using reflection geometry with a fiber-optic bundle as described previously. (Haynes, A. S.; Saouma, F. O.; Otieno, C. O.; Clark, D. J.; Shoemaker, D. P.; Jang, J. I.; Kanatzidis, M. G. Phase-Change Behavior and Nonlinear Optical Second and Third Harmonic Generation of the One-Dimensional $K_{(1-x)}Cs_xPSe_6$ and Metastable β-$CsPSe_6$. Chem. Mater. 2015, 27, 1837-1846; and Stoumpos, C. C.; Frazer, L.; Clark, D. J.; Kim, Y. S.; Rhim, S. H.; Freeman, A. J.; Ketterson, J. B.; Jang, J. I.; Kanatzidis, M. G. Hybrid Germanium Iodide Perovskite Semiconductors: Active Lone Pairs, Structural Distortions, Direct and Indirect Energy Gaps, and Strong Nonlinear Optical Properties. J. Am. Chem. Soc. 2015, 137, 6804-6819.) The bundle was coupled to a Horiba iHR320 spectrometer (600 g/mm diffraction grating) equipped with a Synapse CCD camera. To prevent absorption effects during the SHG measurement, the fundamental beam from an optical parametric oscillator, pumped by a Nd:YAG laser, was tuned to λ=1800 nm so that the SHG photon energy ($\hbar\omega$SHG=1.38 eV) was below the band gap of all the materials. The incident pulse energy was tuned to ~30 μJ using a Glan-Thompson polarizer with a beam spot size of ~0.5 mm. All detector exposure times were scaled to 60 s. The THG photon energy on the other hand was above the band gap (except $(BA)_2PbI_4$) ($\hbar\omega$THG=2.07 eV), and therefore THG was significantly underestimated because of the self-absorption processes in the material. However, this absorption effect was properly taken into account for the comparison between SHG and THG using the absorbance data.

Computational Methods. Three of the synthesized compounds were investigated using density functional theory: $(BA)_2PbI_4$, $(BA)_2(MA)_2Pb_3I_{10}$, and $(BA)_2(MA)_3Pb_4I_{13}$. All calculations were performed with the Vienna ab initio Simulation Package (VASP) using projector augmented-wave (PAW) potentials within the PBEsol exchange-correlation functional. A centrosymmetric and a noncentrosymmetric structure were initially generated for each of the three compounds through manipulation of the organic cations, which was inferred by the symmetries identified in the experimental structure refinements. Subsequently, the lattice parameters and cell volume were fixed to those determined in our experiments and the internal atomic positions were fully relaxed until the forces were less than 1 meV Å-1 using a 500 eV plane-wave cutoff and 5×1×5 Monkhorst-Pack mesh to sample the Brillouin zone. The density of states and band structures in the noncentrosymmetric crystal structures were computed, and were found to be the lowest energy phases in each case using a 5×1×5 Monkhorst-Pack mesh and increased 550 eV planewave cutoff.

Results and Discussion

Synthesis. The 2D $(CH_3(CH_2)_3NH_3)_2(CH_3NH_3)_{n-1}Pb_nI_{3n+1}$ family of perovskite compounds (n=1-4) was synthesized from a stoichiometric reaction between $PbI_2$, $CH_3NH_3I$ (MAI), and n-butylamine (BA). A homogeneous solution of concentrated, $I_2$-free hydroiodic acid containing stoichiometric amounts of $PbI_2$ and $CH_3NH_3I$ (MA), according to the desired composition, was allowed to react with half themstoichiometric amount of BA by addition of the neutralized base into the boiling acid solution under vigorous stirring. This highly exothermic reaction resulted in the formation of a clear, bright yellow solution, which upon cooling to ambient conditions precipitates into the layered perovskite compounds (n=2-4) in the form of colorful rectangular plates with the spectral range spanning from red to black. The use of BA as the reaction limiting reagent was found to be essential in obtaining the compounds in pure form. At the same time, it was found to be detrimental to the reaction yield, which is limited to ~50% based on the total Pb content due to the high solubility of $CH_3NH_3PbI_3$ in the $HI/H_3PO_2$ solvent medium. The employment of this concept takes advantage of the different solubility of the 2D perovskite members in the solvent medium, which increases as the number of perovskite layers increases up to a maximum solubility obtained for the $CH_3NH_3PbI_3$ end-member (~0.6 M at the boiling point). Interestingly, the solubility trend is inverted in intermediate polarity solvents such as acetone or acetonitrile. In these solvents, the 2D compounds are relatively soluble, where the member with the largest organic fraction becomes the most soluble (i.e., n=1). Using $HI/H_3PO_2$ as a solvent medium, it was found that if BA is used stoichiometrically, or MA is used in excess, as has been taught previously (Smith et al., Angew. Chem., Int. Ed. 2014, 53, 11232-11235; Tanaka et al., Sci. Technol. Adv. Mater. 2003, 4, 599-604; Tabuchi et al., J. Phys. Chem. Solids 2000, 61, 837-845; and Elleuch et al., J. Lumin. 2010, 130, 531-535), then the end product is contaminated either with the (n−1) member in the former case, which acts as a kinetic barrier, or with the (n+1) member in the latter case, which acts as a thermodynamic sink during synthesis of the compounds. Thus, the driving force to guide the reaction into a single n-member product comes from careful control of the stoichiometry based on the "limiting reagent" principle.

The above procedure is a scalable and efficient method of preparing these layered compounds in pure form. The reaction scheme described above can be conveniently used to prepare the 2D perovskite members (n=2, 3, and 4), which contradicts a proposed axiom that Ruddlesden-Popper halide perovskites with n>3 cannot be isolated in pure form. (Papavassiliou, G. C. Three- and Low-Dimensional Inorganic Semiconductors. Prog. Solid State Chem. 1997, 25, 125-270.) It is believed that this is the only method by which the individual compounds with n>2 can be isolated on a gram scale.

Crystal Structure Description. Basic Structural Characteristics. The crystal structures of the $(BA)_2(MA)_{n-1}Pb_nI_{3n+1}$ (n=1-4) compounds were obtained and analyzed. All compounds crystallized in orthorhombic space groups; $(BA)_2PbI_4$ crystallized in the primitive centrosymmetric Pbca space group, whereas $(BA)_2(MA)Pb_2I_7$, and $(BA)_2(MA)_3Pb_4I_{13}$, which have been determined in this example, crystallized in the polar (C2v), base-centered Cc2 m, C2cb, and Cc2 m, space groups, respectively.

A more detailed discussion of the crystal structures of the compounds, as well as their electronic structures, photoluminescence properties, and non-linear optical properties can be found in Stoumpos et al., Chem. Mater. 2016, 28, 2852-2867, the entire disclosure of which is incorporated herein by reference.

Based on the studies described herein, it was determined that the 2D homologous compounds have sharp absorption edges in the visible spectral range suggesting a direct band gap, which asymptotically approaches the band gap of the 3D $MAPbI_3$ perovskite. DFT calculations confirm that the 2D perovskites are indeed direct band gap semiconductors with large bandwidths and small effective masses for both electrons and holes. The absorption of the 2D perovskites is accompanied by a strong photoluminescence emission at room temperature, which is characteristically red-shifted with respect to the absorption edge. The optical physics of the 2D perovskites is characterized by the presence of stable excitons, which act like the active chromophores at room temperature, owing to their natural quantum well electronic structure, which is analogous to that of the artificial III-V semiconductor quantum wells.

In view of their exciting properties, the 2D perovskites can indeed be a new source of functional, tunable semiconductors expanding on the properties of the 3D species. For example, the intense room-temperature photoluminescence possible from the 2D perovskites points to their potential utility in light-emitting diodes and lasers. On the other hand, the optimal band gaps of higher n members indicate that these compounds can be used as efficient light absorbers for solution-processed solar cells, which offers better solution processability in addition to their superior environmental stability. More complicated concepts like electrooptical modulators are also possible, taking advantage of the quantum well tunable architecture of the 2D perovskites. The great advantage of the 2D perovskites over the 3D ones is that the complex electronic structure of the 2D materials can be chemically tuned through subtle modification of the crystal structure, adjusting the layer-to-layer spacing or the spacerperovskite interactions.

Example 10

This Example describes the synthesis of $(CH_3(CH_2)_3NH_3)_2(CH_3NH_3)_4Pb_5I_{16}$ (henceforth termed $BA_2MA_4Pb_5I_{16}$ or briefly n=5), which has been successfully synthesized for the first time in high yield and purity. Its crystal structure has been determined using single crystal X-ray diffraction, and its optical and electronic properties as well as its utility in the fabrication of solar cells using the "hot-casting" method have been established. (Nie, W.; Tsai, H.; Asadpour, R.; Blancon, J.-C.; Neukirch, A. J.; Gupta, G.; Crochet, J. J.; Chhowalla, M.; Tretiak, S.; Alam, M. A.; Wang, H.-L.; Mohite, A. D., High-efficiency solution-processed perovskite solar cells with millimeter-scale grains. Science 2015, 347 (6221), 522-525.)

The synthesis of $BA_2MA_4Pb_5I_{16}$ was achieved by mixing PbO, MACl and BA in concentrated aqueous HI (57% w/w) following the off-stoichiomerty protocol to obtain a phase pure material. In this process, BA is used as the limiting reagent in order to prevent fast precipitation that may lead to crystallization of the less soluble products which leads to a mixture of RP perovskite products.

A single crystal suitable for X-ray diffraction, was isolated directly from the mother liquor prior to filtration and mounted on a glass fiber tip. This is a necessary step, since the electrostatic nature of the dry crystals and their sensitivity to mechanical deformation hinders the successful selection of single-crystals. $BA_2MA_4Pb_5I_{16}$ crystallizes in an orthorhombic space group with dimensions a=8.9050(7) Å, b=77.013(4) Å, c=8.9313(4) Å incorporating 4 formula unit in the unit cell corresponding to two discrete RP layers.

A pronounced change in the trend of crystal morphology occurs in going from the lower n-members (n=1-4) to the higher n-members (n=5-∞). In the former case, the crystals grow in the form of thin, square or octagonal platelets, expanding freely along the plane of the inorganic layers but growth along the vertical stacking direction is slow. This pattern starts to change for n=5, where in addition to the preferred platelet growth the crystals exhibit a strong vertical growth habit with platelets evolving from the existing thin platelets in a 90° angle, intercepting the layers and leading to extensive twinning with certain (010) planes growing in the (101) direction. For n=5, the perovskite layers maintain their structural integrity, revealing an excellent layer formation capability with very high analytical purity with respect to other n-members, as evidenced by high resolution, synchrotron X-ray diffraction.

The high purity of $BA_2MA_4Pb_5I_{16}$ allows for an accurate determination of the optical properties of the n=5 RP perovskite. The optical absorption spectrum is characterized by the band edge, the excitonic peak and an Urbach tail. The band gap of n=5 is estimated to be $E_g$=1.83eV, after correcting for the exciton peak and the Urbach tail. An additional feature is seen in the fact that the excitonic contribution, shown as a kink in the absorption edge, is reduced compared to the lower n-members, due to the expected decrease in the exciton binding energy which can be crudely estimated by the difference in energy between the band edge and the exciton peak to have a value of $E_b$~6 meV. On the other hand, the Urbach tail in n=5 appears to be much pronounced with respect to other lower members and this is possibly related to the structural disorder possibly introduced by the extensive twinning. On the other hand, the photoluminescence (PL) spectrum of n=5 appears to be very well resolved with a near Gaussian-type emission peak at 678 nm. The low-energy tail of the peak is characteristic of the RP perovskites and it has been attributed to trap states. The PL peak, corresponding mainly to the excitonic contribution, agrees well with the experimental band gap, indicating that the confinement effects start to decrease considerably for n=5.

In order to decide whether $BA_2MA_4Pb_5I_{16}$ is a direct band gap semiconductor, and to better understand the effects of the quantum confinement on the electronic structure of the perovskite DFT calculations were performed based on the experimentally determined crystal structure. The compound has a direct band gap of $E_g$=1.13 eV without considering Spin-Orbit coupling (SOC) at the Γ point. The minimum of the conduction band (CBM) is made up of 4 degenerate states while 2 nearly degenerate states appear at the top of the valence band (VBM). The inclusion of SOC into the calculation splits two of the degenerate states of CBM by more than 1 eV and the band gap is thus lowered to $E_g$=0.28 eV, still at the Γ point. It is important to stress that band gaps calculated using plain DFT are underestimated, which is a known issue, and the presented values are only qualitative. In accordance with earlier findings, the projection of the density of states (DOS) on the different constituent atoms indicates that the top of VB is mainly due to 5 p orbitals of I and 6 s of Pb while CBM is mainly due to the 6 p states of Pb, whereas the light atoms from the ammonium cations (C, N and H) have states either too deep in the valence band or too high in the conduction band and do not contribute to VBM or CBM states. In addition, the band structure shows flat dispersions along the Z-T and Y-F directions in the reciprocal space, which correspond to the layer stacking along b-axis in real space. The flat dispersions indicate the absence of electronic coupling between the inorganic layers along the stacking direction confirming the 2D systems. By comparison at and close to the band gap, only one band is predicted for the single-layer (n=1) RP perovskites both in the CB and the VB, respectively. The formation of these electronic minibands and the lowering of the band gap for n=5 RP perovskite are indicative of a vanishing quantum confinement effect, in agreement with the experimental absorption and emission spectra. The flat dispersion curves, bear the signatures of a composite material consisting of an inorganic quantum-well and an inorganic barrier with no common Bloch functions between the quantum-well and the barrier. In addition, it is noted that the 2D character of the inorganic part of the n=5 RP perovskite decreased due to the increased thickness of the layers, thus resembling the 3D perovskite analogue. The evanescence of the 2D character of the compound with increasing n-number can also be best seen from the comparison of its DOS to those of the n=1 (pure 2D character) and n=∞ (pure 3D character) end-members. This comparison reveals a step-like behavior of the total DOS of the n=1 member near VBM which is characteristic of a 2D system. These findings were clearly illustrated in graphical plots of the Γ point wavefunctions at VBM and CBM. An unusual feature of these wavefunctions ($\Psi$) is their appearance at specific octahedral layers for VBM and CBM, respectively. ($\Psi_{VBM}$) is mainly expressed at the "core layers" ($2^{nd}$ and $4^{th}$) with an anti-bonding character between the 5 p I orbitals and 6 s Pb orbitals, while the wavefunction of CBM ($\Psi_{CBM}$) shows up at the surface layers ($1^{st}$ and $5^{th}$) having a bonding character among the 6 p lead orbitals. The localized character of the VBM and CBM is of great importance regarding the electrical properties of the compounds since it implies that the electrons and holes are spatially separated within a single RP perovskite layer and it may prove a useful tool in the engineering of functional devices.

The high frequency dielectric constant ($\varepsilon_\infty$) profiles were also calculated for the n=1, n=5 and n=∞ RP perovskites, respectively. For the pure 2D compound (n=1), $\varepsilon_\infty$ varies from $\varepsilon_0$=2.1 for the intercalated organic bilayer to $\varepsilon_i$=4.0 for the inorganic perovskite layers. Similarly, the contribution of the organic molecules to $\varepsilon_\infty$ remains practically constant ($\varepsilon_0$~2.0) for the n=5 member, as the number of the inorganic layers has little influence on it. However, the contribution of the perovskite thickness to $\varepsilon_\infty$ drastically increases to $\varepsilon_i$=5.5 for n=5, effectively reaching the maximum value obtained for the pure 3D end-member (n=∞). The increasing $\varepsilon_\infty$ in the inorganic part of the compounds as a function of n clearly emphasizes the dielectric confinement effect, which is dominant in the thin layers of the n=1 but peters out in n=5. The strong decline of the dielectric confinement in $BA_2MA_4Pb_5I_{16}$ suggests that the excitonic contribution is very small in n=5, in good agreement with its absorption spectrum.

Having established the basic material properties of $BA_2MA_4Pb_5I_{16}$, solar cells were fabricated, in an attempt to evaluate whether the n=5 member is capable of producing high-efficiency devices. Using the preformed $BA_2MA_4Pb_5I_{16}$ bulk material and by employing the hot-casting device fabrication protocol (Nie, W.; Tsai, H.; Asadpour, R.; Blancon, J.-C.; Neukirch, A. J.; Gupta, G.; Crochet, J. J.; Chhowalla, M.; Tretiak, S.; Alam, M. A.; Wang, H.-L.; Mohite, A. D., High-efficiency solution-processed perovskite solar cells with millimeter-scale grains. *Science* 2015, 347 (6221), 522-525; and Tsai, H.; Nie, W.; Blancon, J.-C.; Stoumpos, C. C.; Asadpour, R.; Harutyunyan, B.; Neukirch, A. J.; Verduzco, R.; Crochet, J. J.; Tretiak, S.; Pedesseau, L.; Even, J.; Alam, M. A.; Gupta, G.; Lou, J.; Ajayan, P. M.; Bedzyk, M. J.; Kanatzidis, M. G.; Mohite, A. D., High-efficiency two-dimensional Ruddlesden-Popper perovskite solar cells. *Nature* 2016, 536 (7616), 312-6), photovoltaic devices have been fabricated that reach an 8.74% conversion efficiency. The as fabricated devices show remarkable stability at ambient conditions.

Experimental Section

Synthesis $BA_2MA_4Pb_5I_{16}$ was synthesized following a modification of the procedure described in Example 9. Dry PbO powder (4464 mg, 20 mmol) was dissolved in a mixture of aqueous HI solution (20.0 mL, 152 mmol) and aqueous $H_3PO_2$ (3.4 mL, 31 mmol) by heating to boiling under constant magnetic stirring for about 20 min, forming a bright yellow solution. Subsequent addition of pre-dried, solid $CH_3NH_3Cl$ (1080 mg, 16 mmol) to the hot yellow solution initially caused the precipitation of a black powder, which redissolved under stirring to afford a clear bright yellow solution. In a separate beaker, $CH_3CH_2CH_2CH_2NH_2$ (396 µL, 4 mmol) was neutralized with HI (10 mL, 76 mmol) in an ice bath, resulting in a clear pale yellow solution. Addition of the chilled BA solution to the $MAPbI_3$ solution initially produced a black precipitate, which was subsequently dissolved under heating the solution to boiling. The stirring was then discontinued, and the solution was left to cool to room temperature during which black compounds started to crystallize. The precipitation was left to complete overnight. The crystals were isolated by suction filtration and thoroughly dried at 60° C. in a vacuum oven overnight. Yield 5.9 g (45% based on Pb)

Characterization

Single-crystal X-ray diffraction data were collected using an image plate STOE IPDS II diffractometer using Mo Kα radiation (λ=0.71073 Å), operating at 50 kV and 40 mA. Data reduction and numerical absorption corrections were performed using the X-AREA suite. Single-crystals of $BA_2MA_4Pb_5I_{16}$ were mounted on the end of the glass tip directly from the mother liquor and the use of glue or dispersion oil was avoided due to the clear deterioration of the crystals. The structure was solved by charge-flipping and refined by full-matrix least squares on $F^2$ using the JANA2006 package.

High resolution synchrotron powder diffraction data were collected using beamline 11-BM at the Advanced Photon Source (APS), Argonne National Laboratory using an average wavelength of 0.459200 Å. Discrete detectors covering an angular range from 0 to 4° 2θ are scanned over a 25.5° 2θ range, with data points collected every 0.001° 2θ and scan speed of 0.1°/s. Rietveld analysis was performed using the JANA2006 package.

Powder and film X-ray diffraction patterns were collected using a Rigaku MiniFlex 600 X-ray diffractometer (Cu Kα, 1.5406 Å) operating at 40 kV and 15 mA.

Scanning electron microscope (SEM) images were acquired at an accelerating voltage of 10 to 20 kV using a either a Hitachi SU8030 or a Hitachi SU3400 instruments equipped with Oxford X-max 80 SDD EDS detectors.

Optical diffuse-reflectance spectra were collected at room temperature using a Shimadzu UV-3600 PC double-beam, double-monochromator spectrophotometer on powdered samples using $BaSO_4$ as a 100% reflectance reference. The samples were irradiated with a halogen (NIR/Visible, 50 W, 2000 H) and a $D_2$ lamp (UV, 2000 H) and the spectra were recorded using a PbS photoconductive element (NIR) and a PMT (R928) detectors from 2500 to 200 nm.

Photoluminescence spectra were collected on oriented rectangular crystals of $BA_2MA_4Pb_5I_{16}$ using Horiba LabRam Evolution high-resolution confocal Raman microscope spectrometer (600 g/mm diffraction grating) equipped with a diode CW laser (473 nm, 25 mW) and a Synapse CCD camera. The incident laser beam was parallel to the (010) direction of the crystals and focused at 10 µm spot size. The maximum power output of the laser source was filtered to 0.01% of the maximum power output.

Thin-Film Characterization. Samples for AFM and XRD measurements were prepared on ITO/PEDOT:PSS substrates. AFM images were acquired using Veeco Enviroscope in the tapping mode. Powder X-ray diffraction measurements were carried out on a RigakuMiniFlex600 X-ray diffractometer (Cu Kα radiation, λ=1.5406 Å) operating at 40 kV and 15 mA.

Solar Cell Device Fabrication: The patterned ITO-coated glass substrates (145 nm, 20 Ω/sq, Thin Film Devices Inc.) were cleaned by sequential sonication in aqueous detergent, deionized water, isopropanol (IPA), and acetone (ACE) for 15 min each, followed by a 5 min ultraviolet (UV) ozone (Jelight Inc., Model 42) treatment. A thin layer of PEDOT:PSS was deposited on the clean ITO substrates by spin-coating at 3,500 r.p.m. for 30 s and annealed at 150° C. for 30 min in air. The substrates were then transferred to an argon glove box to complete the rest of the device fabrication. The 2D perovskite solutions were prepared by dissolving the dried $BA_2MA_4Pb_5I_{16}$ crystals (167 mg/ml, 0.225 M of $Pb^{2+}$ cations) in DMF. The perovskite films were fabricated by pre-heating the ITO/PEDOT:PSS substrates at 110° C. for 5-10 mins before spin-coating 100 µl of the as-prepared solutions at 5,000 r.p.m. for 20 s. The films turned from pale yellow to dark brown to black films during spin-coating. $PC_{61}BM$ layer was deposited on the perovskite film from a 20 mg/ml $PC_{61}BM$ solution in CB via a consecutive two-step spin-coating process at 500 r.p.m. for 5 s and 1,000 r.p.m. for 30 s. Finally, 150 nm of Al was thermally evaporated through a shadow mask at a pressure of ~$8\times10^{-7}$ torr. The devices were encapsulated by using a glass slide and UV-curable ELC-2500 epoxy, which was cured for 5 min in a UV chamber (Electro-Lite). For testing, the devices are masked with black tape and defined to be 0.03 $cm^2$.

Solar Cell Device Characterization: The current density vs. voltage (J-V) data were collected in air using a Keithley 2400 source meter under simulated AM 1.5G irradiation (100 mW/$cm^2$) generated by a solar simulator (Newport 532 ISO1599). The light intensity was calibrated by using an NIST-certified monocrystalline Si reference cell to reduce the spectral mismatch.

DFT calculations: The calculations were performed within the Density Functional Theory (DFT) as implemented in SIESTA package with a basis set of finite-range of numerical atomic orbitals. The Generalized Gradient Approximation (GGA) was used with Perdew-Burke-Ernzerhof (PBE) functional to describe the exchange-correlation term, and norm-conserving Troullier-Martins pseudopotentials were used for each atomic species to account for the core electrons. $1s^1$, $2s^22p^2$, $2s^22p^3$, $5s^25p^5$ and $5d^{10}6s^26p^2$ were used as valence electrons for H, C, N, I, and Pb respectively. Polarized Double-Zeta (DZP) basis set with an energy shift of 50 meV and a Mesh cutoff 200 Rydberg were used for the calculations. The Brillouin zone was sampled with 6×6×4, 6×6×8 and 6×6×6 Monckhorst-Pack grids for the 2D, 2D/3D and 3D respectively. The density of states were generated with a gaussian smearing of 0.1 eV. The electronic and dielectric properties were calculated using the experimental lattice parameters and atomic coordinates. Spin-Orbit coupling (SOC) was taken into account in the calculation of the electronic band structures, though not considered in the high-frequency dielectric constant computations. The 2D system corresponds to $(C_4H_9NH_3)_2PbI_4$ crystal structure recorded at 223K and has Pbca space group. The 3D reference structure is the low temperature phase of $CH_3NH_3PbI_3$ ($MAPbI_3$) with Pnma space group. The 3D $MAPbI_3$ was also used in its tetragonal phase, space group I4/mcm, and replaced the organic molecules ($CH_3NH_3$) with Cs. The 2D/3D compound is $(C_4H_9NH_3)_2$ $(CH_3NH_3)_4Pb_5I_{16}$, experimentally investigated in this work in its Aba2 space group. For the high-frequency dielectric constant profiles, slabs based on≥2D, 2D/3D and 3D systems were constructed and an electric field of 0.01 eV/Å was applied along [001] direction with the relaxation of the sole electron density as described elsewhere. (Even, J.; Pedesseau, L.; Kepenekian, M., Electronic surface states and dielectric self-energy profiles in colloidal nanoscale platelets of CdSe. *Physical Chemistry Chemical Physics* 2014, 16 (45), 25182-25190; and Sapori, D.; Kepenekian, M.; Pedesseau, L.; Katan, C.; Even, J., Quantum confinement and dielectric profiles of colloidal nanoplatelets of halide inorganic and hybrid organic-inorganic perovskites. *Nanoscale* 2016, 8 (12), 6369-6378.)

Example 11

This examples is a comparative example demonstrating that 2D halide perovskites synthesized using the alkyl ammonium cation (illustrated using BA, here) reactant in a stoichiometric quantity does not provide phase pure perovskites.
Synthesis of the Stoichiometric Compounds.
$(BA)_2(MA)_2Pb_3I_{10}$ (n=3). PbO powder (670 mg, 3 mmol) was dissolved in a mixture of 57% w/w aqueous HI solution (5.0 mL, 38 mmol) and 50% aqueous $H_3PO_2$ (1.7 mL, 15.5 mmol), by heating to boiling under constant magnetic stirring for about 5 minutes, forming a bright yellow solution. Subsequent addition of solid $CH_3NH_3I$ (318 mg, 2 mmol) to the hot yellow solution initially caused the precipitation of a black powder which rapidly redissolved under stirring to afford a clear bright yellow solution. n-$CH_3(CH_2)_3NH_2$ (200 µL, 2 mmol) was then added drop-wise under vigorous stirring over a period of 1 min without any changes in the solution. The stirring was then discontinued, and the solution was left to cool to room temperature during which time deep-red rectangular-shaped plates started to crystallize. After the bottom part of the flask was covered (~10 min), the precipitation of the dark red crystal ceased and the precipitation of the bright red crystal started producing a mixture of two compounds. The precipitation was deemed to be complete after ~2 hours. The crystals were isolated by suction filtration and thoroughly dried under reduced pressure.
Purity Evaluation of the Stoichiometric Compounds.
The visually impure material containing dark red and bright red crystallites was characterized by means of powder diffraction where two compositions were identified to be $(BA)_2(MA)_2Pb_3I_{10}$ (n=3, dark red) and $(BA)_2(MA)Pb_2I_7$ (n=2, bright red) isolated in an approximate ratio of 1:1. Subsequent characterization of the absorption spectra revealed a broad spectrum with several absorption peak along the absorption edge corresponding to both n=2 and n=3 members of the perovskite family and perhaps to other higher number entities. The differences become clear when the mixture is compared to the off-stoichiometric n=3 compound which had a single, well-defined absorption edge and a single exciton peak.

Figure 22:
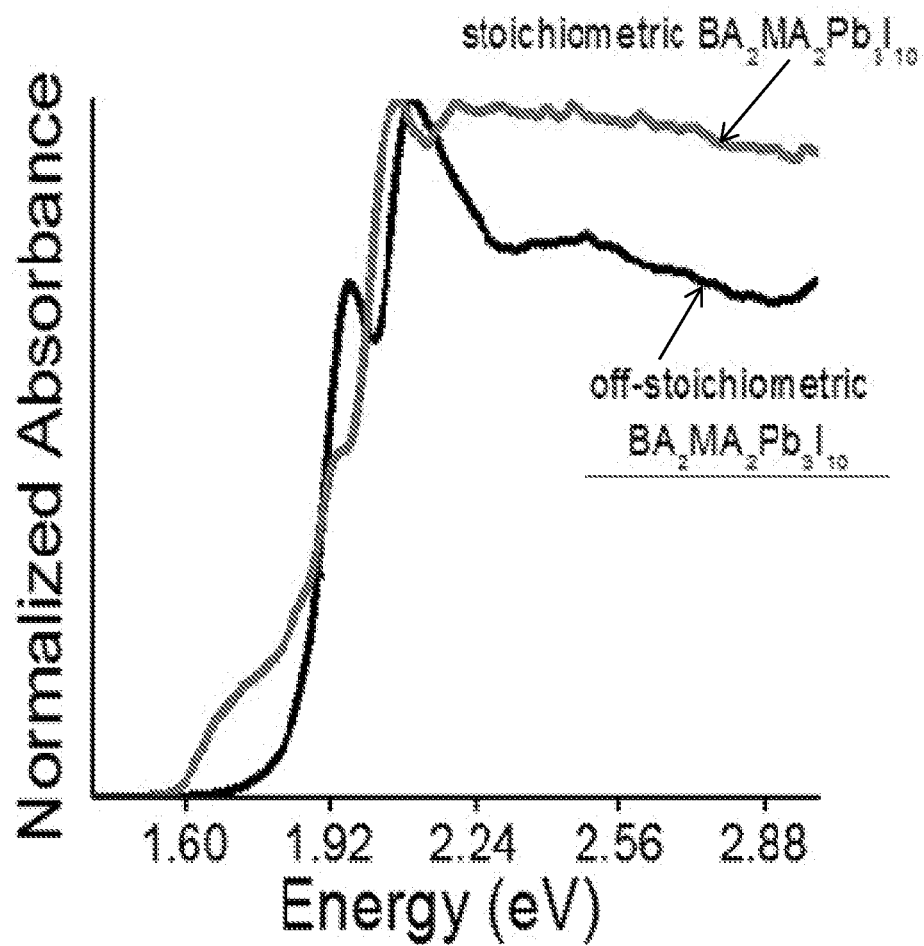
FIG. 22 shows the absorbance spectra for a phase-impure $(BA)_2(MA)_2Pb_3I_{10}$ precipitate and a phase-pure $(BA)_2(MA)_2Pb_3I_{10}$ precipitate.

For comparison, the absorbance spectra for the phase impure $(BA)_2(MA)_2Pb_3I_{10}$ precipitate and the phase-pure $(BA)_2(MA)_2Pb_3I_{10}$ precipitate (made with the "off-stoichiometric" method) are shown in FIG. 22.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:
1. A material comprising homologous, two-dimensional halide perovskites having the formula $(RNH_3)_2A_{(n-1)}M_nX_{(3n+1)}$ or the formula $(H_3NRNH_3)A_{(n-1)}M_nX_{(3n+1)}$; where R is an aliphatic or aromatic chain, A is a small organic or inorganic cation, M is a divalent metal cation, X is a halide anion, and n is an integer having a value of 3 or greater, wherein at least 95%, based on mole fraction, of the material comprises the two-dimensional halide perovskites having the same n value.
2. The material of claim 1, wherein n has a value of 4 or greater.
3. The material of claim 1, wherein at least 95%, based on mole fraction, of the material comprises the two-dimensional halide perovskites having an n value of 4.
4. The material of claim 1, wherein A is $CH_3NH_3$.
5. The material of claim 4, wherein M is Pb, Sn or Ge.
6. The material of claim 1, wherein A is $HC(NH_2)_2$.
7. The material of claim 1, wherein A is Cs.
8. The material of claim 1, wherein A is Rb.
9. The material of claim 1, wherein the two-dimensional halide perovskites have the formula $(RNH_3)_2A_{(n-1)}M_nX_{(3n+1)}$.
10. The material of claim 1, wherein the two-dimensional halide perovskites have the formula $(H_3NRNH_3)A_{(n-1)}M_nX_{(3n+1)}$.
11. The material of claim 1 comprising at least one gram of the homologous, two-dimensional halide perovskites.
12. An optoelectronic device comprising:
(a) a first electrode comprising an electrically conductive material;
(b) a second electrode comprising an electrically conductive material; and
(c) the material of claim 1 in electrical communication with the first electrode and the second electrode.
13. A method of making the material of claim 1, the method comprising reacting a small organic or inorganic cation (A) and a halide of a divalent metal cation (M) with a sub-stoichiometric quantity of an aromatic or aliphatic ammonium cation in a solution, heating the solution to a temperature above room temperature, and allowing the solution to cool, whereby substantially phase-pure two-dimensional halide perovskites precipitate out of the solution, wherein the two-dimensional halide perovskites have the formula $(RNH_3)_2A_{(n-1)}M_nX_{(3n+1)}$ or the formula $(H_3NRNH_3)A_{(n-1)}M_nX_{(3n+1)}$ and at least 95%, based on mole fraction, of the material comprises the two-dimensional halide perovskites having the same n value.

14. A material comprising homologous, two-dimensional halide perovskites having the formula $(RNH_3)A_nM_nX_{(3n+1)}$, where R is an aliphatic or aromatic chain, A is a small organic or inorganic cation, M is a divalent metal cation, X is a halide anion, and n is an integer having a value of 1 or greater.

15. The material of claim 14, wherein n has a value of 2 or greater.

16. The material of claim 14, wherein A is $CH_3NH_3$.

17. The material of claim 16, wherein M is Pb, Sn, or Ge.

18. The material of claim 17, wherein $RNH_3$ is $C(NH_2)_3$.

19. The material of claim 14, wherein A is $HC(NH_2)_2$.

20. The material of claim 14, wherein A is Cs.

21. The material of claim 14, wherein A is Rb.

22. The material of claim 14, wherein A is $C(NH_2)_3$.

* * * * *